United States Patent
Chen et al.

(10) Patent No.: US 12,145,954 B2
(45) Date of Patent: Nov. 19, 2024

(54) SILICON-CONTAINING ELECTRON TRANSPORTING MATERIAL AND ITS APPLICATION

(71) Applicant: BEIJING SUMMER SPROUT TECHNOLOGY CO., LTD., Beijing (CN)

(72) Inventors: Xiao Chen, Beijing (CN); Chuanjun Xia, Beijing (CN); Chi Yuen Raymond Kwong, Beijing (CN)

(73) Assignee: Beijing Summer Sprout Technology Co., Ltd. (CN)

( * ) Notice: Subject to any disclaimer, the term of this patent is extended or adjusted under 35 U.S.C. 154(b) by 534 days.

(21) Appl. No.: 16/662,376

(22) Filed: Oct. 24, 2019

(65) Prior Publication Data
US 2020/0131204 A1    Apr. 30, 2020

(30) Foreign Application Priority Data

Oct. 24, 2018    (CN) .......................... 201811235650.9

(51) Int. Cl.
| C07F 7/08 | (2006.01) |
| H10K 50/11 | (2023.01) |
| H10K 50/13 | (2023.01) |
| H10K 85/40 | (2023.01) |
| H10K 85/60 | (2023.01) |
| H10K 101/10 | (2023.01) |

(52) U.S. Cl.
CPC ........... *C07F 7/0807* (2013.01); *H10K 85/40* (2023.02); *H10K 85/654* (2023.02); *H10K 85/656* (2023.02); *H10K 85/6572* (2023.02); *H10K 85/6574* (2023.02); *H10K 85/6576* (2023.02); *H10K 50/11* (2023.02); *H10K 50/13* (2023.02); *H10K 2101/10* (2023.02)

(58) Field of Classification Search
CPC .............. C07F 7/0807; H01L 51/0094; H01L 51/0067; H01L 51/0069; H01L 51/0072; H01L 51/0073; H01L 51/0074; H01K 85/40; H01K 85/654; H01K 85/656; H01K 85/6574; H01K 85/6576; H01K 85/6572; H01K 50/11
See application file for complete search history.

(56) References Cited

U.S. PATENT DOCUMENTS

| 5,703,436 | A | 12/1997 | Forrest et al. |
| 5,707,745 | A | 1/1998 | Forrest et al. |
| 5,844,363 | A | 12/1998 | Gu et al. |
| 6,097,147 | A | 8/2000 | Baldo et al. |
| 6,229,012 | B1 | 5/2001 | Hu et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2013/0015431 | A1* | 1/2013 | Kamalasanan ...... C07D 215/30 257/40 |
| 2015/0349273 | A1 | 12/2015 | Hung et al. |
| 2016/0359122 | A1 | 12/2016 | Boudreault et al. |
| 2018/0145268 | A1 | 5/2018 | Ma et al. |
| 2018/0175306 | A1 | 6/2018 | Dyatkin et al. |
| 2018/0175307 | A1 | 6/2018 | Zeng et al. |
| 2018/0205022 | A1 | 7/2018 | Dyatkin et al. |
| 2019/0081253 | A1 | 3/2019 | Xia |
| 2020/0109138 | A1* | 4/2020 | Yen ..................... H10K 85/6572 |
| 2020/0190065 | A1* | 6/2020 | Yen ....................... C07D 405/14 |
| 2020/0235315 | A1* | 7/2020 | Yen ..................... H10K 85/633 |
| 2020/0235320 | A1* | 7/2020 | Yen ..................... H10K 85/633 |
| 2021/0036245 | A1* | 2/2021 | Mujica-Fernaud ... C07F 7/0816 |

FOREIGN PATENT DOCUMENTS

| CN | 104795503 A | 7/2015 |
| CN | 105884810 | 8/2016 |
| CN | 106432317 A | 2/2017 |
| CN | 107235997 A | 10/2017 |
| CN | 107805250 A | 3/2018 |
| CN | 111196822 A | 5/2020 |
| CN | 111675698 A | 9/2020 |
| CN | 111675707 A | 9/2020 |
| CN | 111676707 A | 9/2020 |
| JP | 2003115386 A | 4/2003 |
| JP | 2009277601 A | 11/2009 |
| JP | 2009277602 A | 11/2009 |
| JP | 2014009230 A | 1/2014 |

(Continued)

OTHER PUBLICATIONS

Lee et al., machine translation of KR 10-2012-0116879 (2012) pp. 1-19. (Year: 2012).*
Kim et al., machine translation of KR 10-2012-0029751 (2012) pp. 1-22. (Year: 2012).*
Cai et al., machine translation of CN 107235997 (2017) pp. 1-22. (Year: 2017).*
Yu et al., machine translation of WO 2011/037429 (2011) pp. 1-23. (Year: 2011).*

(Continued)

*Primary Examiner* — Dylan C Kershner
(74) *Attorney, Agent, or Firm* — BARNES & THORNBURG LLP; Jeffrey R. Stone

(57) ABSTRACT

A silicon-containing electron transporting material and its application are disclosed. The silicon-containing electron transporting material employs a silicon-containing compound with a novel structure containing one or more silicon atoms and a specific group. The compound can be used as an electron transporting layer of an electroluminescent device, which can effectively improve the lifetime of the device and improve device performance. An electroluminescent device and compound formulation are also disclosed.

15 Claims, 2 Drawing Sheets

(56) References Cited

FOREIGN PATENT DOCUMENTS

Figure 1:
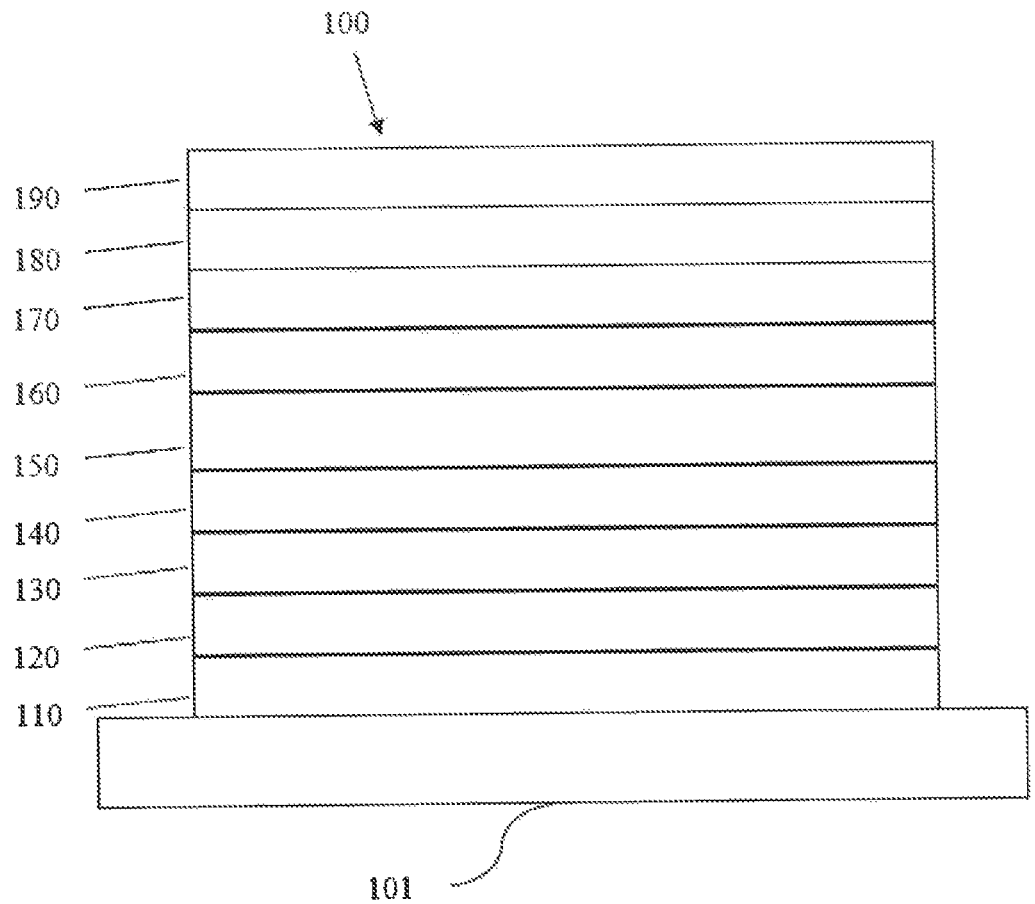

| KR | 20120029751 A | 3/2012 |
|---|---|---|
| KR | 20120116879 A | 10/2012 |
| KR | 20130007934 A | 1/2013 |
| KR | 20150129282 A | 11/2015 |
| TW | 201125953 A | 8/2011 |
| WO | 2010126270 A1 | 11/2010 |
| WO | 2011010844 A1 | 1/2011 |
| WO | 2011/037429 | 3/2011 |
| WO | 2011055912 A1 | 5/2011 |
| WO | 2013/173396 A2 | 11/2013 |
| WO | 2017048060 A1 | 3/2017 |
| WO | 2019121483 A1 | 6/2019 |

OTHER PUBLICATIONS

Tang, C.W. et al., Organic electroluminescent diodes, Citation: Applied Physics Letters 51, 913 (1987), online http//dx.doi.org/10.1063/1.98799.

Uoyama, H., et al., Highly efficient organic light-emitting diodes from delayed fluorescence, Nature, vol. 492, Dec. 13, 2012, pp. 234-238.

German Office Action issued by German Patent and Trademark Office and its English translation.

Japanese Office Action issued by Japanese Patent Office for Japanese Patent Application No. 2019-193833 on Oct. 27, 2020and its English translation.

Uoyama, H., et al., "Highly efficient organic light-emitting diodes from delayed fluorescence". Nature, vol. 492, Dec. 13, 2012, 7 pages.

German Office Action issued by German Patent and Trademark Office for application No. 10 2019 128 751.0, dated May 4, 2020. English translation included.

Japanese Office Action issued for Japanese Patent Application No. 2019-193833, dated Oct. 27, 2020. English translation included.

Office Action issued by the Chinese Patent Office, Application No. 201811235650.9, issuing date May 31, 2022. English translation attached.

Search report issued by the Chinese Patent Office, Application No. 2018112356509, dated May 24, 2022. English translation attached.

* cited by examiner $$A{-}(L{-}B)_n$$

SILICON-CONTAINING ELECTRON TRANSPORTING MATERIAL AND ITS APPLICATION

CROSS-REFERENCE TO RELATED APPLICATIONS

The application claims the benefit of the earlier filing date of Chinese Application No. 201811235650.9, filed on Oct. 24, 2018 to the China National Intellectual Property Administration, the contents of which are incorporated by reference herein in its entirety.

1 TECHNICAL FIELD

The present disclosure relates to compounds for organic electronic devices, such as organic light emitting devices. More specifically, the present disclosure relates to a silicon-containing electron transporting material, an electroluminescent device and a compound formulation comprising the material.

2 BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

An organic light emitting diode (OLED) is a display unit that utilizes an organic self-emitting phenomenon, which has many excellent performances of a wide viewing angle, lighter and thinner than a liquid crystal display unit, emitting high brightness light at low driving voltage and a fast response speed, and recently it is expected as a full color display unit or lighting application.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. The present disclosure laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Generally, an organic electroluminescent device has a structure including an anode, a cathode, and organic material layers disposed therebetween. Charge is injected into the organic layers formed between the anode and the cathode to form electron and hole pairs, causing light emission of an organic compound having fluorescent or phosphorescent properties. Since the moving speed of holes and electrons are different, the organic layers, such as a hole injecting layer, a hole transporting layer, a light emitting layer, an electron transporting layer, an electron injecting layer, and etc., is often formed in a multilayer structure composed of different materials.

In order to make the organic light-emitting element fully exert the above-mentioned excellent characteristics, in addition to providing better-performing luminescent materials, researchers are also seeking to change the structure of light-emitting devices, improving the transmission efficiency of holes and electrons, to achieve equalization of holes and electrons in the device, thereby to improve luminous efficiency. Among them, by increasing the electron transport efficiency, the probability of recombination of holes and electrons can be improved, and high luminous efficiency can be obtained. Therefore, it is important to find an electron transporting material having high electron injectability, high electron mobility, high holes blocking property, further high durability against holes.

The prior art about electron transporting materials are intended to produce organic compounds having excellent electron transporting ability and hole blocking ability, excellent luminous efficiency, and high stability in a thin film state. However, the thermal stability, electron mobility, luminous efficiency, and lifetime of existing electron transporting materials still need to be improved. Therefore, there is a continuous need to develop an electron transporting material used in an organic light-emitting device, which can be driven at a low voltage and has excellent light-emitting efficiency.

3 SUMMARY

The present disclosure provides a silicon-containing organic electron transporting material, its preparation method, device application and compound formulation, which can solve at least part of the above problems. The silicon-containing compound can be used as an electron transporting material of an electroluminescent device. The device incorporating the silicon-containing compound exhibits a longer lifetime, thereby further improving the characteristics of the light-emitting device.

According to an embodiment of the present disclosure, a compound having Formula 1 is disclosed:

Formula 1 wherein n is 1, 2, 3 or 4; when n is greater than or equal to 2, each group of L and B can be the same or different;
A is the structure represented by Formula 2:

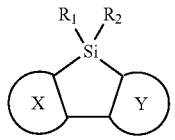

Formula 2 wherein ring X and Y each independently represents a substituted or unsubstituted aryl or heteroaryl group having 5 to 50 ring atoms;
wherein at least one of X and Y is a fused ring system;
wherein $R_1$ and $R_2$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;
wherein $R_1$ and $R_2$ can be optionally joined to form a ring;
wherein L is a single bond, or a substituted or unsubstituted arylene group having 6 to 60 carbon atoms, or a substituted or unsubstituted heteroarylene group having 2 to 60 carbon atoms;
wherein B is a substituted or unsubstituted electron-deficient heteroaryl group having 2 to 60 carbon atoms.

According to another embodiment of the present disclosure, an electroluminescent device is also disclosed, which comprises an anode, a cathode, and an organic layer disposed between the anode and the cathode, wherein the organic layer comprises a compound having Formula 1.

According to another embodiment of the present disclosure, a compound formulation comprising the compound having the structure of Formula 1 is also disclosed.

The novel silicon-containing compounds disclosed in the present disclosure can be used as an electron transporting material for an electroluminescent device. The above silicon-containing organic electroluminescent material contains one or more silicon atoms and a specific group. The research results show that the electron transporting layer used in the electroluminescent device can effectively improve the luminescence lifetime of the device and improve the device performance.

4 BRIEF DESCRIPTION OF THE DRAWINGS

FIG. 1 schematically shows an organic light emitting device that can incorporate the compound or compound formulation disclosed herein.

Figures 2, 3:
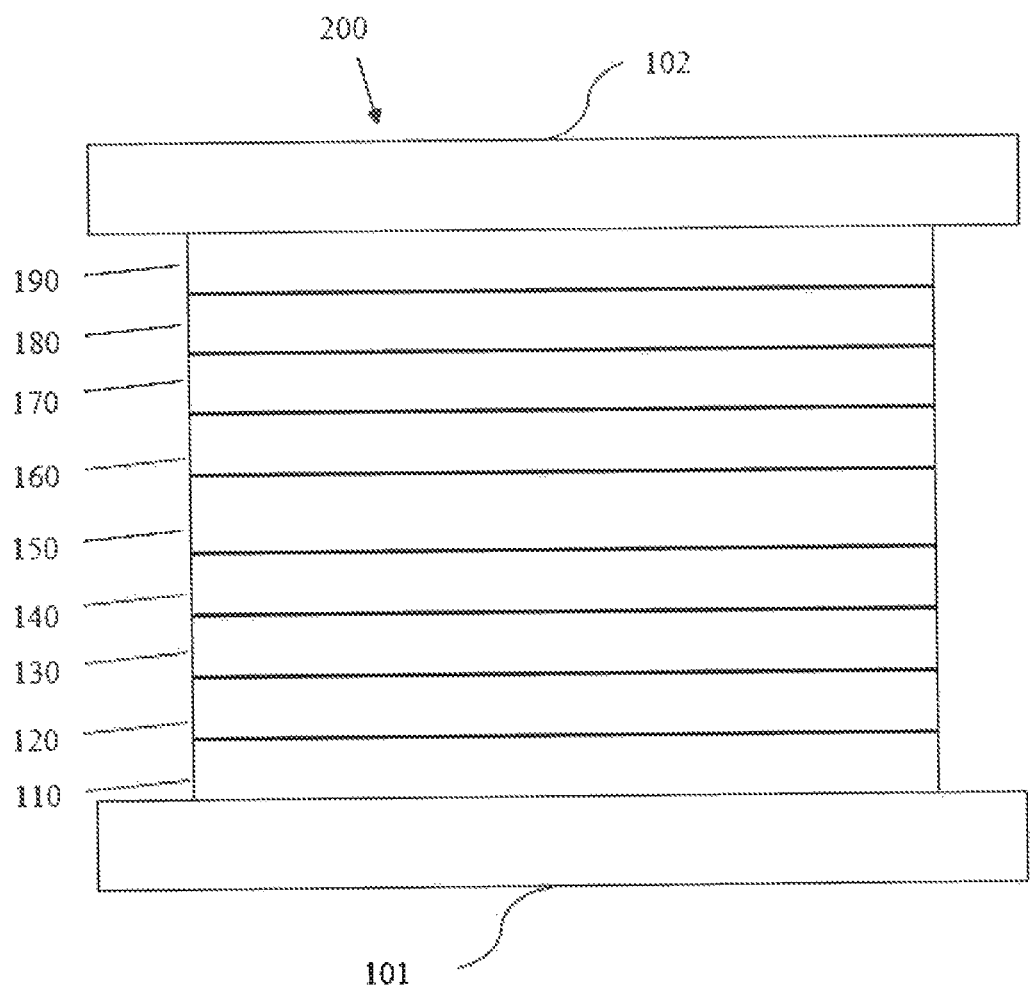

FIG. 2 schematically shows another organic light emitting device that can incorporate the compound or compound formulation disclosed herein.

FIG. 3 shows the structural Formula 1 of the compound disclosed herein.

5 DETAILED DESCRIPTION

OLEDs can be fabricated on various types of substrates such as glass, plastic, and metal foil. FIG. 1 schematically shows the organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

An OLED can be encapsulated by a barrier layer. FIG. 2 schematically shows the organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass and organic-inorganic hybrid layers. The barrier layer should be placed directly or indirectly outside of the OLED device. Multilayer thin film encapsulation was described in U.S. Pat. No. 7,968,146, which is herein incorporated by reference in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quaterphenyl group.

Heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazinc, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, l-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a thiolalkyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

In the compounds mentioned in this disclosure, the expression that adjacent substituents can be optionally joined to form a ring is intended to be taken to mean that two radicals are linked to each other by a chemical bond. This is illustrated by the following scheme:

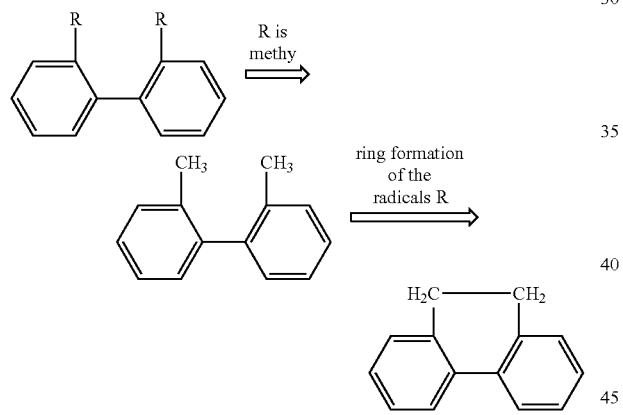

Furthermore, the expression that adjacent substituents can be optionally joined to form a ring is also intended to be taken to mean that in the case where one of the two radicals represents hydrogen, the second radical is bonded at a position to which the hydrogen atom was bonded, with formation of a ring. This is illustrated by the following scheme:

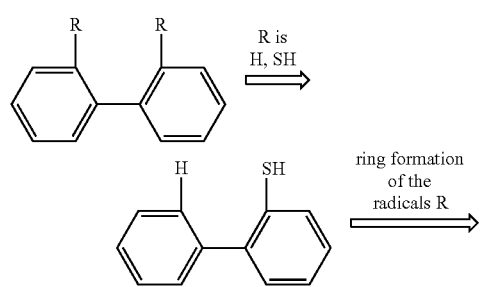

-continued

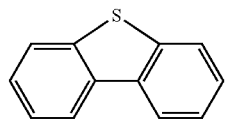

According to an embodiment of the present disclosure, a compound having Formula 1 is disclosed:

$$A\text{-}(\text{L-B})_n \quad \text{Formula 1}$$

wherein n is 1, 2, 3 or 4; when n≥2, each group of L and B can be the same or different;

A is the structure represented by Formula 2:

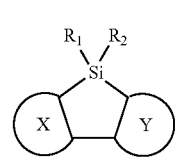

Formula 2 wherein ring X and Y each independently represents a substituted or unsubstituted aryl or heteroaryl group having 5 to 50 ring atoms;

wherein at least one of X and Y is a fused ring system;

wherein $R_1$ and $R_2$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

wherein $R_1$ and $R_2$ can be optionally joined to form a ring;

wherein L is a single bond, or a substituted or unsubstituted arylene group having 6 to 60 carbon atoms, or a substituted or unsubstituted heteroarylene group having 2 to 60 carbon atoms;

wherein B is a substituted or unsubstituted electron-deficient heteroaryl group having 2 to 60 carbon atoms.

According to some embodiments of the present disclosure, wherein ring X and Y are each independently selected from a substituted or unsubstituted aryl or heteroaryl group having 5 to 40 ring atoms, or wherein ring X and Y are each independently selected from a substituted or unsubstituted aryl or heteroaryl group having 5 to 30 ring atoms, or wherein ring X and Y are each independently selected from a substituted or unsubstituted aryl or heteroaryl group having 5 to 20 ring atoms;

wherein each L is independently selected from the group consisting of a single bond, a substituted or unsubstituted arylene group having 6 to 50 carbon atoms, a substituted or unsubstituted heteroarylene group having 2 to 50 carbon atoms; or each L is independently selected from the group consisting of a single bond, a substituted or unsubstituted arylene group having 6 to 40 carbon atoms, a substituted or unsubstituted heteroarylene group having 2 to 40 carbon atoms; or each L is independently selected from the group consisting of a single bond, a substituted or unsubstituted arylene group having 6 to 30 carbon atoms, a substituted or unsubstituted heteroarylene group having 2 to 30 carbon atoms; or each L is independently selected from the group consisting of a single bond, a substituted or unsubstituted arylene group having 6 to 20 carbon atoms, a substituted or unsubstituted heteroarylene group having 2 to 20 carbon atoms;

wherein each B is independently selected from a substituted or unsubstituted electron-deficient heteroaryl group having 2 to 50 carbon atoms; or each B is independently selected from a substituted or unsubstituted electron-deficient heteroaryl group having 2 to 40 carbon atoms; or each B is independently selected from a substituted or unsubstituted electron-deficient heteroaryl group having 2 to 30 carbon atoms; or each B is independently selected from a substituted or unsubstituted electron-deficient heteroaryl group having 2 to 20 carbon atoms.

According to an embodiment of the present disclosure, wherein at least one of X and Y in Formula 2 is a fused ring system, wherein the fused ring system is formed by fusing at least two aryl and/or heteroaryl rings together to form a fused ring system containing at least 10 carbon atoms, or a fused ring system containing at least 10 carbon atoms and nitrogen atoms in total.

According to an embodiment of the present disclosure, wherein at least one of X and Y in Formula 2 is a fused ring system, wherein the fused ring system is formed by fusing at least three aryl and/or heteroaryl rings, to form a fused ring system containing at least 14 carbon atoms, or a fused ring system containing at least 14 carbon atoms and nitrogen atoms in total.

According to an embodiment of the present disclosure, wherein structure A is selected from the group consisting of Formula 3 to Formula 33:

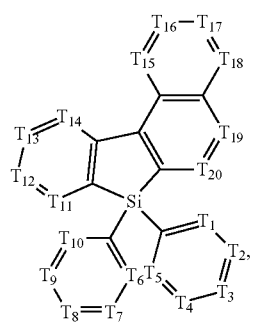

Formula 3

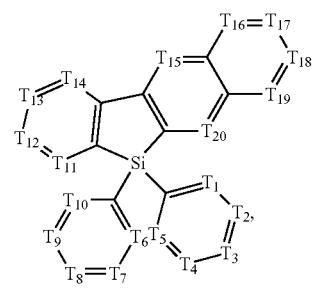

Formula 4

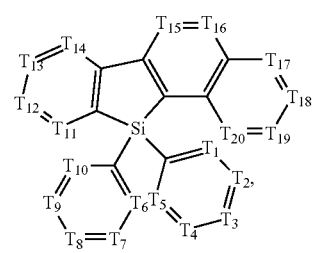

Formula 5

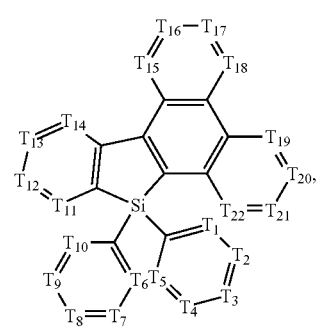

Formula 6

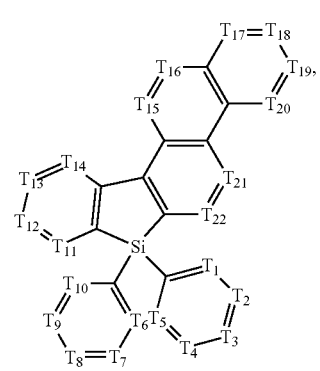

Formula 7

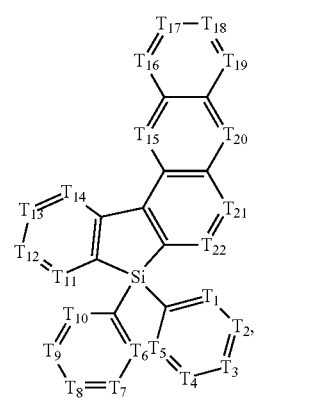

Formula 8

-continued
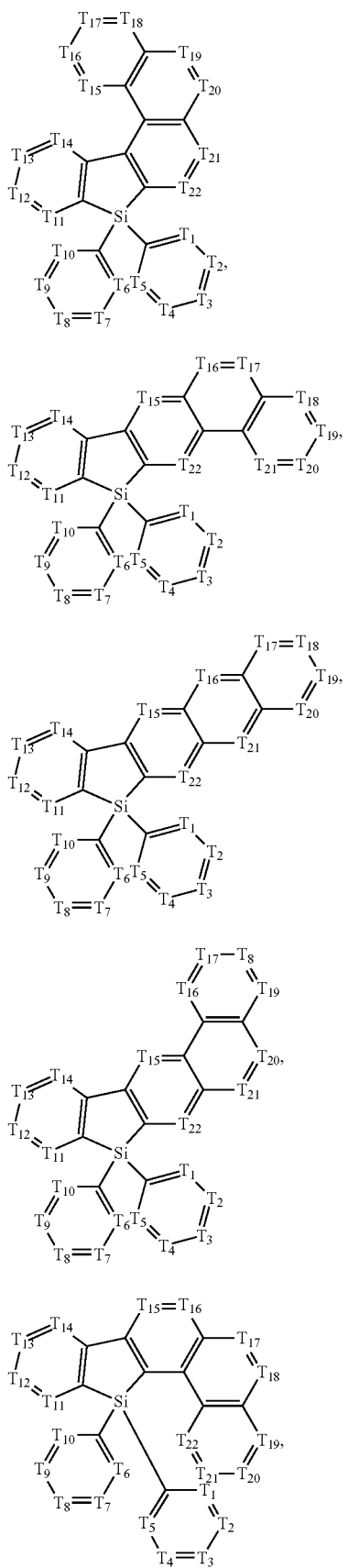
Formula 9
Formula 10
Formula 11
Formula 12
Formula 13
-continued
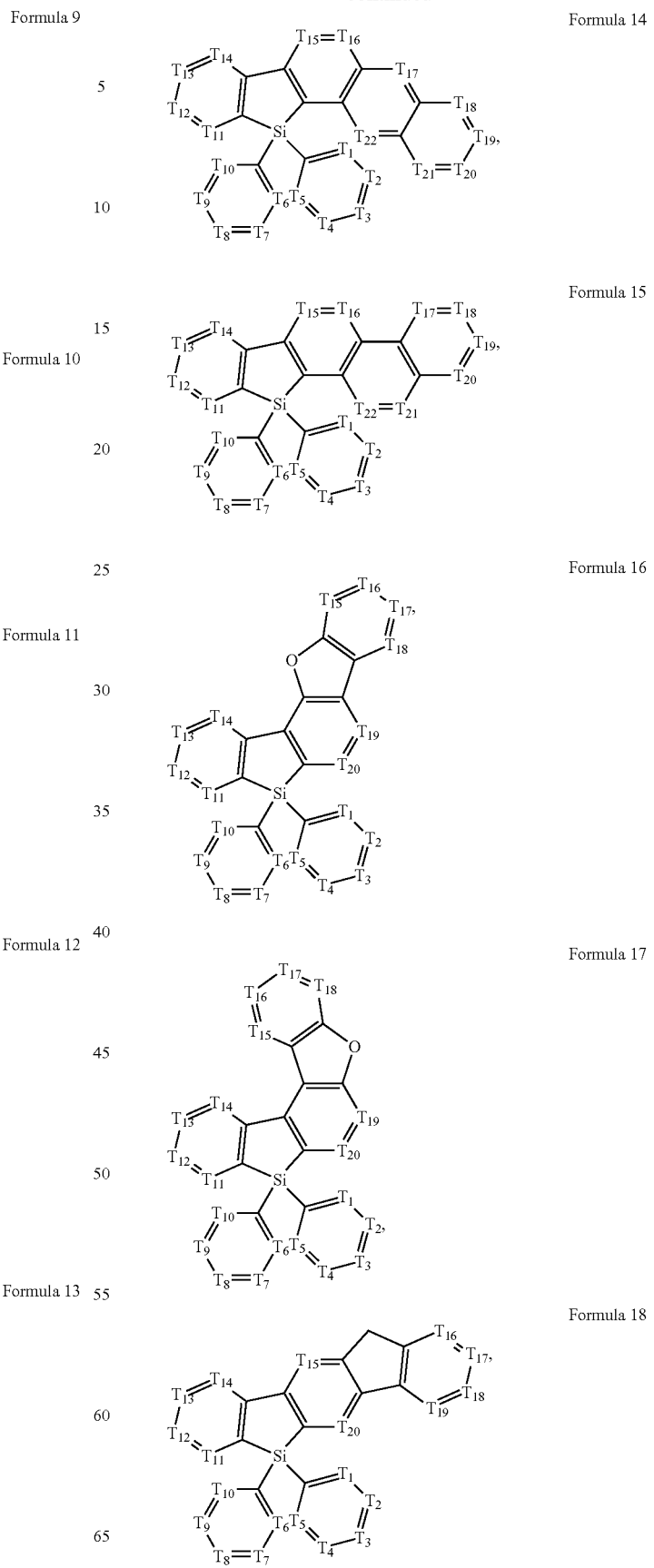
Formula 14
Formula 15
Formula 16
Formula 17
Formula 18

Formula 19
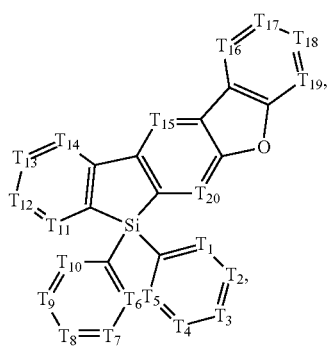
Formula 20
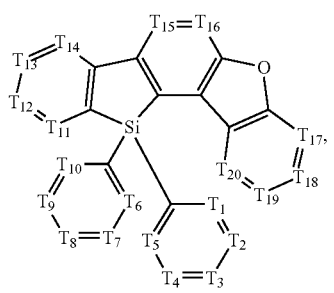
Formula 21
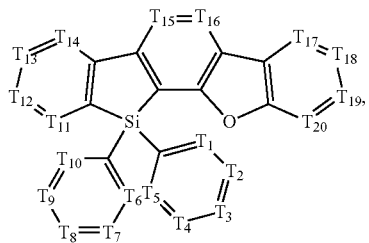
Formula 22
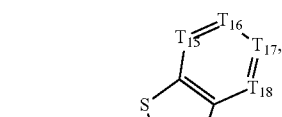
Formula 23
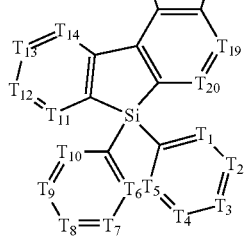
Formula 24
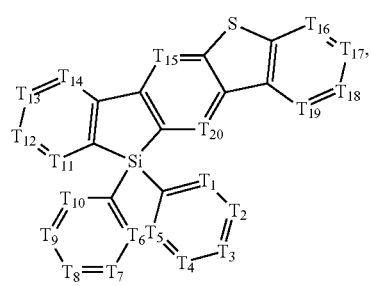
Formula 25
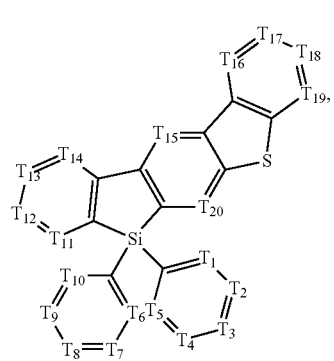
Formula 26
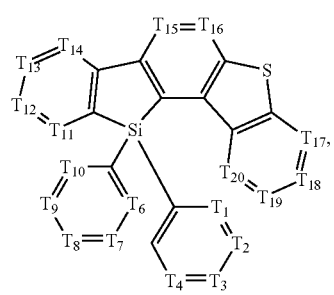
Formula 27
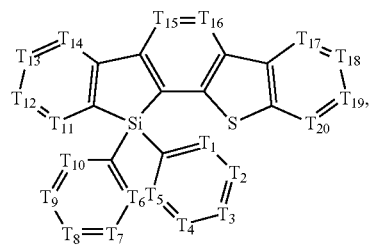
Formula 28
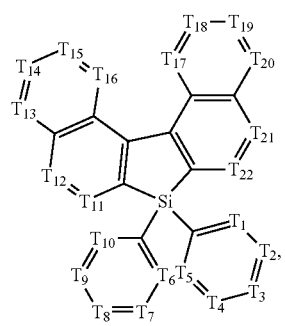

-continued

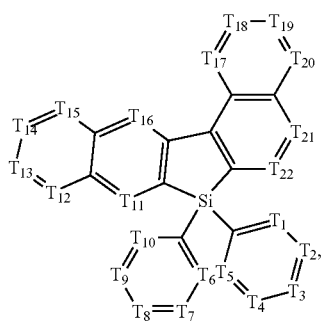
Formula 29

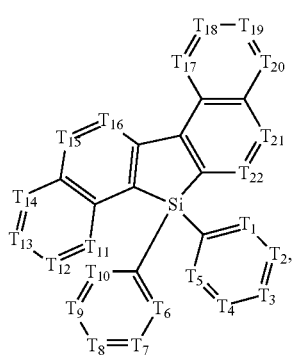
Formula 30

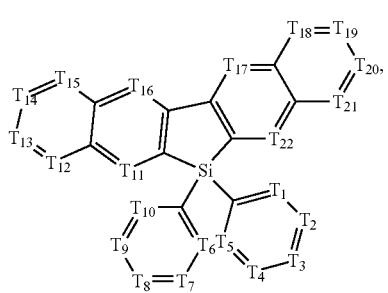
Formula 31

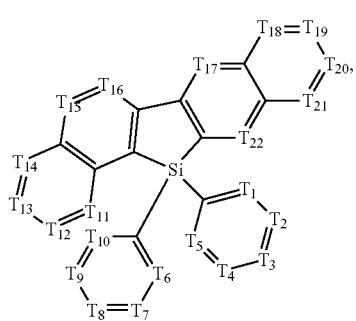
Formula 32

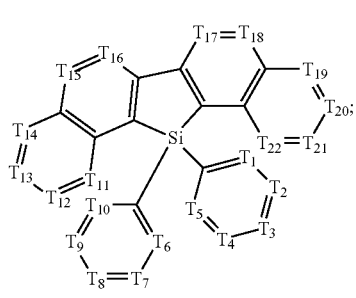
Formula 33 wherein $T_1$ to $T_{22}$ are each independently selected from $CR_T$, C or N;

wherein each of the $R_T$ is independently selected from the group consisting of: hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

adjacent substituents can be optionally joined to form a ring. Adjacent substituents can be optionally joined to form a ring.

In this embodiment, adjacent substituents can be optionally joined to form a ring, both including the case where has a connection between the adjacent substituents $R_T$ in $T_1$ to $T_{22}$ to form a ring, and the case where adjacent substituents are all not connected to form a ring. This will be clearly understood by those skilled in the art.

According to an embodiment of the present disclosure, $R_1$ and $R_2$ in Formula 2 are not joined to form a ring. In a more specific embodiment, in the structure represented by the Formula 3 to the Formula 33, $T_5$ and $T_6$ are not joined to form a ring.

According to an embodiment of the present disclosure, $R_1$ and $R_2$ in Formula 2 are joined to form a ring.

In some embodiments of the present disclosure, since the disclosed compounds are designed as electron transporting materials, there is a very big difference from the compounds designed as luminescent materials. For example, the compounds of the present disclosure do not require any special design to make $\Delta E(S1-T1)$ of the compounds less than a certain value, for example 0.20 eV, and $\Delta E(S1-T1)$ of the compounds of the present disclosure may be greater than a certain value, for example 0.20 eV, 0.30 eV, 0.50 eV or a greater value. For another example, it is not necessary to select for comprising of an electron-rich group in the compounds of the present disclosure. For example, the substituents $R_1$ and $R_2$, which do not need to be selected to comprise an electron-rich group, can optionally comprise either an electrically neutral group or an electron deficient group.

According to an embodiment of the present disclosure, wherein the structure L is selected from the group consisting of a single bond and Formula 34 to Formula 58:

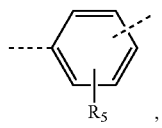
Formula 34

Formula 35
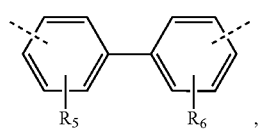
Formula 36
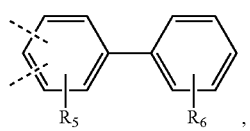
Formula 37
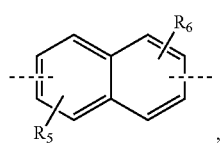
Formula 38
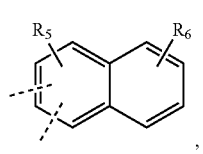
Formula 39
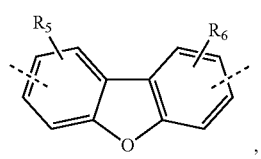
Formula 40
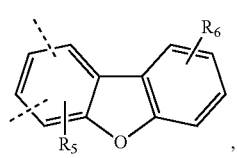
Formula 41
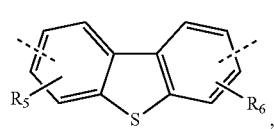
Formula 42
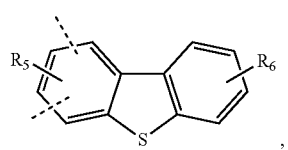
Formula 43
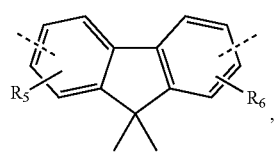
Formula 44
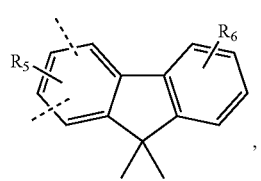
Formula 45
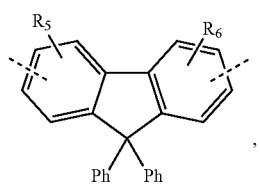
Formula 46
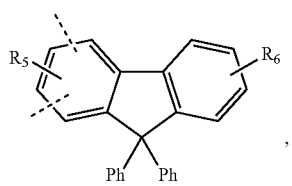
Formula 47
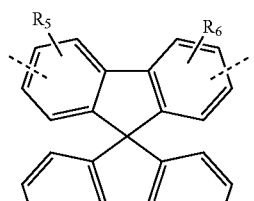
Formula 48
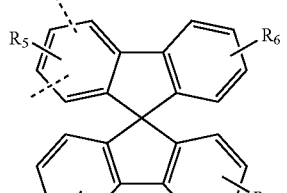
Formula 49
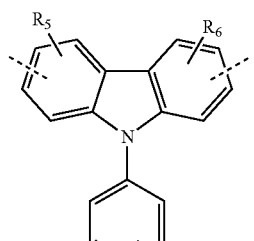
Formula 50
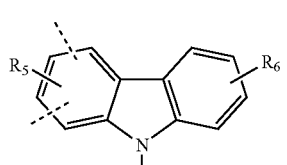

-continued

Formula 51

[structure: phenanthrene-like with R5, R6, R4]

Formula 52

[structure: pyridine with R5, N]

Formula 53

[structure: diazine with R5]

Formula 54

[structure: diazine with R5]

Formula 55

[structure: diazine with R5]

Formula 56

[structure: bipyridine with R5, R6]

Formula 57

[structure: bipyridine with R5, R6]

Formula 58

[structure: bipyridine with R5, R6]

wherein $R_3$, $R_4$, $R_5$ and $R_6$ are each independently represent a mono-substitution, multiple substitutions or non-substitution; when they represent multiple substitutions, adjacent substituents can be optionally joined to form a ring;

wherein $R_3$, $R_4$, $R_5$ and $R_6$ are each independently selected from the group consisting of: hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

In this embodiment, adjacent substituents can be optionally joined to form a ring, including both the case where has a connection between the adjacent substituents to form a ring, and the case where adjacent substituents are not joined to form a ring. This will be clearly understood by those skilled in the art.

According to an embodiment of the present disclosure, wherein the structure B is selected from the group consisting of Formula 59 to Formula 63:

Formula 59

[structure with $X_1$, $X_2$, $X_3$, $R_7$]

Formula 60

[structure with $X_1$, $X_2$, $X_3$, $X_4$, $R_7$]

Formula 61

[structure with $X_1$, $X_2$, $X_3$, $X_4$, $X_5$, $X_6$, $R_7$]

Formula 62

[structure with $X_1$, $X_2$, $X_3$, $X_4$, $X_5$, $R_7$]

Formula 63

[structure with $X_1$, $X_2$, $X_3$, $X_4$, $X_5$, $R_7$]

wherein $X_1$ to $X_6$ are each independently selected from $CR_x$, C, O, S, N or $NR_x'$;

wherein at least one of $X_1$ to $X_i$ is N, wherein $X_i$ corresponds to one with the largest sequence number among $X_1$ to $X_6$ existing in Formula 59 to Formula 63. For example, as for Formula 59, the $X_i$ corresponds to $X_3$ which is the largest sequence number among the $X_1$ to $X_6$ existing in Formula 59. That is, at least one of $X_1$ to $X_3$ in the Formula 59 is N.

wherein each of $R_7$ is independently represent a mono-substitution, multiple substitutions or non-substitution; when they represent multiple substitutions, adjacent substituents can be optionally joined to form a ring;

wherein $R_7$, $R_x$, and $R_x'$ are each independently selected from the group consisting of: hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

In this embodiment, adjacent substituents can be optionally joined to form a ring, including both the case where has a connection between the adjacent substituents to form a ring, and the case where adjacent substituents are not joined to form a ring. This will be clearly understood by those skilled in the art.

According to an embodiment of the present disclosure, wherein structure B is selected from the group consisting of Formula 59 to Formula 63, wherein at least two of $X_1$ to $X_i$ is N, wherein $X_i$ corresponds to the one with the largest sequence number among $X_1$ to $X_6$ existing in Formula 59 to Formula 63.

According to an embodiment of the present disclosure, wherein structure B is selected from the group consisting of Formula 59 to Formula 63, wherein at least three of $X_1$ to $X_i$ is N, wherein $X_i$ corresponds to the one with the largest sequence number among $X_1$ to $X_6$ existing in Formula 59 to Formula 63.

According to an embodiment of the present disclosure, wherein the structure B is selected from the group consisting of $B_1$ to $B_{105}$:

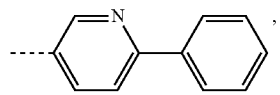
B1

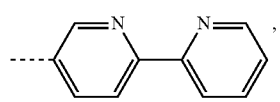
B2

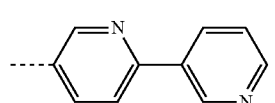
B3

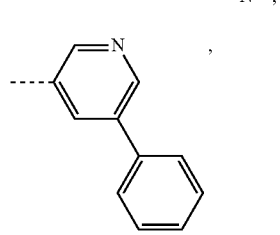
B4

-continued

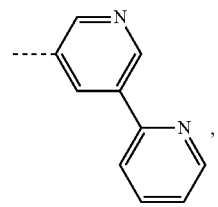
B5

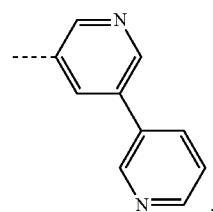
B6

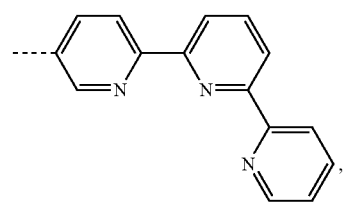
B7

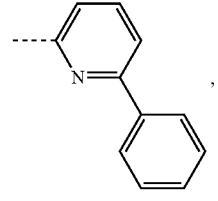
B8

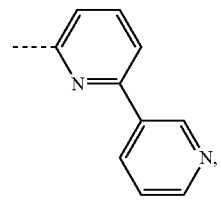
B9

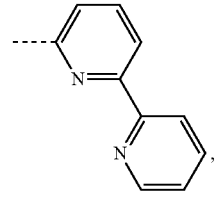
B10

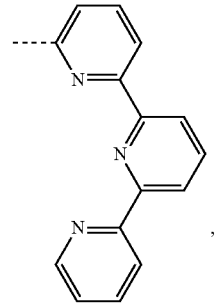
B11

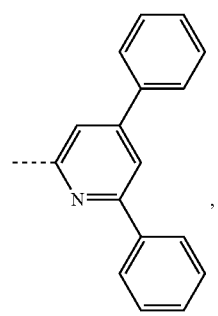
B12
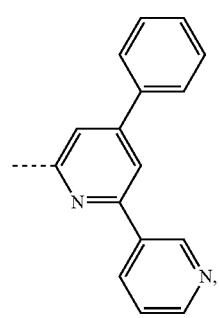
B13
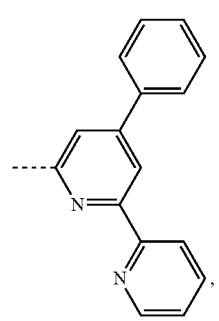
B14
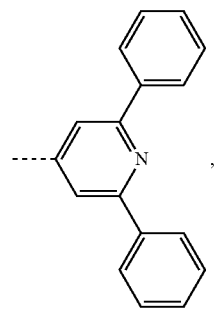
B15
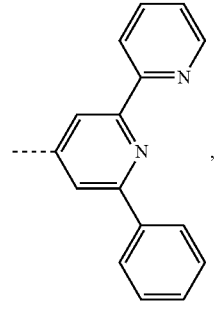
B16
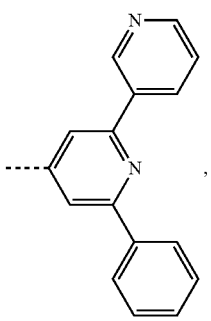
B17
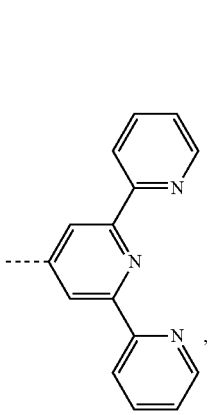
B18
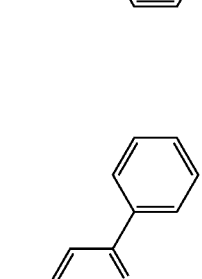
B19
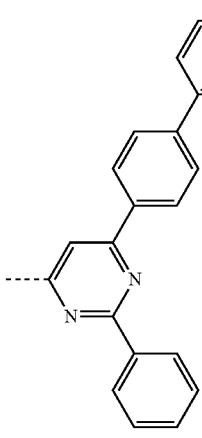
B20

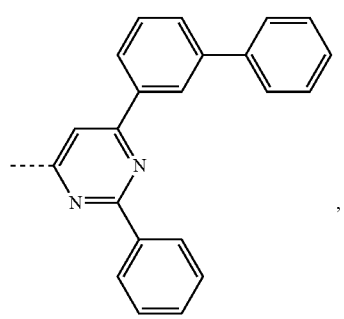 B21
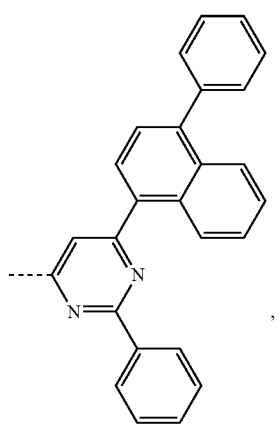 B25
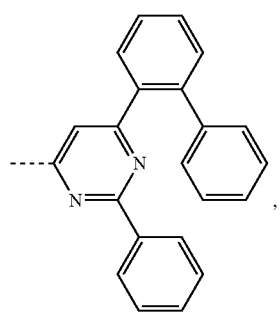 B22
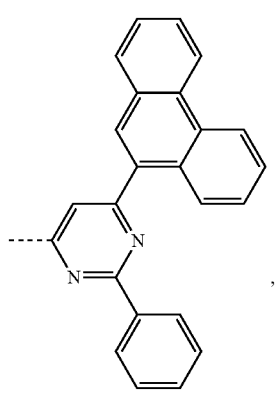 B26
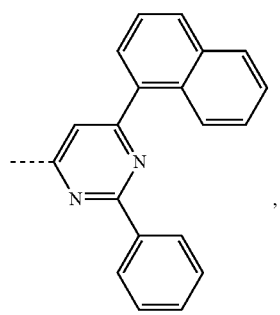 B23
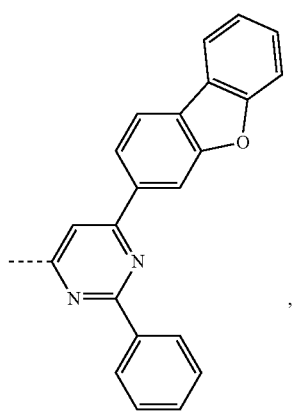 B27
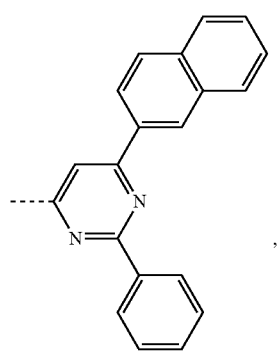 B24
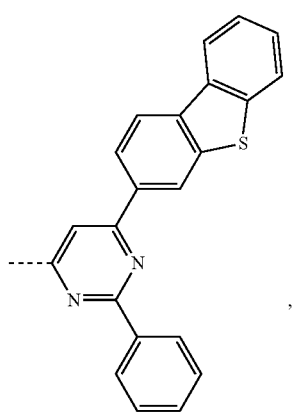 B28

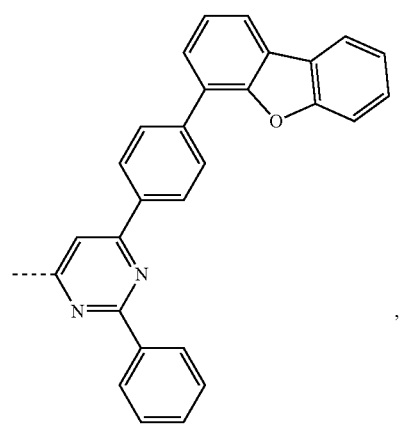
B29
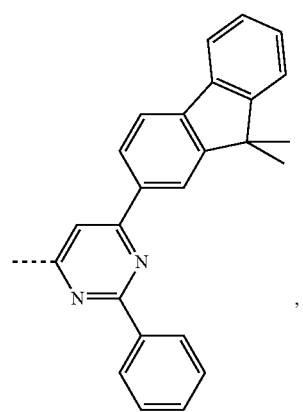
B30
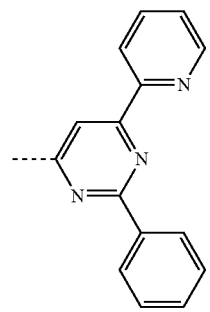
B31
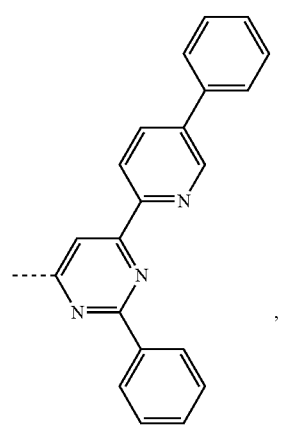
B32
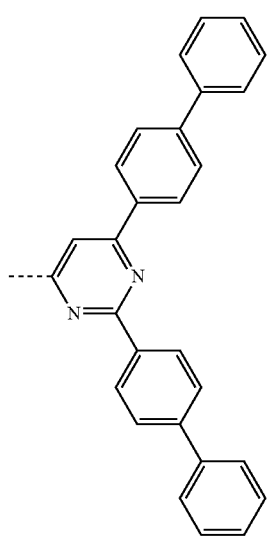
B33
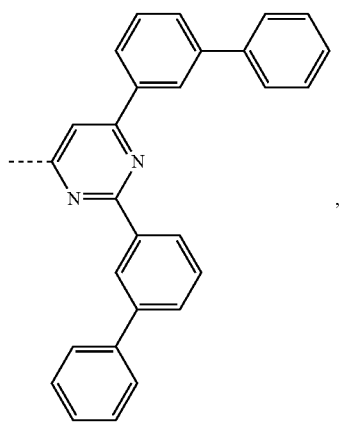
B34
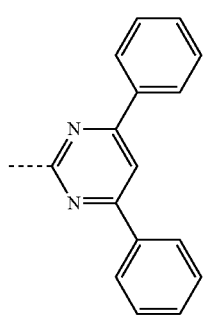
B35

B36
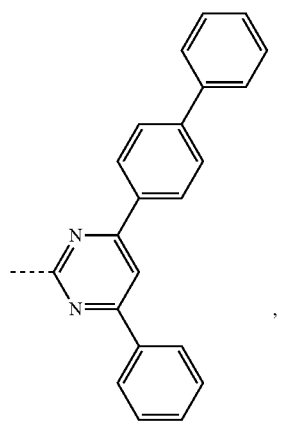
B37
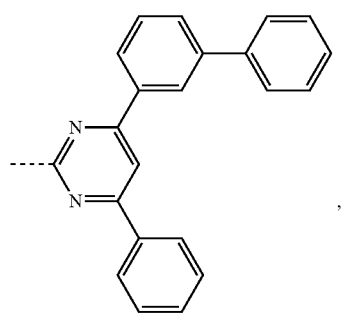
B38
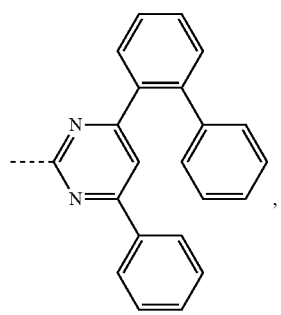
B39
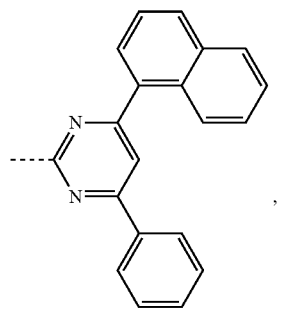
B40
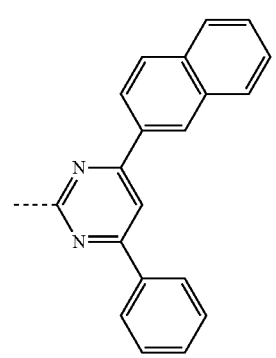
B41
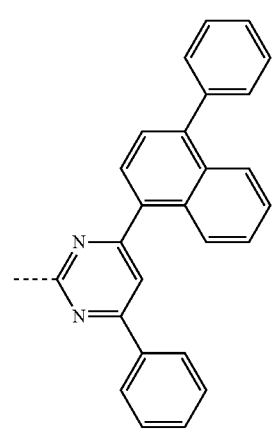
B42
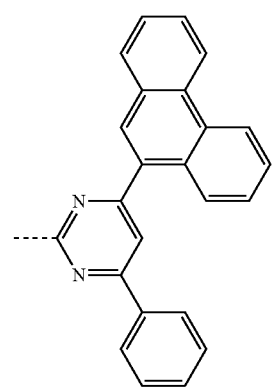
B43
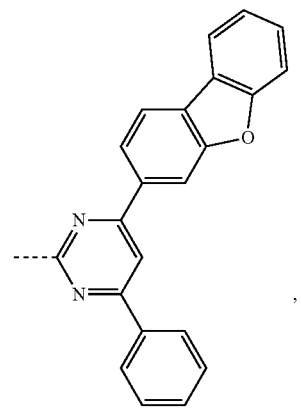

B44 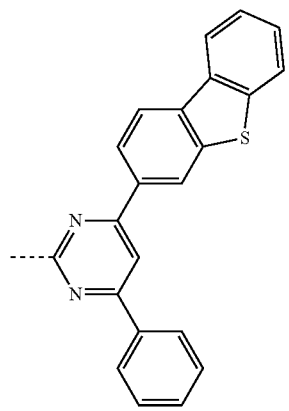
B45 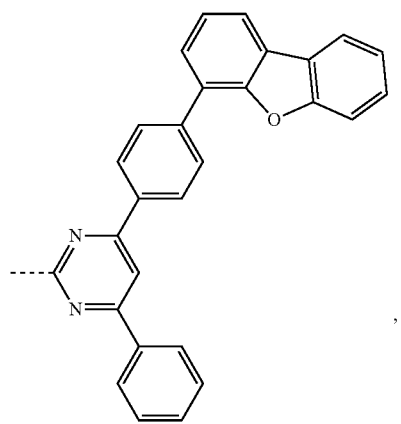
B46 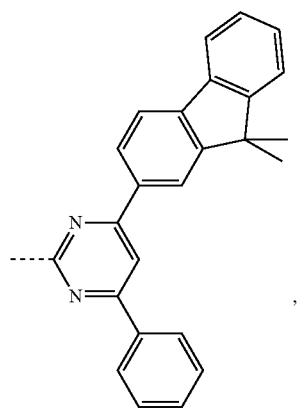
B47 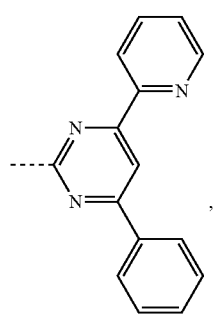
B48 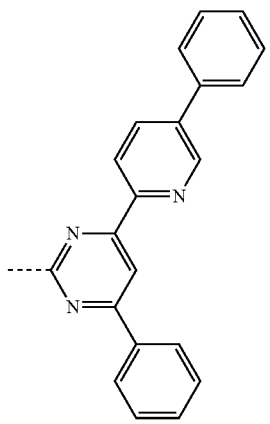
B49 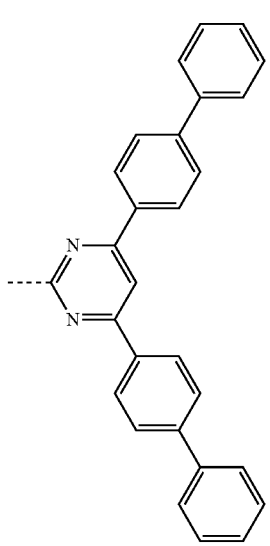
B50 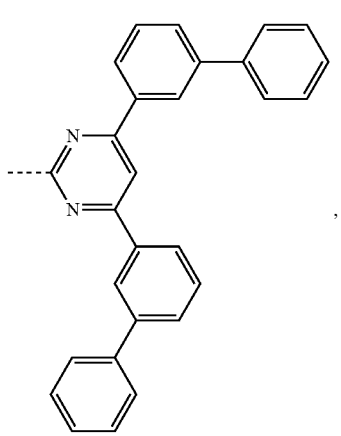

B51 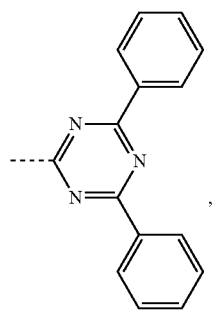
B52 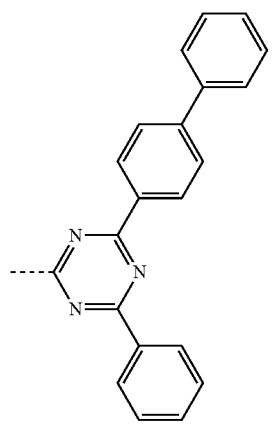
B53 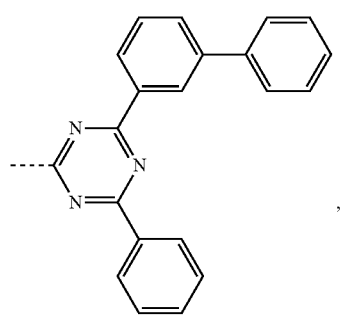
B54 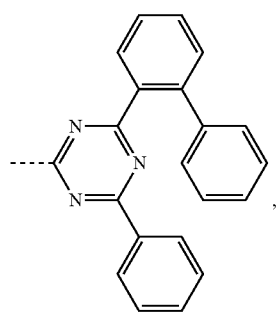
B55 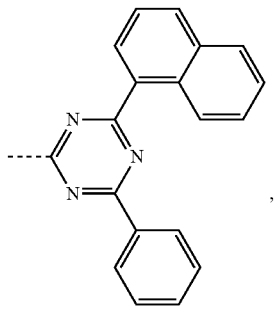
B56 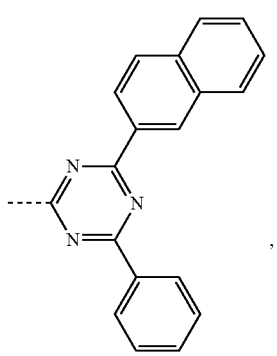
B57 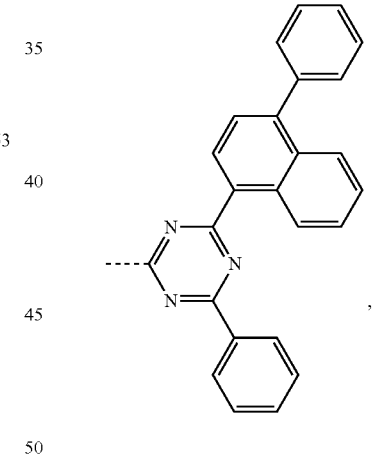
B58 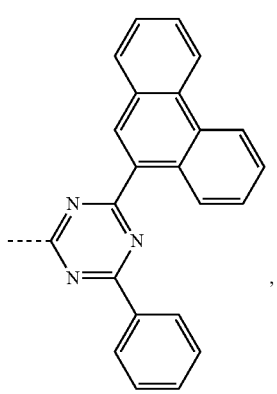

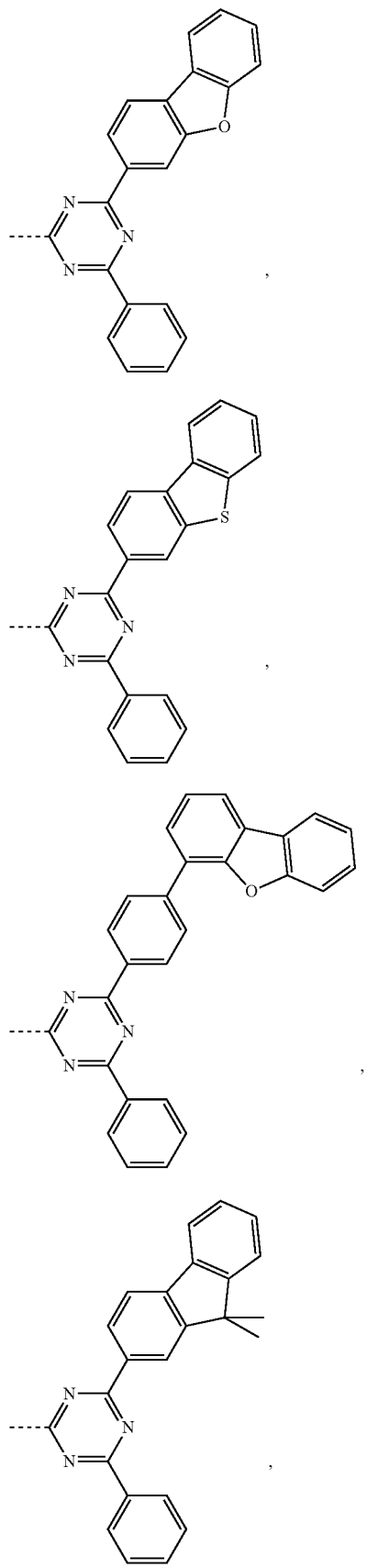
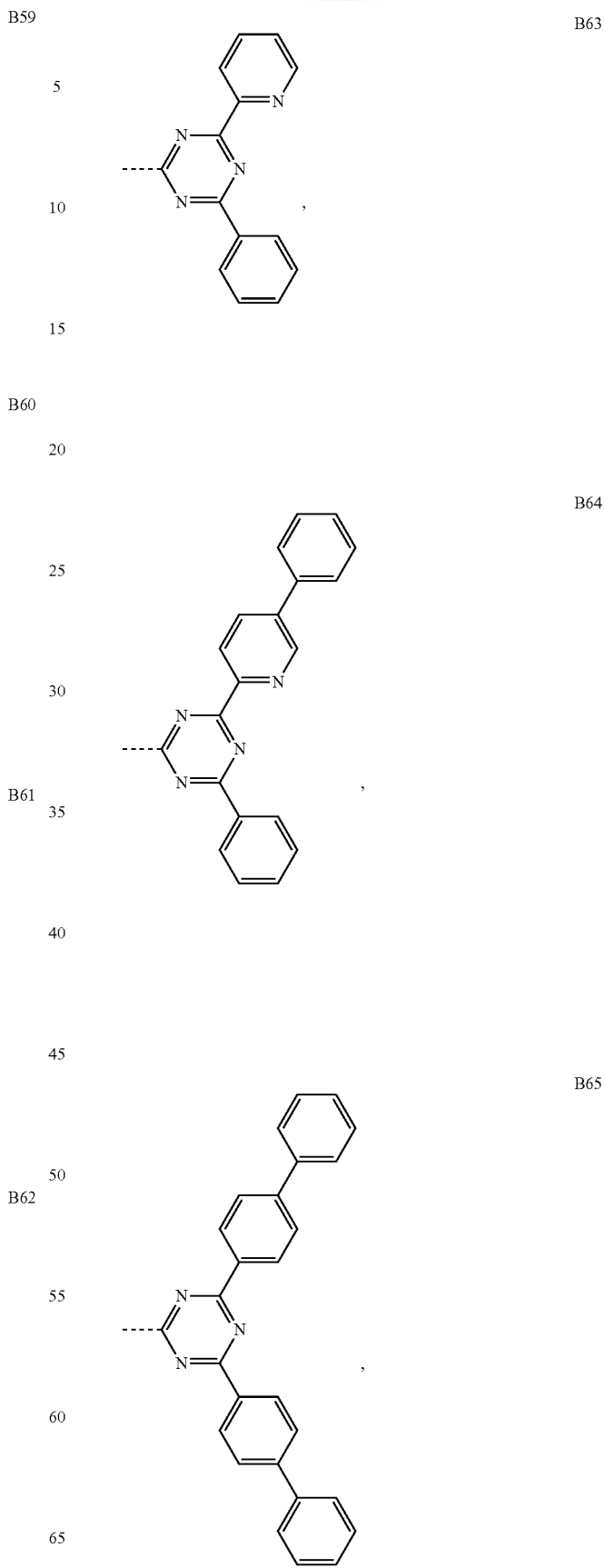

B66 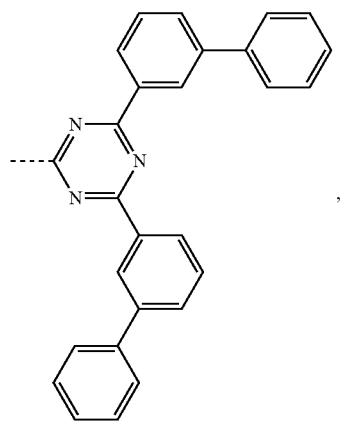
B67 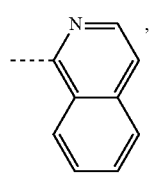
B68 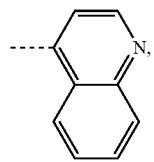
B69 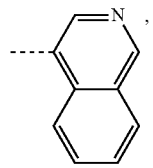
B70 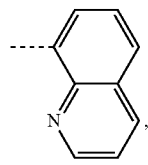
B71 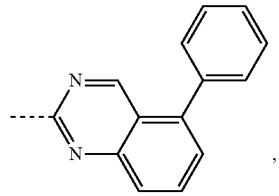
B72 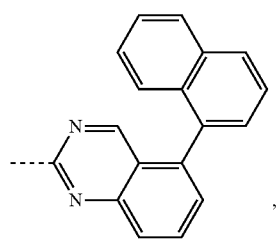
B73 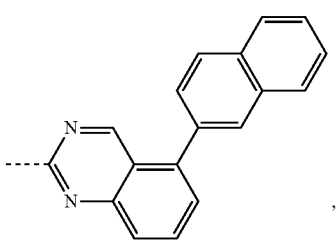
B74 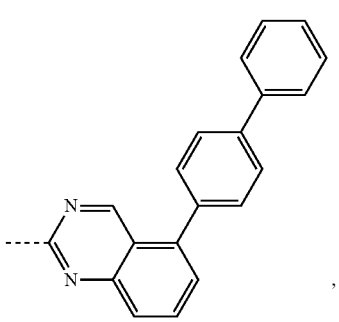
B75 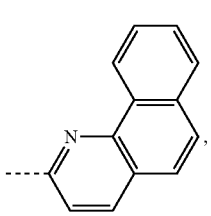
B76 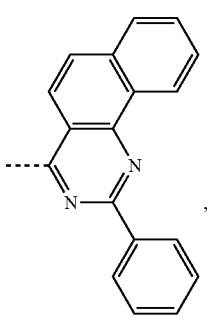
B77 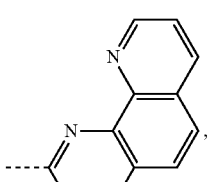
B78 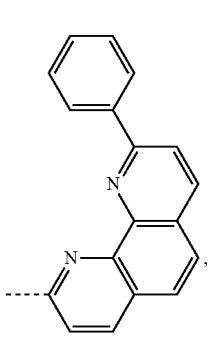

-continued
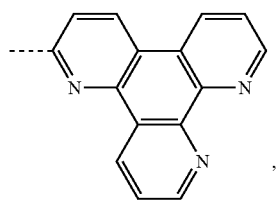
B79
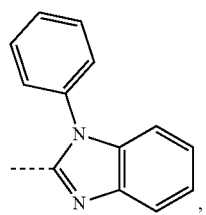
B80
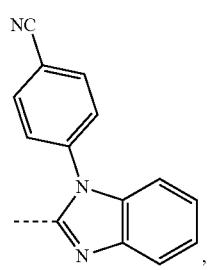
B81
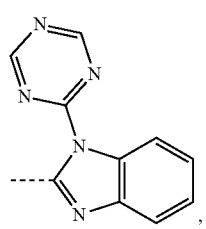
B82
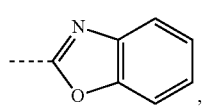
B83
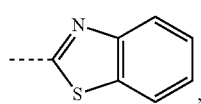
B84
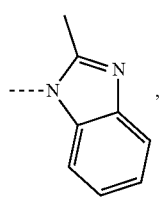
B85
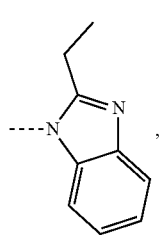
B86
-continued
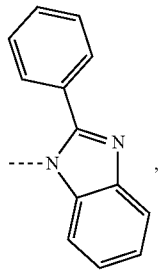
B87
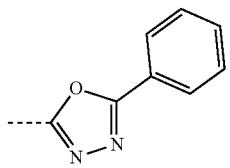
B88
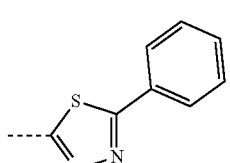
B89
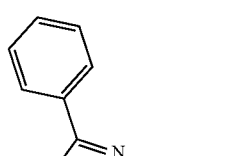
B90
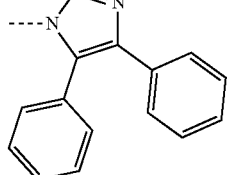
B91
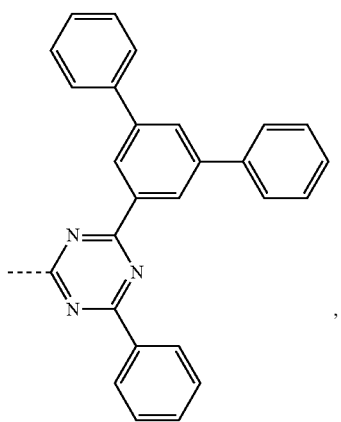
B92

B93
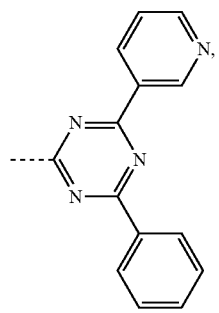
B94
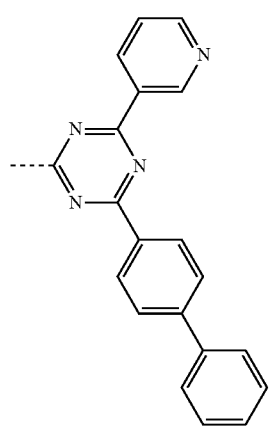
B95
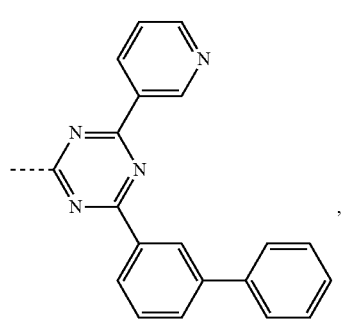
B96
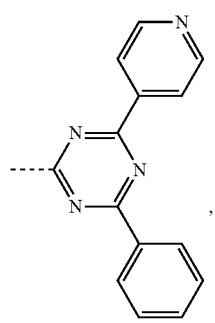
B97
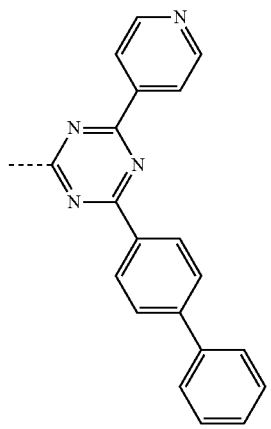
B98
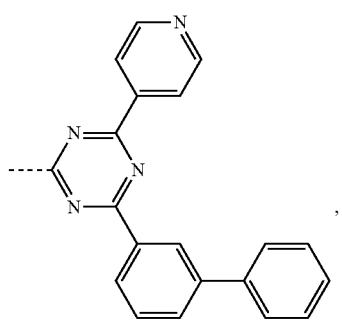
B99
B100
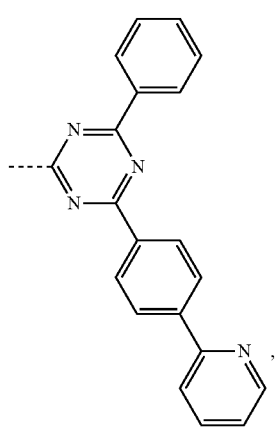

-continued
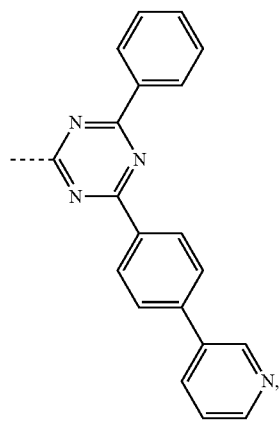
B101
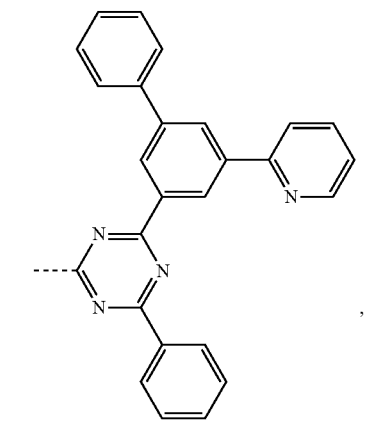
B104
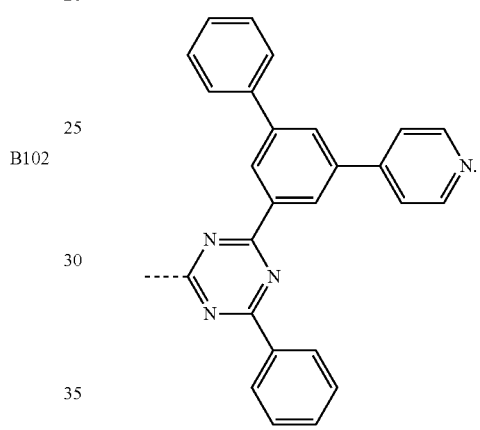
B105
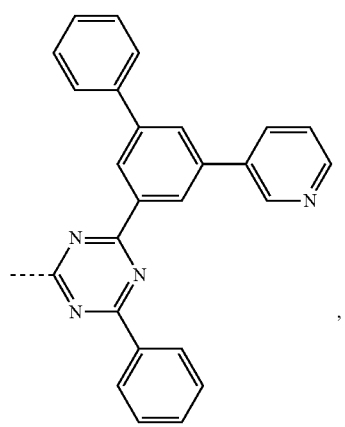
B102
B103
According to an embodiment of the present disclosure, wherein the structure A is selected from the group consisting of $A_1$ to $A_{298}$ as illustrated herein.
According to an embodiment of the present disclosure, wherein the structure L is selected from the group consisting of a single bond $L_0$ and $L_1$ to $L_{58}$:
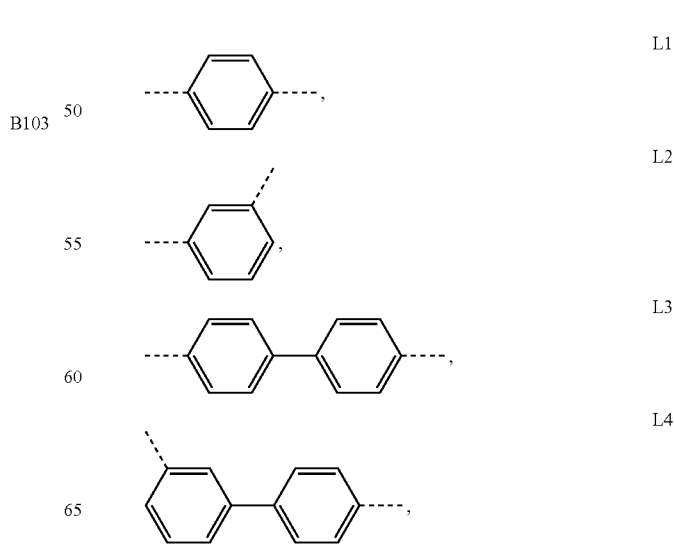

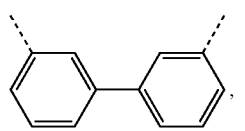  L5  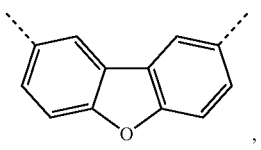
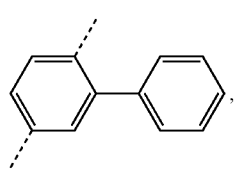  L6  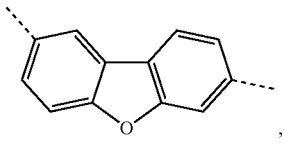
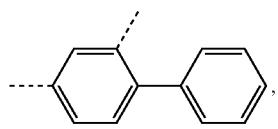  L7  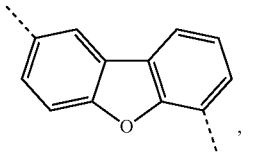
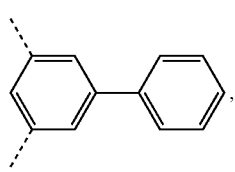  L8  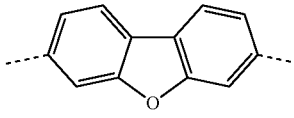
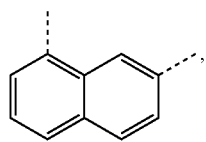  L9  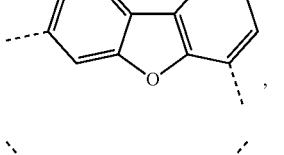
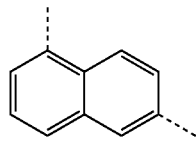  L10  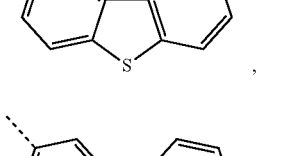
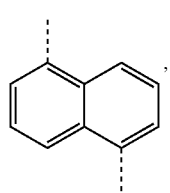  L11  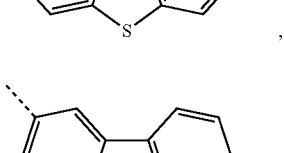
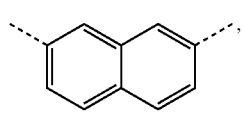  L12  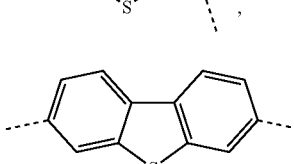
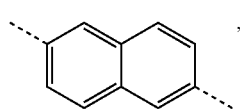  L13  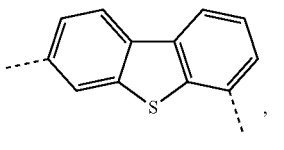
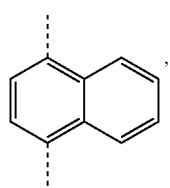  L14

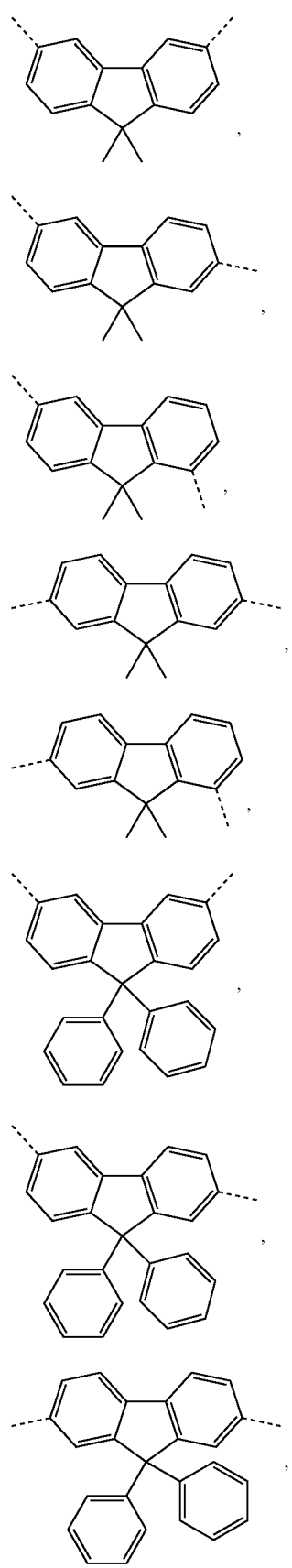
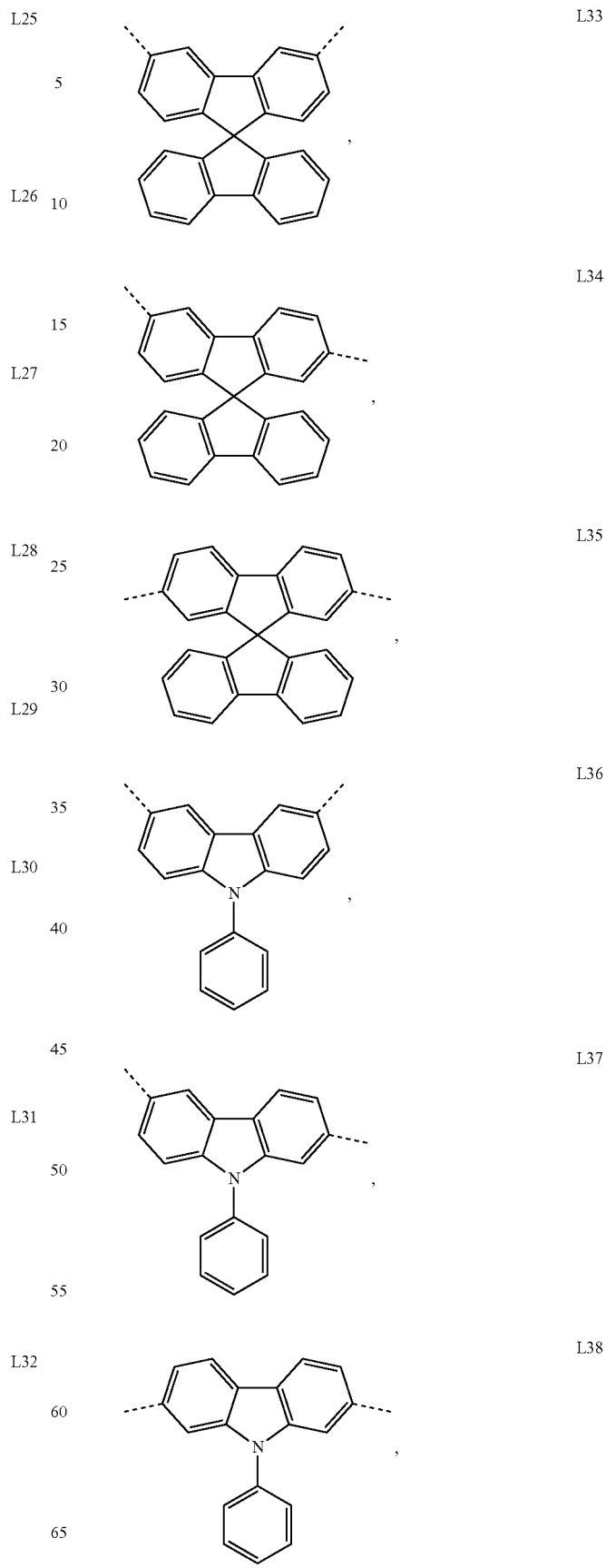

L39
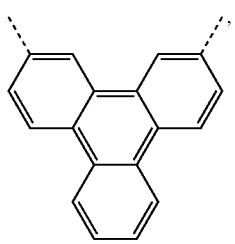
L40
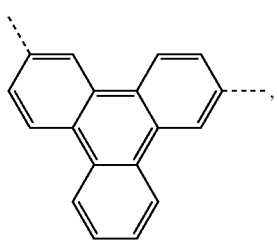
L41
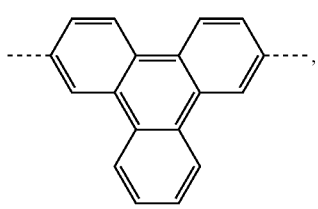
L42
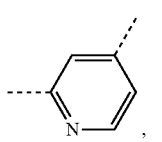
L43
L44
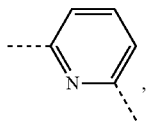
L45
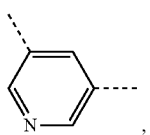
L46
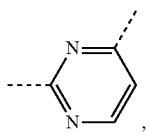
L47
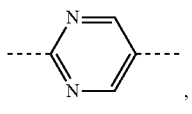
L48
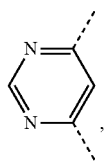
L49
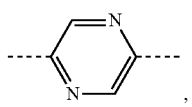
L50
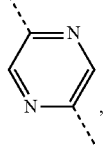
L51
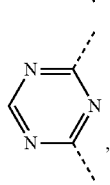
L52
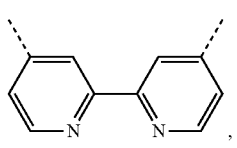
L53
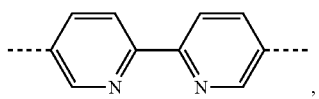
L54
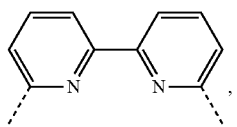
L55
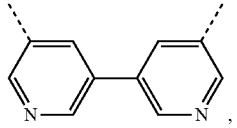
L56
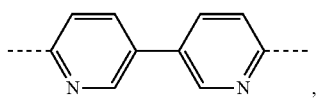
L57
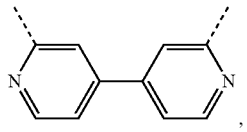
L58
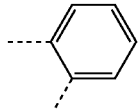
According to an embodiment of the present disclosure, wherein the compound has a structure of Formula 1, wherein the A is selected from the group consisting of $A_1$-$A_{298}$, wherein B is each independently selected from the group consisting of $B_1$-$B_{105}$, wherein L is each independently selected from the group consisting of $L_0$-$L_{58}$, the specific structure of $A_1$-$A_{298}$, $B_1$-$B_{105}$, and $L_0$-$L_{58}$ is shown in the foregoing embodiment.

According to an embodiment of the present disclosure, wherein the compound is selected from the group consisting of Compound 1 to Compound 270; the specific structure of the Compound 1 to Compound 270 illustrated herein.

According to an embodiment of the present disclosure, an electroluminescent device is disclosed, which comprises:
- an anode,
- a cathode,
- and an organic layer disposed between the anode and the cathode, wherein the organic layer comprising a compound having Formula 1:

Formula 1 wherein n is 1, 2, 3 or 4; when n≥2, each group of L and B can be the same or different;

A is the structure represented by Formula 2:

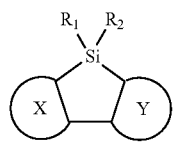

Formula 2 wherein ring X and Y each independently represents a substituted or unsubstituted aryl or heteroaryl group having 5 to 50 ring atoms;

wherein at least one of X and Y is a fused ring system;

wherein $R_1$ and $R_2$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

wherein $R_1$ and $R_2$ can be optionally joined to form a ring;

wherein L is a single bond, or a substituted or unsubstituted arylene group having 6 to 60 carbon atoms, or a substituted or unsubstituted heteroarylene group having 2 to 60 carbon atoms;

wherein B is a substituted or unsubstituted electron-deficient heteroaryl group having 2 to 60 carbon atoms.

According to an embodiment of the present disclosure, wherein the organic layer is an electron transporting layer.

According to an embodiment of the present disclosure, wherein the organic layer is an electron transporting layer, the electron transporting layer further comprises at least one material.

According to an embodiment of the present disclosure, wherein the organic layer is an electron transporting layer, the electron transporting layer also comprises at least one metal complex.

According to an embodiment of the present disclosure, wherein the metal complex comprises a ligand $L_q$ represented by Formula 64:

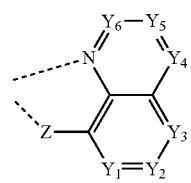

Formula 64 wherein $Y_1$, $Y_2$, $Y_3$, $Y_4$, $Y_5$ and $Y_6$ are each independently selected from $CR_Y$ or N; wherein each $R_Y$ is independently selected from hydrogen, deuterium, alkyl, alkoxy, amino, silyl, cyano, halogen, aryl and heteroaryl;

wherein Z is NH, O, S or Se.

According to an embodiment of the present disclosure, wherein the metal complex is 8-hydroxyquinoline-lithium (Liq), 8-hydroxyquinoline-sodium (Naq), 8-hydroxyquinoline-potassium (Kq), bis(8-hydroxyquinoline)-beryllium ($Beq_2$), Bis(8-hydroxyquinoline)-magnesium ($Mgq_2$), bis(8-hydroxyquinoline)-calcium ($Caq_2$), tris(8-hydroxyquinoline)-boron ($Bq_3$), tris(8-hydroxyquinoline)-aluminum ($Alq_3$), or tris(8-hydroxyquinoline)-gallium ($Gaq_3$).

According to an embodiment of the present disclosure, wherein the electroluminescent device is incorporated into a device group consisting of a consumer product, an electronic component module, an organic light emitting device and a lighting panel.

According to an embodiment of the present disclosure, a compound formulation comprising a compound having Formula 1 is also disclosed. The specific structure of Formula 1 is as shown in any of the foregoing embodiments.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, materials disclosed herein may be used in combination with a wide variety of emitters, hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SIIIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

SYNTHESIS EXAMPLES

The method for preparing the compounds of the present disclosure is not limited. The following compounds are exemplified as a typical but non-limiting example, and the synthesis route and preparation method are as follows:

Synthesis Example 1: Synthesis of Compound $A_{26}L_0B_{52}$ (Compound 17)

Step 1: Synthesis of [Intermediate 1-a]

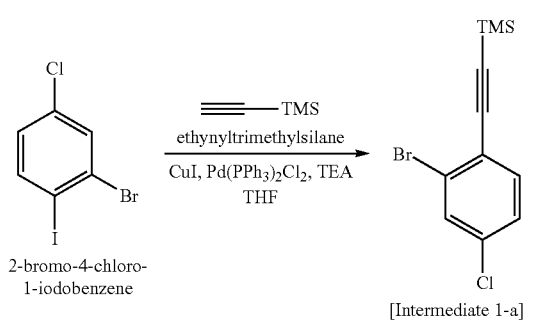

2-Bromo-4-chloro-1-iodobenzene (60.0 g, 189.05 mmol) was added to a 2000 mL three-neck round bottom flask, then 800.0 mL of anhydrous tetrahydrofuran was added to dissolve, and stirred at room temperature under nitrogen atmosphere. Triethylamine (30.0 mL, 198.2 mmol), cuprous iodide (1.05 g, 5.51 mmol), and bistriphenylphosphine palladium dichloride (4.0 g, 5.70 mmol) were added successively, and kept stirring for 20 min. Trimethylethynyl silicon (23.0 mL, 200 mmol) was added slowly and allowed to react at room temperature for 3 hours. After the reaction completed, the reaction was quenched with water and extracted with ethyl acetate. The organic phase was isolated by column chromatography to give a yellow oil [Intermediate 1-a] (50.0 g, 173.82 mmol, 90.0% yield).

Step 2: Synthesis of [Intermediate 1-b]

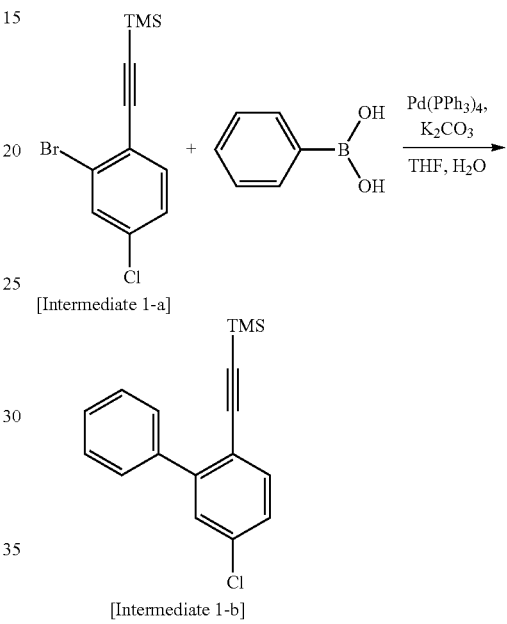

[Intermediate 1-a] (50.0 g, 173.82 mmol), phenylboronic acid (25.5 g, 209.12 mmol), tetrakistriphenylphosphine palladium (6.0 g, 5.2 mmol), potassium carbonate (48.0 g, 398.20 mmol) were added to a 2000 mL three-neck round bottom flask, then 600 mL of tetrahydrofuran and 300 mL of water were added. The reaction flask was warmed to reflux at 85° C. and stirred under nitrogen atmosphere for 12 hours. After the reaction completed, the reaction was cooled to room temperature and extracted with ethyl acetate, the organic phase was dried and concentrated, and then isolated via column chromatography to give a yellow oil [Intermediate 1-b] (40.5 g, 140.50 mmol, 81.0% yield).

Step 3: Synthesis of [Intermediate 1-c]

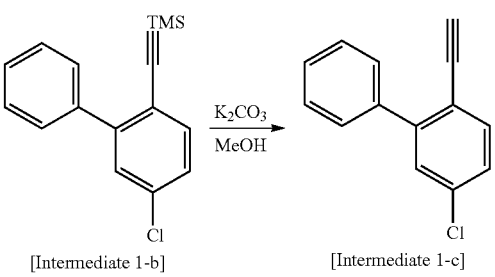

[Intermediate 1-b] (26.7 g, 94.5 mmol), potassium carbonate (46.6 g, 337.90 mmol) were added to a 1000 mL three-neck round bottom flask, then 400 mL of methanol was added and kept stirring for 4 hours at room temperature. After the reaction completed, the solid was filtered through celite, the liquid was concentrated and isolated via column chromatography to obtain a pale yellow solid [Intermediate 1-c] (29.0 g, 186.36 mmol, 96.8% yield).

Step 4: Synthesis of [Intermediate 1-d]

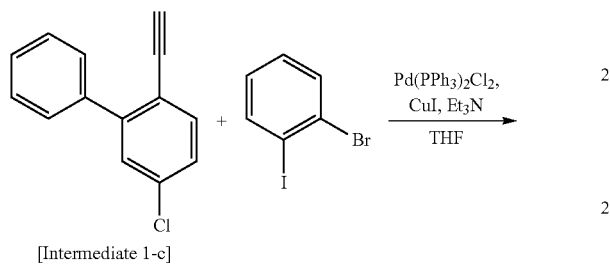

o-Bromoiodobenzene (26.7 g, 94.5 mmol) was added to a 1000 mL three-neck round bottom flask, then 400.0 mL of anhydrous tetrahydrofuran was added to dissolve, and stirred at room temperature under nitrogen atmosphere. Triethylamine (16.5 mL, 169.0 mmol), cuprous iodide (0.55 g, 2.89 mmol), and bistriphenylphosphine palladium dichloride (2.1 g, 3.0 mmol) were added successively, and stirred for 20 min. [Intermediate 1-c] was added slowly (21.0 mL, 98.74 mmol, dissolved in 50 mL of tetrahydrofuran), and reacted at room temperature for 3 hours. After the reaction completed, the reaction was quenched with water and extracted with ethyl acetate, and the organic phase was separated. The organic phase was isolated via column chromatography to obtain a white solid [Intermediate 1-d] (35 g, 87.0 mmol, 90.0% yield).

Step 5: Synthesis of [Intermediate 1-e]

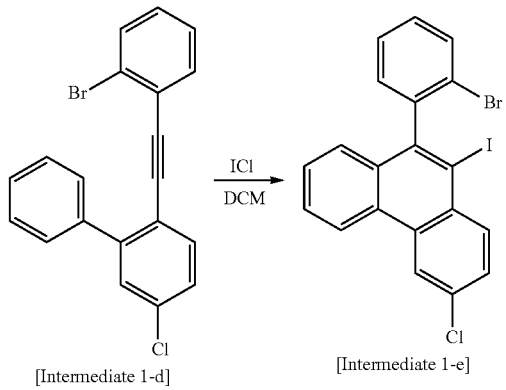

[Intermediate 1-d] (35 g, 87.0 mmol) was added to a 2000 mL three-neck round bottom flask, then dichloromethane (850.0 mL) was added to dissolve and stirred under nitrogen atmosphere. The reaction flask was cooled to −60° C., and then iodine monochloride (104.0 mL, 104.00 mmol, 1.0 M dichloromethane solution) was slowly added dropwise to the reaction mixture and maintained at −60° C. for 1 hour. After the reaction completed, the reaction was quenched by the addition of saturated aqueous Na$_2$SO$_3$, warmed to room temperature and stirred until that the purple color of the solution disappeared. Then dichloromethane was added to extract, the organic phase was dried over MgSO$_4$, and the organic phase was filtered and concentrated to afford a solid. The obtained solid was added to a 1000 mL round bottom flask, then 500 mL of n-hexane was added and the mixture was warmed to reflux and stirred for 4 hours. After filtration a white solid [Intermediate 1-e] (41.8 g, 78.3 mmol, 91.0% yield) was collected.

Step 6: Synthesis of [Intermediate 1-f]

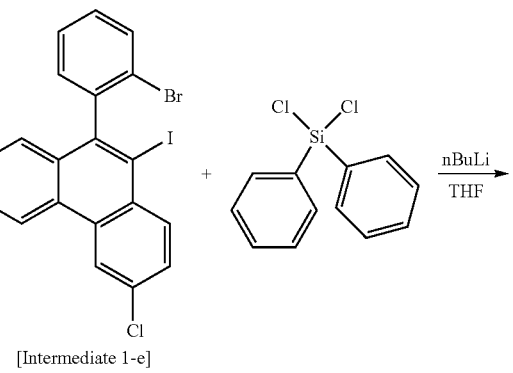

-continued

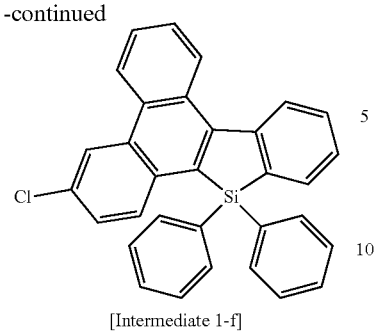

[Intermediate 1-f]

[Intermediate 1-e] (35 g, 70 mmol) and 200 mL of anhydrous tetrahydrofuran were placed in a 1000 mL three-neck round bottom flask and stirred at −78° C. under nitrogen atmosphere. After that about 70 mL of n-butyl-lithium (2.5 M n-hexane solution) was slowly added dropwise at −78° C. for 2 hours, dichlorodiphenylsilane (22.2 mL, 105.0 mmol, dissolved in 50 mL of tetrahydrofuran) was added and the temperature of reaction flack was raised to room temperature and stirred for 3 hours. After the reaction completed, 200 mL of water was added and the organic phase was extracted and separated. The organic phase was isolated via column chromatography to give a white solid [Intermediate 1-f] (17.5 g, 37.4 mmol, 52.5% yield).

Step 7: Synthesis of [Intermediate 1-g]

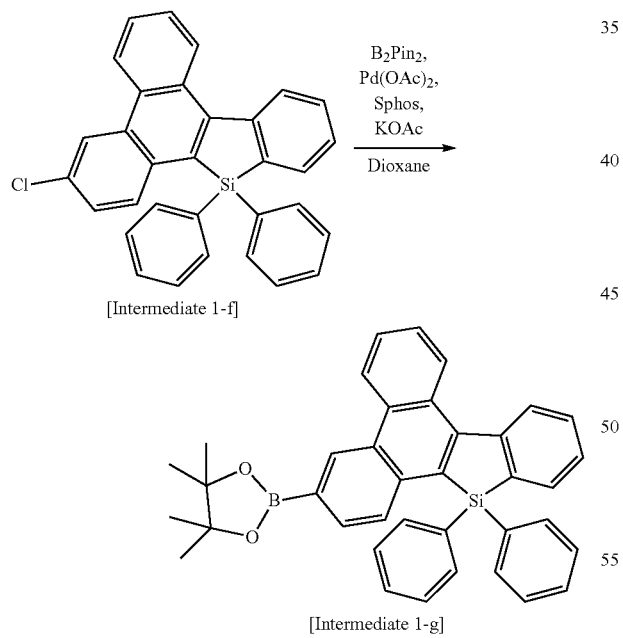

[Intermediate 1-f] (17.5 g, 37.4 mmol), bis(pinacolate) diboron (14.25 g, 56.1 mmol), palladium acetate (419.8 mg, 1.87 mmol), 2-dicyclohexylphosphino-2',6'-dimethoxybiphenyl (1.53 g, 3.74 mmol), potassium acetate (11.1 g, 112.2 mmol) were added to a 250 mL three-neck round bottom flask, followed by the addition of 120 mL of 1,4-dioxane. The reaction flask was heated to reflux at 110° C. and stirred under nitrogen atmosphere for 10 hours. After the reaction completed, the reaction mixture was cooled to room temperature and extracted with methylene chloride. The organic phase was dried and concentrated, then isolated via column chromatography to give white solid [Intermediate 1-g](13.5 g, 24.10 mmol, 64.4% yield).

Step 8: Synthesis of $A_{26}L_0B_{52}$

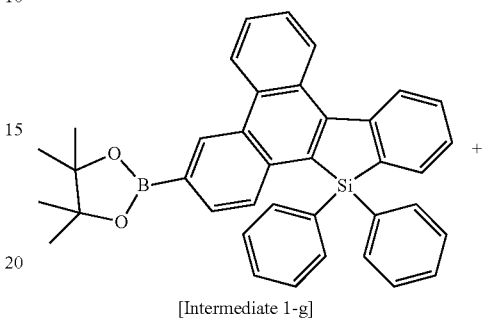

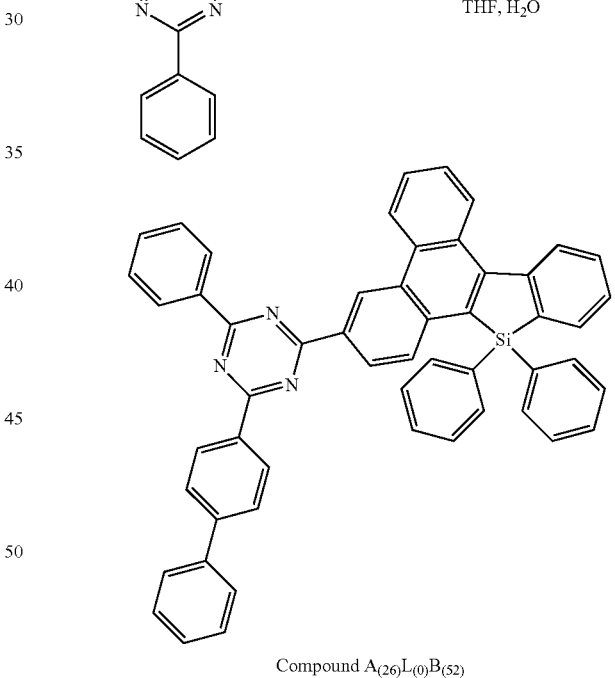

Compound $A_{(26)}L_{(0)}B_{(52)}$

[Intermediate 1-g] (5.05 g, 9.0 mmol), 2-chloro-4-(biphenyl-4-yl)-6-phenyl-1,3,5-triazine (3.1 g, 9.0 mmol), tetrakistriphenylphosphine palladium (520 mg, 0.45 mmol), potassium carbonate (3.75 g, 27.0 mmol) were added to a 250 mL three-neck round bottom flask, followed by the addition of 60 mL of tetrahydrofuran and 20 mL of water. The reaction flask was warmed to reflux at 85° C. and stirred under nitrogen atmosphere for 12 hours. After the reaction completed, the reaction mixture was cooled to room temperature and extracted with methylene chloride. The organic phase was dried and concentrated, and then isolated by column chromatography to give a yellow solid compound $A_{26}L_0B_{52}$ (5.6 g, 7.55 mmol, 84.5%). The product was confirmed as the target product, with a molecular weight of 742.

Example 2: Synthesis of Compound $A_{30}L_0B_{52}$ (Compound 197)

Step 1: Synthesis of [Intermediate 2-a]

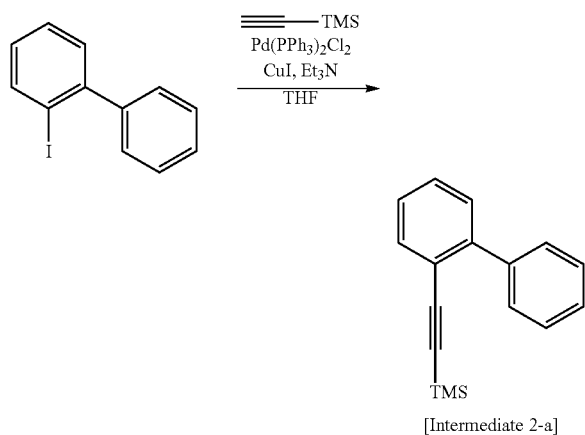

[Intermediate 2-a]

In the step 1 of Synthesis Example 1, o-iodobiphenyl was used instead of 2-bromo-4-chloro-1-iodobenzene, and [Intermediate 2-a] (28.5 g, 38% yield) was obtained by the same procedure.

Step 2: Synthesis of [Intermediate 2-b]

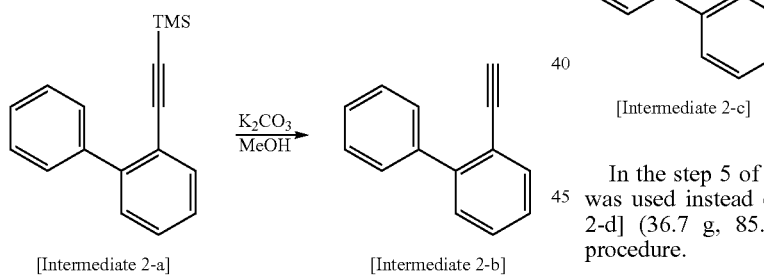

[Intermediate 2-a]　　　　[Intermediate 2-b]

In the step 3 of Synthesis Example 1, [Intermediate 2-a] was used instead of [Intermediate 1-b], and [Intermediate 2-b] (19.56 g, 93.6% yield) was obtained by the same procedure.

Step 3: Synthesis of [Intermediate 2-c]

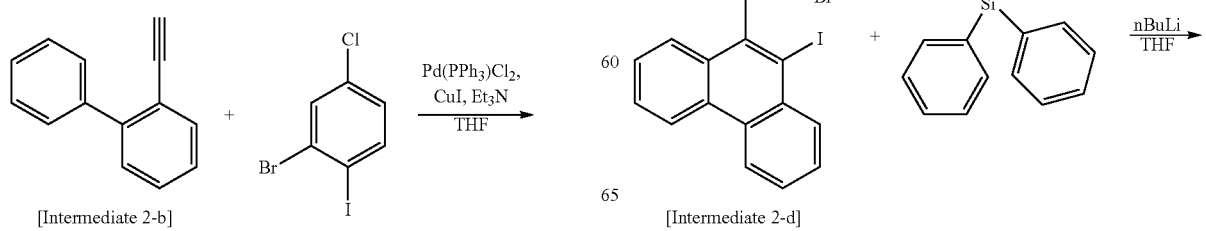

[Intermediate 2-b]

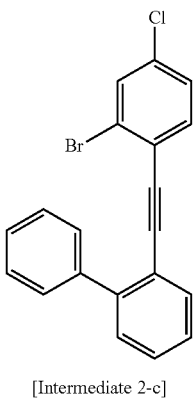

[Intermediate 2-c]

In the step 4 of Synthesis Example 1, [Intermediate 2-b] was used instead of [Intermediate 1-c], and 2-bromo-4-chloro-1-iodobenzene was used in place of o-bromoiodobenzene and [Intermediate 2-c] (31.3 g, 79.2% yield) was obtained by the same procedure.

Step 4: Synthesis of [Intermediate 2-d]

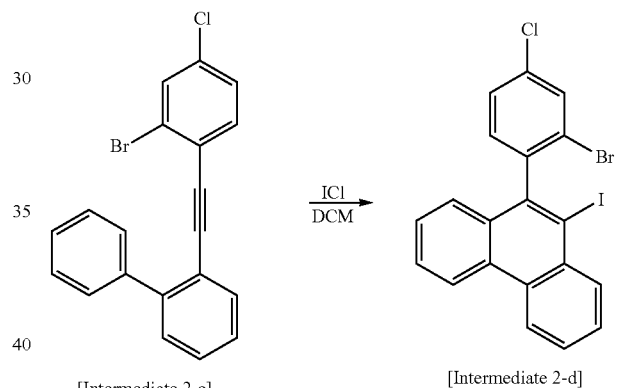

[Intermediate 2-c]　　　　[Intermediate 2-d]

In the step 5 of Synthesis Example 1, [Intermediate 2-c] was used instead of [Intermediate 1-d], and [Intermediate 2-d] (36.7 g, 85.7% yield) was obtained by the same procedure.

Step 5: Synthesis of [Intermediate 2-e]

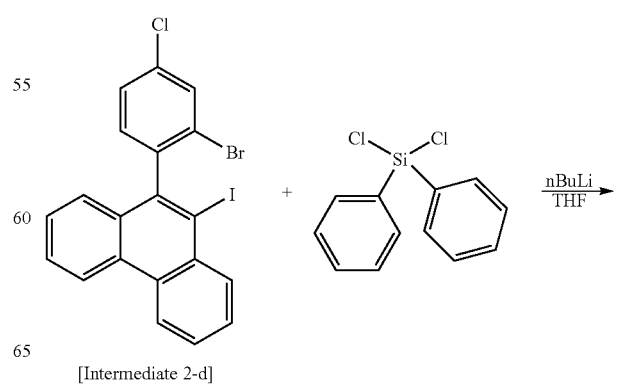

[Intermediate 2-d]

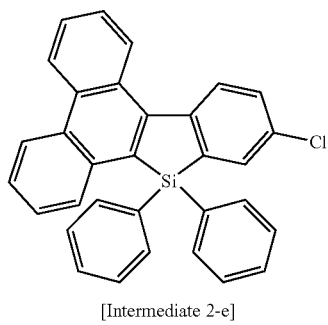

[Intermediate 2-e]

In the step 6 of Synthesis Example 1, [Intermediate 2-d] was used instead of [Intermediate 1-e], and [Intermediate 2-e] (15 g, 63.0% yield) was obtained by the same procedure.

Step 6: Synthesis of [Intermediate 2-f]

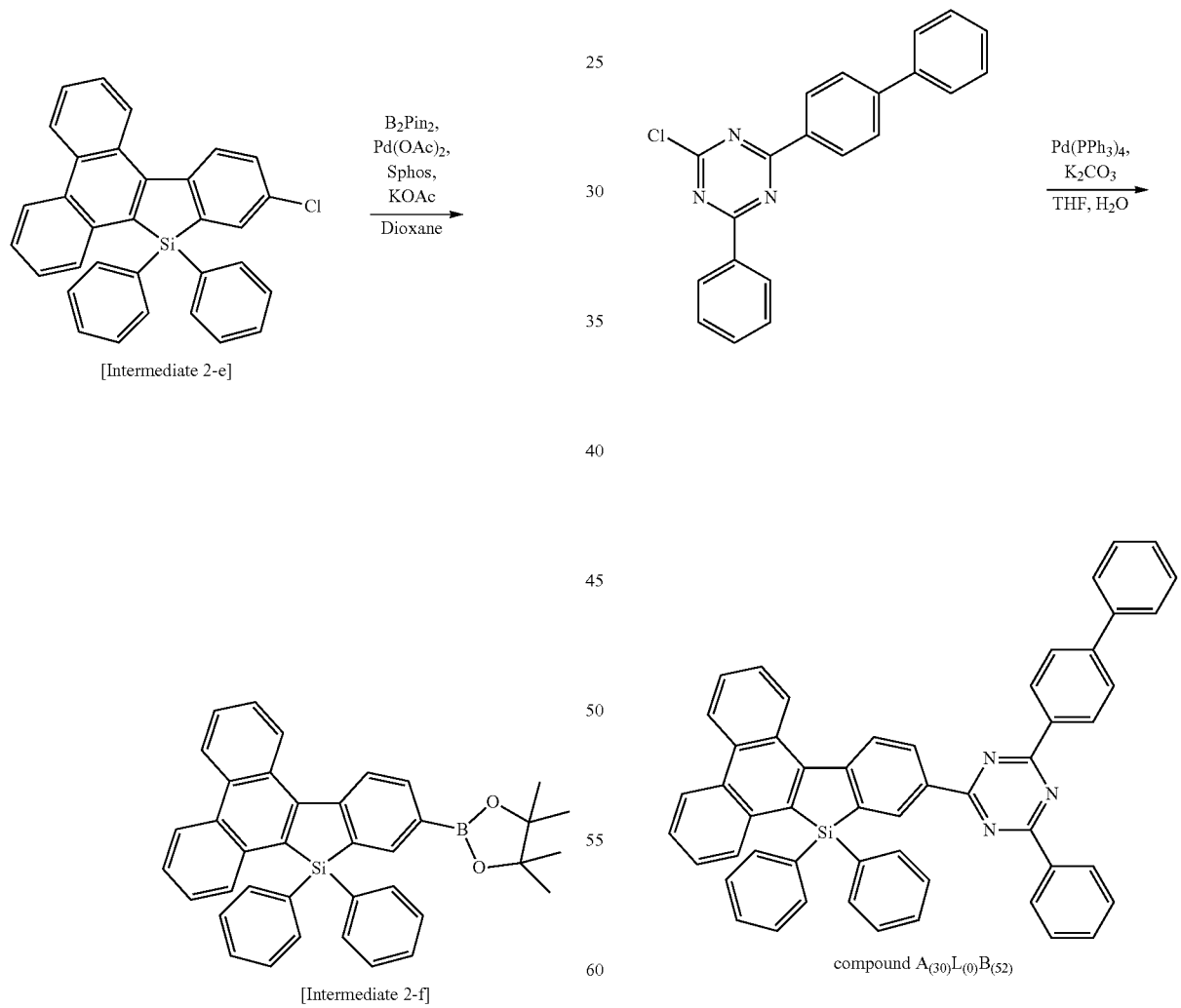

[Intermediate 2-f]

In the step 7 of Synthesis Example 1, [Intermediate 2-e] was used instead of [Intermediate 1-f], and [Intermediate 2-f] (5.55 g, 56.2% yield) was obtained by the same procedure.

Step 7: Synthesis of Compound $A_{30}L_0B_{52}$

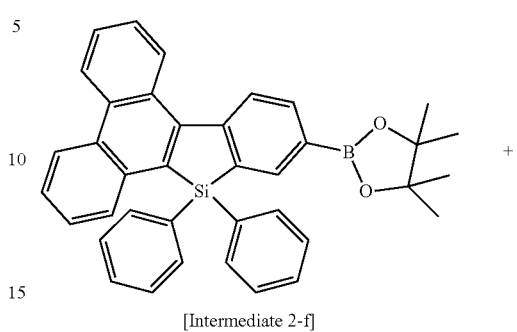

[Intermediate 2-f]

compound $A_{(30)}L_{(0)}B_{(52)}$

In the step 8 of Synthesis Example 1, [Intermediate 2-f] was used instead of [Intermediate 1-g], and compound $A_{30}L_0B_{52}$ (4.2 g, 84.3% yield) was obtained in the same manner. The product was confirmed as the target product, with a molecular weight of 742.

Example 3: Synthesis of Compound $A_{30}L_2B_{51}$ (Compound 256)

Step 1: Synthesis of Compound $A_{30}L_2B_{51}$

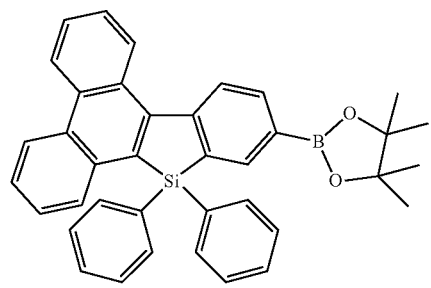

[Intermediate 2-f]

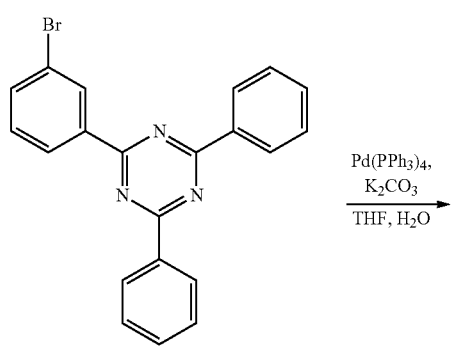

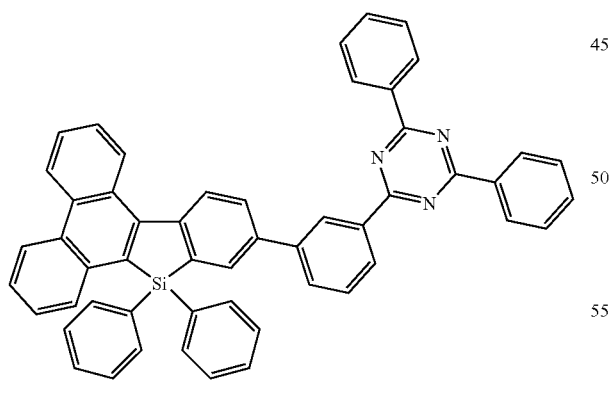

Compound $A_{30}L_2B_{51}$

In the step 8 of Synthesis Example 1, [Intermediate 2-f] was used instead of [Intermediate 1-g], and 2-(3-bromophenyl)-4,6-diphenyl-1,3,5-triazine was used instead of 2-chloro-4-(biphenyl-4-yl)-6-phenyl-1,3,5-triazine, and compound $A_{30}L_2B_{51}$ (3.6 g, 60.7% yield) was obtained in the same manner.

Example 4: Synthesis of Compound $A_{30}L_0B_{53}$ (Compound 198)

Step 1: Synthesis of Compound $A_{30}L_0B_{53}$

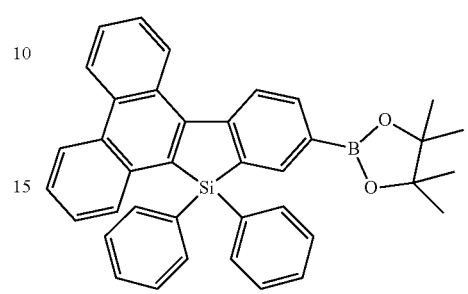

[Intermediate 2-f]

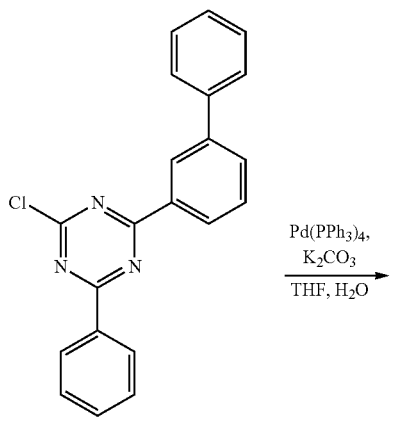

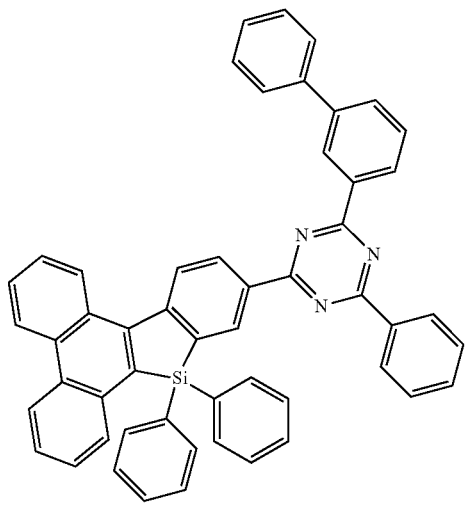

Compound $A_{30}L_0B_{53}$

In the step 8 of Synthesis Example 1, [Intermediate 2-f] was used instead of [Intermediate 1-g], and 2-([1,1'-biphenyl]-3-yl)-4-chloro-6-phenyl-1,3,5-triazine was used instead of 2-chloro-4-(biphenyl-4-yl)-6-phenyl-1,3,5-triazine, and compound $A_{30}L_0B_{53}$ (3.8 g, 85.3% yield) was obtained in the same manner.

Example 5: Synthesis of Compound $A_{29}L_0B_{52}$ (Compound 107)

Step 1: Synthesis of [Intermediate 5-c]

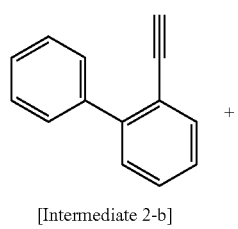

[Intermediate 2-b]

+

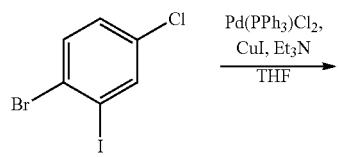

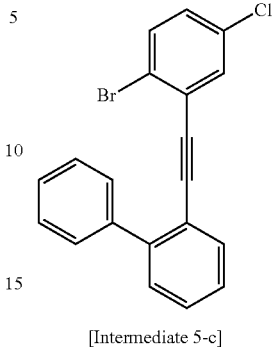

[Intermediate 5-c]

To a 1000 mL three-neck round bottom flask was added 2-bromo-5-chloroiodobenzene (33.7 g, 106.1 mmol), and then 425.0 mL of anhydrous tetrahydrofuran was added to dissolve, and was stirred at room temperature under nitrogen atmosphere. Triethylamine (30 mL, 212.2 mmol), cuprous iodide (0.58 g, 3.0 mmol), bistriphenylphosphine palladium dichloride (2.1 g, 3.0 mmol) were added successively, and stirred for 30 min. [Intermediate 2-b] (18.0 mL, 101.0 mmol, dissolved in 75 mL of THF) was added slowly, and reacted for 10 hours at room temperature. After the reaction completed, the reaction was quenched with water and extracted with ethyl acetate, and the organic phase was separated. The organic phase was isolated via column chromatography to obtain a white solid [Intermediate 5-c] (30 g, 81.6 mmol, 80.8% yield).

Step 2: Synthesis of [Intermediate 5-d]

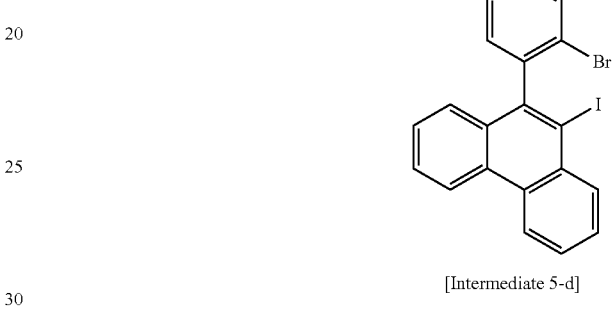

[Intermediate 5-c] (27.5 g, 74.8 mmol) was added to a 1000 mL three-neck round bottom flask, then dichloromethane (650.0 mL) was added to dissolve and stirred under nitrogen atmosphere. The reaction flask was cooled to −60° C., and then iodine monochloride (90.0 mL, 90.00 mmol, 1.0 M dichloromethane solution) was slowly added dropwise to the reaction mixture and the reaction was maintained at −60° C. for 1 hour. After the reaction completed, the reaction was quenched by the addition of saturated aqueous $Na_2SO_3$, warmed to room temperature and stirred until that the purple color of the solution disappeared. Then dichloromethane was added to extract, the organic phase was dried over $MgSO_4$, and the organic phase was filtered and concentrated to afford a solid. The obtained solid was added to a 1000 mL round bottom flask, then 500 ml, of n-hexane was added and the mixture was warmed to reflux and stirred for 8 hours. After filtration a white solid [Intermediate 5-d] (23.0 g, 46.8 mmol, 62.5% yield) was collected.

Step 3: Synthesis of [Intermediate 5-e]

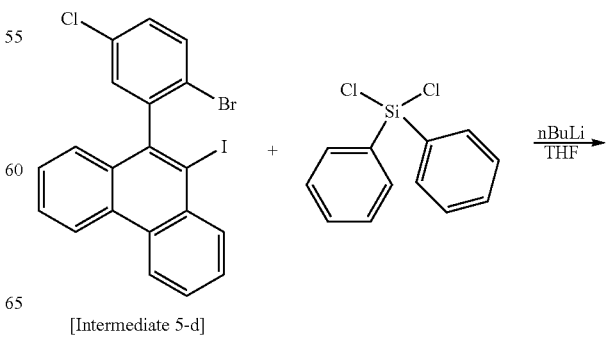

[Intermediate 5-d]

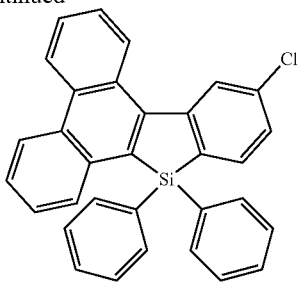

[Intermediate 5-e]

[Intermediate 5-d] (22.8 g, 46.3 mmol), 150 mL of anhydrous tetrahydrofuran were placed in a 500 mL three-neck round bottom flask and stirred at −78° C. under nitrogen atmosphere. After that about 46 mL of n-butyllithium (2.5 M n-hexane solution) was slowly added dropwise at −78° C., after the low temperature was kept for 2 hours, dichlorodiphenylsilane (14.6 mL, 69.5 mmol) was added and the temperature of reaction flack was raised to room temperature and stirred for 18 hours. After the reaction completed, 200 mL of water was added and the organic phase was extracted with dichloromethane and separated. The organic phase was isolated via column chromatography to give a white solid [Intermediate 5-e] (10.8 g, 23.0 mmol, 49.8% yield).

Step 4: Synthesis of [Intermediate 5-f]

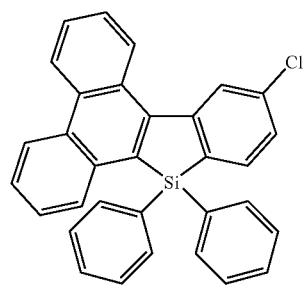

[Intermediate 5-e]

B₂Pin₂, Pd(OAc)₂, Sphos, KOAc
─────────→
Dioxane

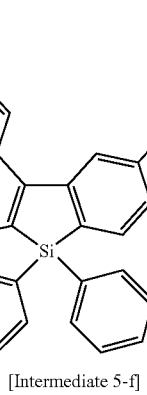

[Intermediate 5-f]

[Intermediate 5-e] (10.8 g, 23.0 mmol), bis(pinacolate) diboron (8.5 g, 34.6 mmol), palladium acetate (252 mg, 1.15 mmol), 2-dicyclohexylphosphino-2',6'-dimethoxybiphenyl (920 mg, 2.3 mmol), potassium acetate (6.5 g, 69.0 mmol) were added to a 250 mL three-neck round bottom flask, followed by the addition of 80 mL of 1,4-dioxane. The reaction flask was heated to reflux at 120° C. and stirred under nitrogen atmosphere for 15 hours. After the reaction completed, the reaction mixture was cooled to room temperature and extracted with methylene chloride. The organic phase was dried and concentrated, then isolated via column chromatography to give white solid [Intermediate 5-f](7.6 g, 13.5 mmol, 58.8% yield).

Step 5: Synthesis of Compound $A_{29}L_0B_{52}$

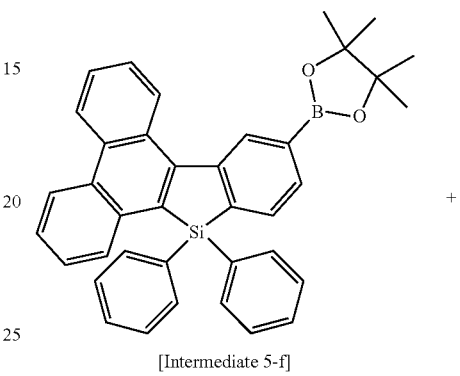

[Intermediate 5-f]

+

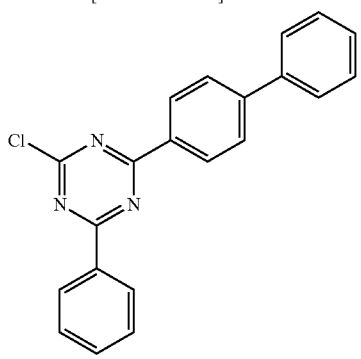

Pd(PPh₃)₄, K₂CO₃
─────────→
THF, H₂O

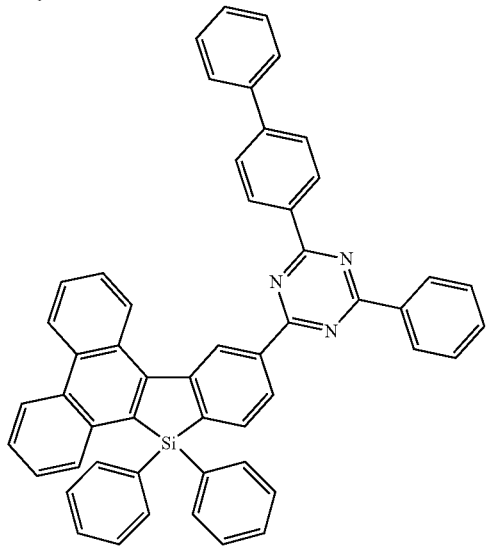

Compound $A_{29}L_0B_{53}$

[Intermediate 5-f] (4.0 g, 7.1 mmol), 2-chloro-4-(biphenyl-4-yl)-6-phenyl-1,3,5-triazine (2.5 g, 7.1 mmol), tetrakistriphenylphosphine palladium (412 mg, 0.36 mmol), potassium carbonate (3.0 g, 21.4 mmol) were added to a 250 mL three-neck round bottom flask, followed by the addition of 60 ml, of tetrahydrofuran and 20 mL of water. The reaction flask was warmed to reflux at 85° C. and stirred under nitrogen atmosphere for 15 hours. After the reaction completed, the reaction system was cooled to room temperature and extracted with methylene chloride. The organic phase was dried and concentrated, and then isolated by column chromatography to give a yellow solid compound $A_{29}L_0B_{52}$ (4.3 g, 5.8 mmol, 81.2%).

Example 6: Synthesis of Compound $A_{29}L_0B_{53}$ (Compound 108)

Step 1: Synthesis of Compound $A_{29}L_0B_{53}$

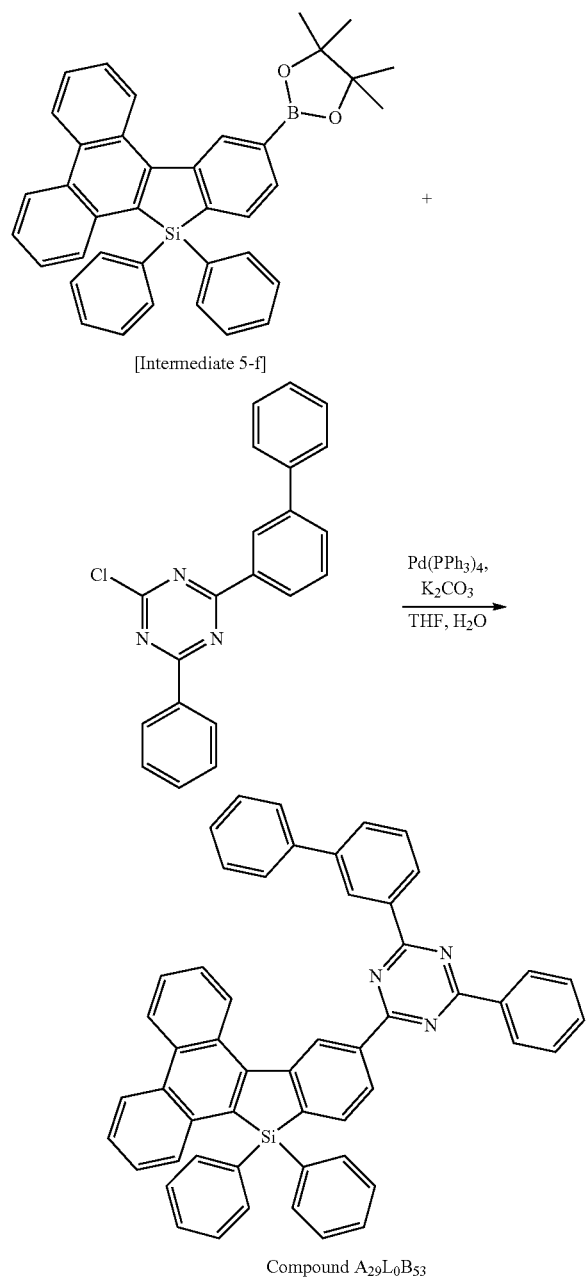

Compound $A_{29}L_0B_{53}$

In the step 5 of Synthesis Example 5, 2-([1,1'-biphenyl]-3-yl)-4-chloro-6-phenyl-1,3,5-triazine was used instead of 2-chloro-4-(biphenyl-4-yl)-6-phenyl-1,3,5-triazine, and compound $A_{29}L_0B_{53}$ (3.7 g, 78.0% yield) was obtained in the same manner.

The persons skilled in the art should know that the above preparation method is only an illustrative example, and the persons skilled in the art can obtain the structure of other compounds of the present disclosure by modifying the above preparation method.

DEVICE EXAMPLE

Example 1 and Comparative Example 1

A glass substrate with 80 nm thick indium-tin-oxide (ITO) anode was first cleaned and then treated with oxygen plasma and UV ozone. After the treatments, the substrate was dried in a glovebox to remove moisture. The substrate was then mounted on a substrate holder and loaded into a vacuum chamber. The organic layers specified below were deposited in sequence by thermal vacuum deposition on the ITO anode at a rate of 0.2-2 Å/s under a vacuum degree of around $10^{-8}$ torr. Compound HI was used as the hole injection layer (HIL, 100 Å). Compound HT was used as the hole transporting layer (HTL, 400 Å). Compound EB was used as the electron blocking layer (EBL, 50 Å). Then the Compound RD1 was doped in the host Compound HOST (Compound HOST:Compound RD1=97:3, 400 Å) as the emitting layer (EML). On the emitting layer, Compound HB was deposited as hole blocking layer (HBL, 50 Å). The Compound $A_{30}L_0B_{52}$ of the present disclosure or the comparative Compound ET1 was then doped with 8-hydroxyquinoline-lithium (Liq) as an electron transporting layer (ETL, 350 Å). Finally, 10 Å-thick 8-hydroxyquinoline-lithium (Liq) was deposited as the electron injection layer and 1200 Å of Al was deposited as the cathode. The device was then transferred back to the glovebox and encapsulated with a glass lid and a moisture getter to complete the device.

The detailed electron transporting layer structure and thicknesses are shown in the table below. In the layers in which more than one material was used, they were obtained by doping different compounds in the weight ratios described therein.

TABLE 1

| Device structure of device examples | |
| --- | --- |
| Device ID | ETL |
| Example 1 | Liq: Compound $A_{30}L_0B_{52}$ (60:40) (350 Å) |
| Comparative Example 1 | Liq: Compound ET1 (60:40) (350 Å) |

Structures of the materials used in the devices are shown as below:
Compound HI
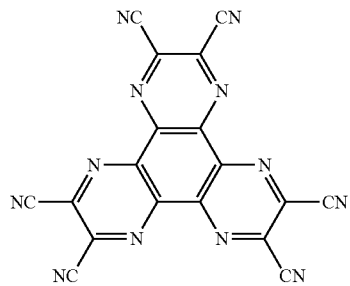
Compound HOST
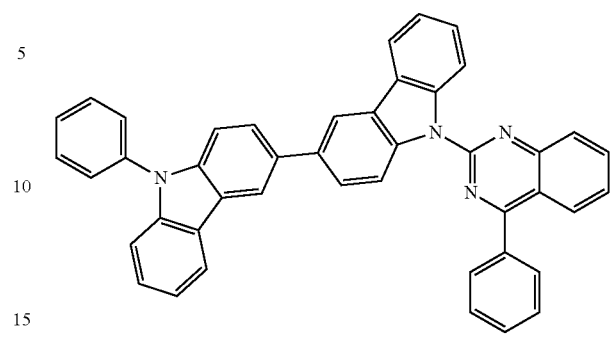
Compound HT
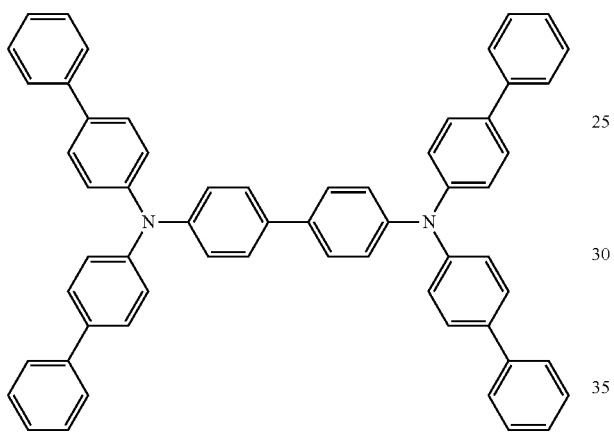
Compound HB
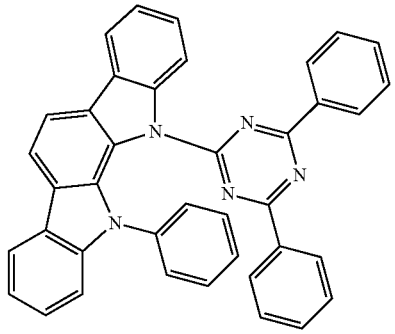
Compound EB
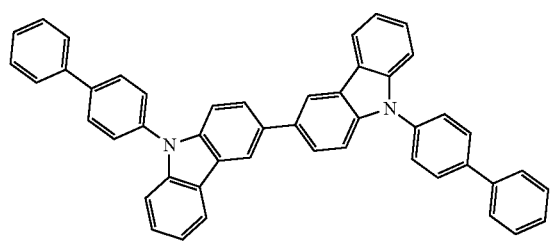
Compound ET1
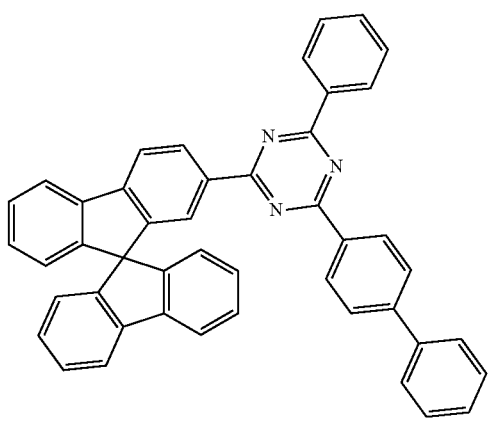
Compound RD1
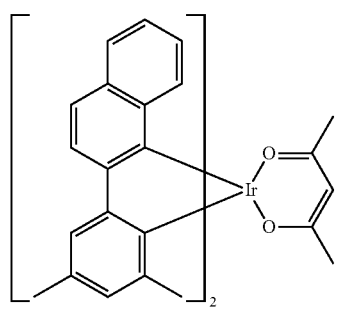
LiQ
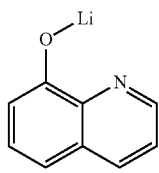

Compound $A_{30}L_0B_{52}$

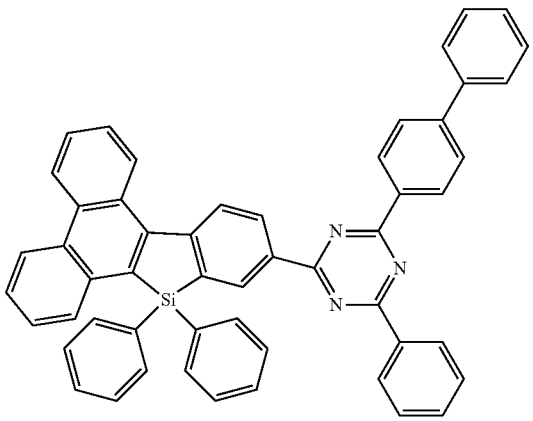

Sublimation temperature of Compound $A_{30}L_0B_{52}$ and Compound ET1, the chromaticity coordinate (CIE), λ max and half-width (FWHM) of Example 1 and Comparative Example 1 at 1000 nits, and the results of lifetimes tested with constant current from an initial brightness of 7500 nits are shown in Table 2, respectively.

TABLE 2

Device data

| Device ID | Sub T (° C.) | CIE (x, y) | $\lambda_{max}$ (nm) | FWHM (nm) | LT97 (h) |
|---|---|---|---|---|---|
| Example 1 | 301 | (0.661, 0.338) | 619 | 61.2 | 352 |
| Comparative Example 1 | 249 | (0.661, 0.338) | 619 | 61.4 | 268 |

Example 2 and Comparative Example 2

According to the above example, only the emitting layer (EML) and the electron transporting layer (ETL) were changed: the compound RD2 was doped in the host Compound HOST (Compound HOST:Compound RD2=97:3, 400 Å) as the emitting layer (EML). The Compound $A_{30}L_0B_{52}$ of the present disclosure or the comparative Compound ET2 was doped with 8-hydroxyquinoline-lithium (Liq) as an electron transporting layer (ETL).

The detailed structure and thickness of the electron transporting layer are shown in the table below. In the layers in which more than one material was used, they were obtained by doping different compounds in the weight ratios described therein.

TABLE 3

Device structure of device examples

| Device ID | ETL |
|---|---|
| Example 2 | Liq: Compound $A_{30}L_0B_{52}$ (60:40) (350 Å) |
| Comparative Example 2 | Liq: Compound ET2 (60:40) (350 Å) |

Structure of the materials used in the devices are shown as below:

Compound RD2

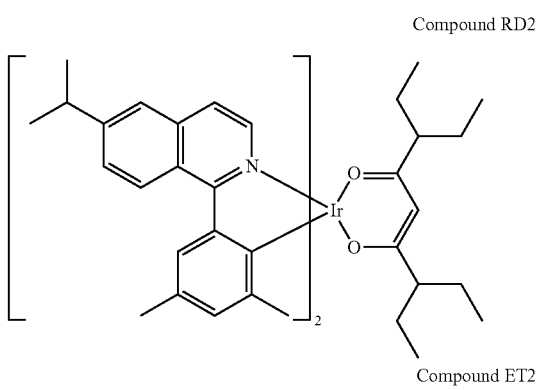

Compound ET2

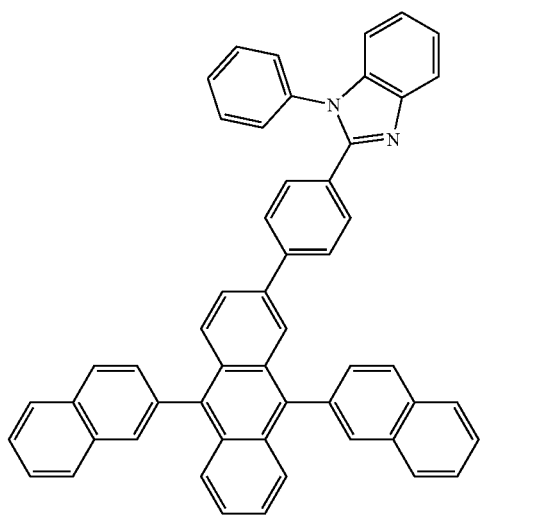

Sublimation temperature of Compound $A_{30}L_0B_{52}$ and Compound ET2, The current efficiency (CE), voltage, chromaticity coordinate (CIE), λ max and half-width (FWHM) of Example 2 and Comparative Example 2 at 1000 nits, and the results of lifetimes tested with constant current from an initial brightness of 7500 nits are shown in Table 4, respectively.

TABLE 4

Device data

| Device ID | Sub T (° C.) | CE/ (cd/A) | Voltage (V) | CIE (x,y) | $\lambda_{max}$ (nm) | FWHM (nm) | LT97 (h) |
|---|---|---|---|---|---|---|---|
| Example 2 | 301 | 22.33 | 4.33 | (0.684,0.316) | 625 | 49.0 | 484.6 |
| Comparative Example 2 | 298 | 22.41 | 4.02 | (0.683,0.316) | 625 | 49.3 | 328.8 |

Discussion:

As the results shown in Table 2 and Table 4, it can be confirmed that the compounds represented by Formula 1 of the present disclosure can be used for an electron transporting material layer of an organic light-emitting device, and exhibits excellent characteristics in terms of lifetime of the device.

Example 3

First, a glass substrate which has 80 nm-thick indium-tin-oxide (ITO) anode was cleaned, and then treated with oxygen plasma and UV ozone. Then the cleaned substrate was dried in a glovebox to remove moisture. The substrate was then mounted on a substrate holder and loaded into a vacuum chamber. The organic layers specified below were deposited in sequence by thermal vacuum deposition on the ITO anode at a rate of 0.2-2 Å/s under a vacuum degree of around $10^{-8}$ torr. Compound HI was used as the hole injection layer (HIL, 100 Å). Compound HT was used as the hole transporting layer (HTL, 1200 Å). Compound EB1 was used as the electron blocking layer (EBL, 50 Å). Then Compound BH and Compound BD (weight ratio of 96:4) codeposited as the emitting layer (EML, 250 Å). On the emitting layer, Compound HB1 was deposited as hole blocking layer (HBL, 50 Å). Then Compound $A_{30}L_0B_{52}$ of the present disclosure was doped in 8-hydroxyquinoline-lithium (Liq) (weight ratio of 40:60) as an electron transporting layer (ETL, 300 Å). Finally, 10 Å-thick 8-hydroxyquinoline-lithium (Liq) was deposited as the electron injection layer (EIL) and 1200 Å-thick Al was deposited as the cathode. The device was then transferred back to the glovebox and encapsulated with a glass lid and a moisture getter to complete the device.

Example 4

Example 4 is fabricated in the same manner as Example 3, except that Compound $A_{30}L_2B_{51}$ was used instead of Compound $A_{30}L_0B_{52}$ in the ETL.

Example 5

Example 5 is fabricated in the same manner as Example 3, except that Compound $A_{30}L_0B_{53}$ was used instead of Compound $A_{30}L_0B_{52}$ in the ETL.

Example 6

Example 6 is fabricated in the same manner as Example 3, except that Compound $A_{29}L_0B_{52}$ was used instead of Compound $A_{30}L_0B_{52}$ in the ETL.

Example 7

Example 7 is fabricated in the same manner as Example 3, except that Compound $A_{29}L_0B_{53}$ was used instead of Compound $A_{30}L_0B_{52}$ in the ETL.

Comparative Example 3

Comparative Example 3 is fabricated in the same manner as Example 3, except that Compound ET2 was used instead of Compound $A_{30}L_0B_{52}$ in the ETL.

The detailed structure and thickness of the electron transporting layer are shown in the table below. In the layers in which more than one material was used, they were obtained by doping different compounds in the weight ratios described therein.

TABLE 5

Device Structure of Device Examples and Comparative Example

| Device ID | ETL |
|---|---|
| Example 3 | Compound $A_{30}L_0B_{52}$: Liq (40:60, 300 Å) |
| Example 4 | Compound $A_{30}L_2B_{51}$: Liq (40:60, 300 Å) |
| Example 5 | Compound $A_{30}L_0B_{53}$: Liq (40:60, 300 Å) |
| Example 6 | Compound $A_{29}L_0B_{52}$: Liq (40:60, 300 Å) |
| Example 7 | Compound $A_{29}L_0B_{53}$: Liq (40:60, 300 Å) |
| Comparative Example 3 | Compound ET2: Liq (40:60, 300 Å) |

The structure of the new materials used in the devices were as shown below:

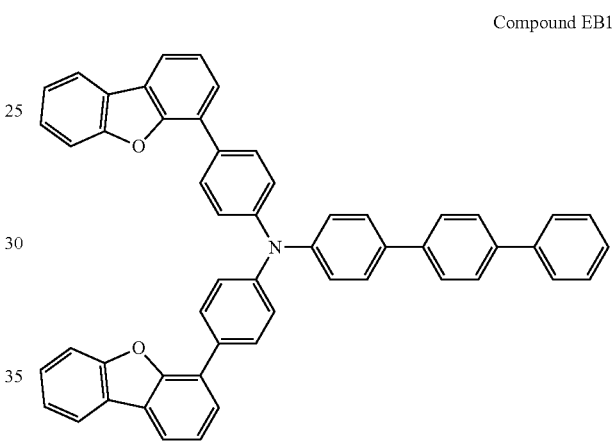

Compound EB1

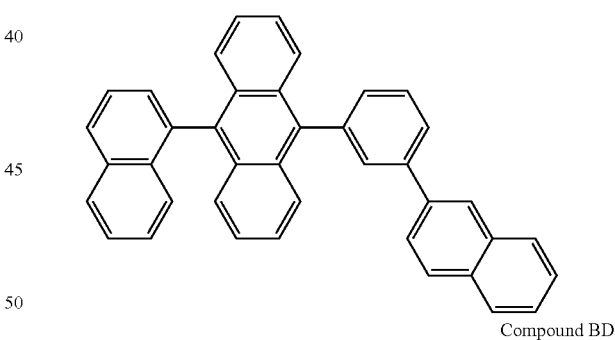

Compound BH

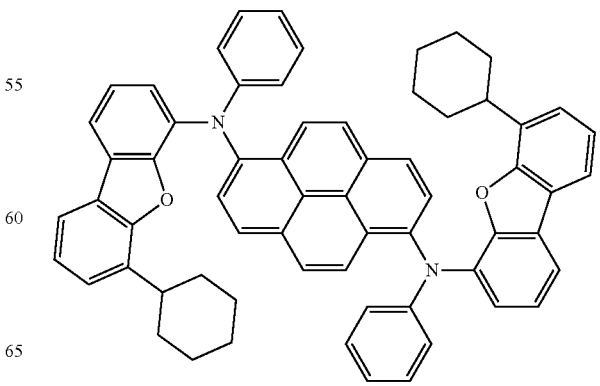

Compound BD

Compound HB1

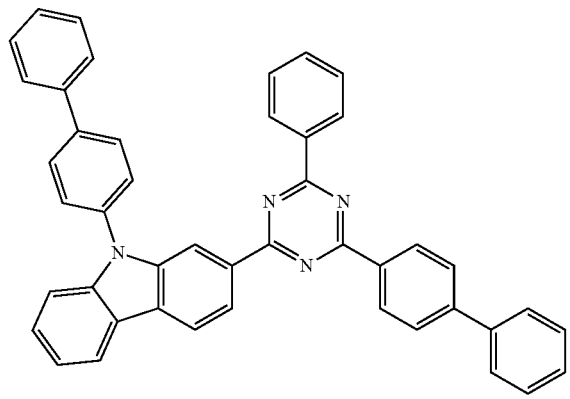

Compound A30L0B53

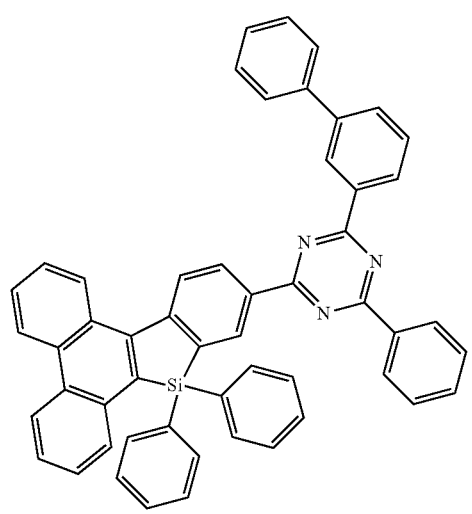

Compound A30L2B51

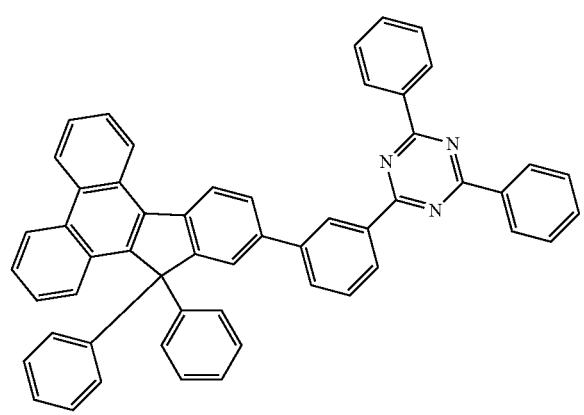

Compound A29L0B52

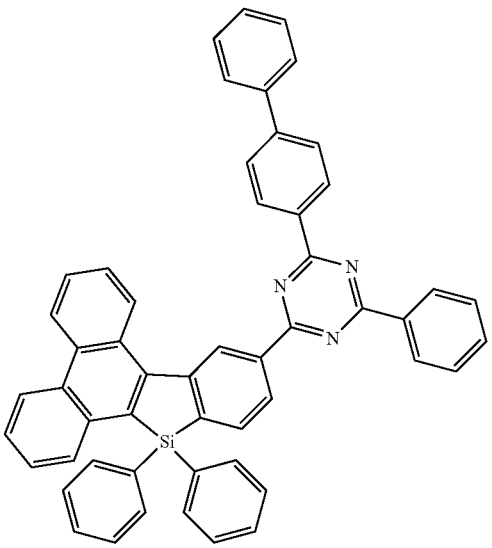

Compound A29L0B53

CIE coordinates, external quantum efficiency (EQE) under the brightness of 1000 cd/m², and the lifetime (LT95) under a current density of 15 mA/cm² of Example 3-7 and Comparative Example 3 were all recorded and shown in Table 6.

TABLE 6

| Device Data | | | |
|---|---|---|---|
| Device ID | CIE | EQE (%) | LT95 (h) |
| Example 3 | (0.139, 0.092) | 7.35 | 326 |
| Example 4 | (0.139, 0.092) | 7.77 | 219 |
| Example 5 | (0.139, 0.093) | 7.41 | 324 |
| Example 6 | (0.139, 0.092) | 7.77 | 286 |
| Example 7 | (0.139, 0.092) | 7.64 | 212 |
| Comparative Example 3 | (0.139, 0.085) | 6.68 | 186 |

Discussion:

From the table above, the differences of the device structure among the examples of the present disclosure and the comparative example lie in the differences between the electron transporting materials. The Compound ET2 used in the comparative example is a common electron transporting material in the industry. Obviously, both in efficiency and lifetime of Example 3-7 are better than Comparative Example 3. The efficiency can be improved by 10%-16%, and there is a 14%-75% improvement in lifetime. The efficiency and lifetime of blue light in OLED display screen is the weakest link, therefore it is very important to achieve an improvement in the performance of the material of the present disclosure.

It is understood that the various embodiments described herein are by way of example only, and are not intended to limit the scope of the disclosure. The present disclosure as claimed may therefore include variations from the particular examples and preferred embodiments described herein, as will be apparent to one of skill in the art. Many of the materials and structures described herein may be substituted with other materials and structures without deviating from the spirit of the present disclosure. It is understood that various theories as to why the disclosure works are not intended to be limiting.

What is claimed is:

1. A compound having Formula 1:

    Formula 1 wherein n is 1, 2, 3 or 4; when n is greater than or equal to 2, each group of L and B can be the same or different;

wherein L is a single bond, or a substituted or unsubstituted arylene group having 6 to 60 carbon atoms, or a substituted or unsubstituted heteroarylene group having 2 to 60 carbon atoms;

wherein B is a substituted or unsubstituted electron-deficient heteroaryl group having 2 to 60 carbon atoms; and wherein A is selected from the group consisting of Formula 6:

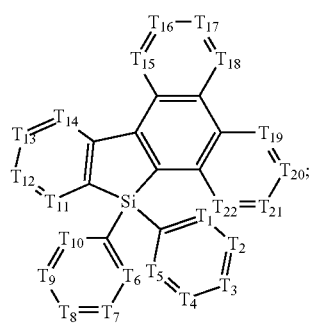    Formula 6 wherein $T_1$ to $T_{14}$ are each independently selected from $CR_T$ and N, $T_{15}$ to $T_{22}$ are each independently selected from $CR_T$, C or N, and one of $T_{15}$ to $T_{22}$ is selected from C and joined to L;

wherein each of the $R_T$ is independently selected from the group consisting of: hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

adjacent substituents can be optionally joined to form a ring.

2. The compound of claim 1, wherein the structure of L is selected from the group consisting of a single bond and the Formula 34 to Formula 58:

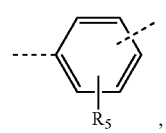    Formula 34

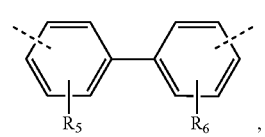    Formula 35

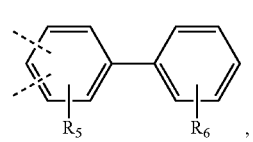    Formula 36

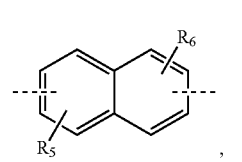    Formula 37

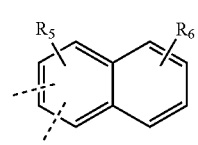    Formula 38

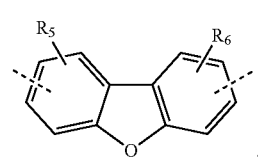    Formula 39

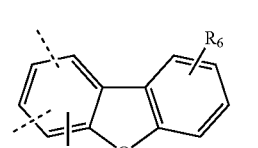    Formula 40

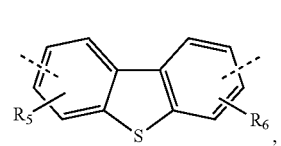    Formula 41

-continued
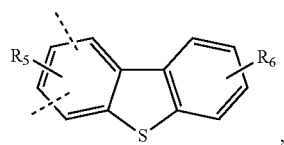
Formula 42
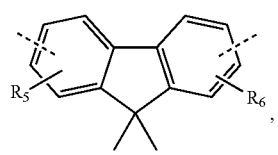
Formula 43
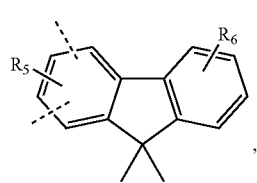
Formula 44
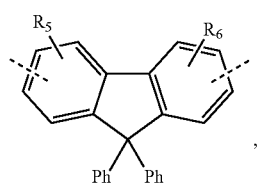
Formula 45
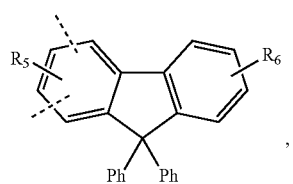
Formula 46
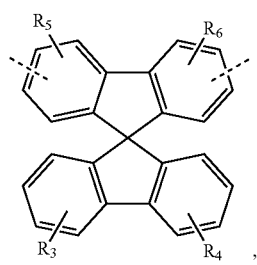
Formula 47
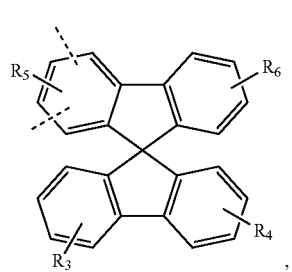
Formula 48
-continued
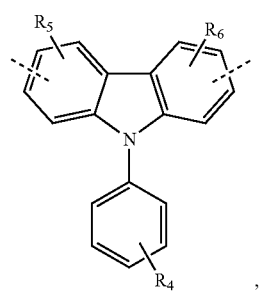
Formula 49
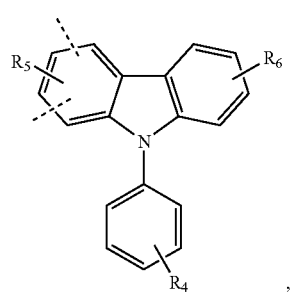
Formula 50
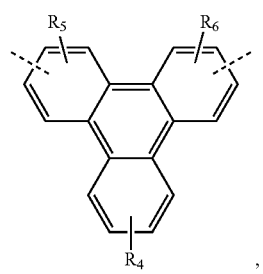
Formula 51
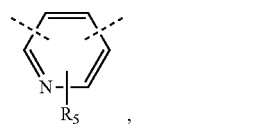
Formula 52
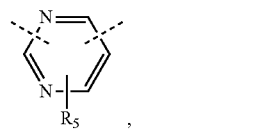
Formula 53
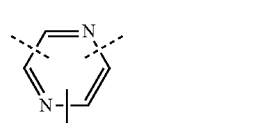
Formula 54
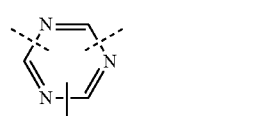
Formula 55
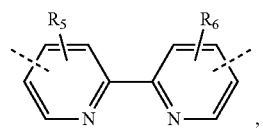
Formula 56

-continued

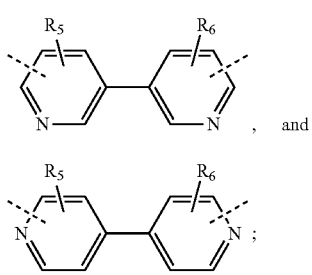

Formula 57 and

Formula 58 wherein $R_3$, $R_4$, $R_5$ and $R_6$ each independently represent a mono-substitution, multiple substitutions or no substitution; when they represent multiple substitutions, adjacent substituents can be optionally joined to form a ring;

wherein $R_3$, $R_4$, $R_5$ and $R_6$ are each independently selected from the group consisting of: hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

3. The compound of claim 1, wherein B is selected from the group consisting of Formula 59 to Formula 63:

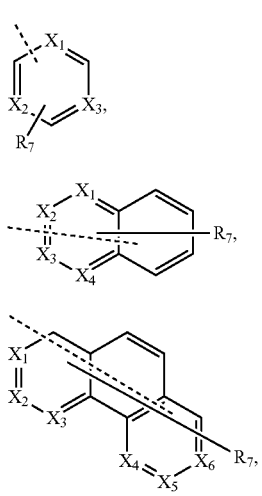

Formula 59

Formula 60

Formula 61

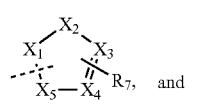

Formula 62

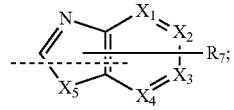

Formula 63 wherein $X_1$ to $X_6$ are each independently selected from $CR_x$, C, O, S, N or $NR_x'$;

wherein at least one of $X_1$ to $X_i$ is N, or wherein at least two of $X_1$ to $X_i$ are N, or at least three of $X_1$ to $X_i$ are N; wherein $X_i$ represents one with the largest sequence number among $X_1$ to $X_6$ existing in Formula 59 to Formula 63;

wherein $R_7$ each independently represents a mono-substitution, multiple substitutions or no substitution; when they represent multiple substitutions, adjacent substituents can be optionally joined to form a ring;

wherein $R_7$, $R_x$, and $R_x'$ are each independently selected from the group consisting of:

hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

4. The compound of claim 1, wherein B is independently selected from the group consisting of B1 to B105:

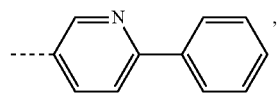

B1

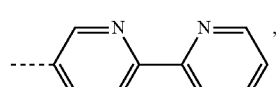

B2

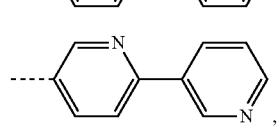

B3

-continued
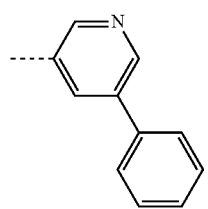
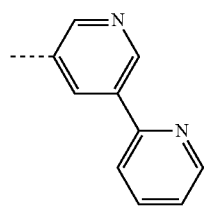
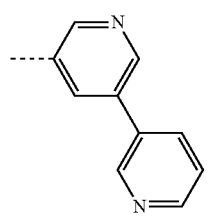
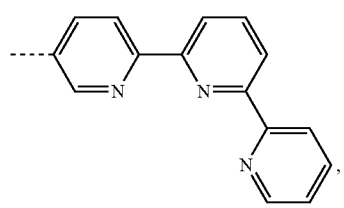
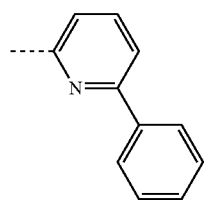
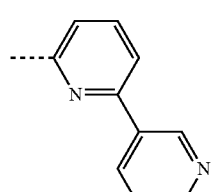
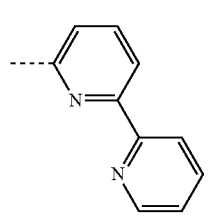
-continued
B4
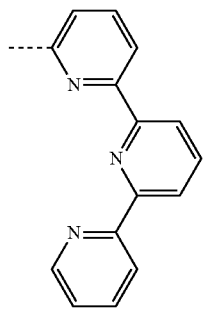
B5
B6
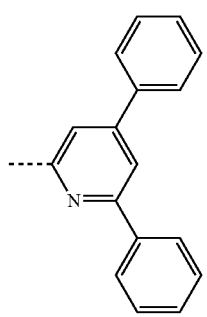
B7
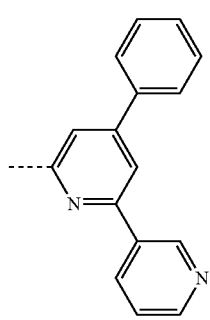
B8
B9
B10
B11
B12
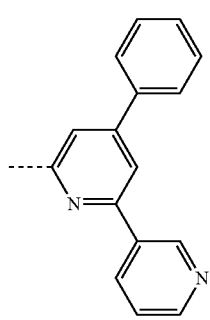
B13
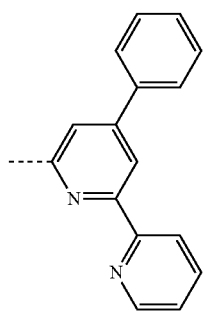
B14
B15
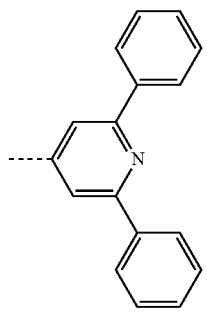

B16 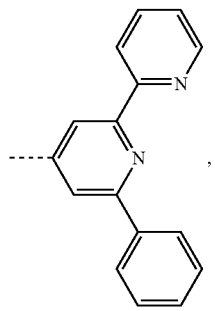,
B17 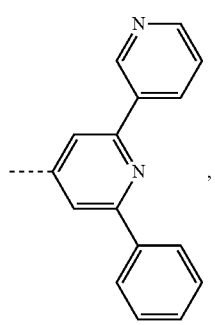,
B18 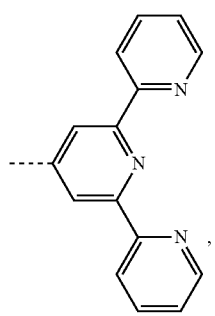,
B19 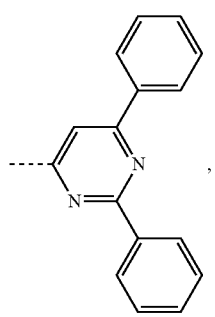,
B20 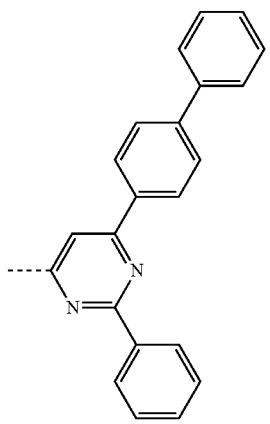,
B21 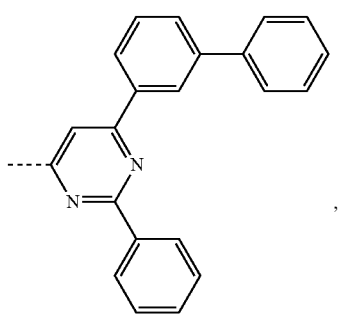,
B22 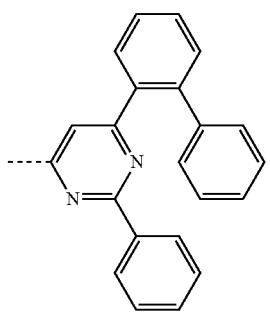,
B23 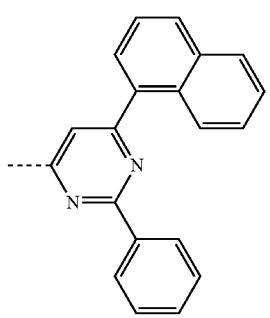, B24
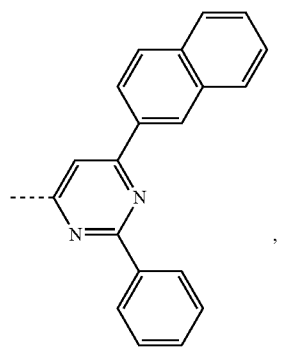
B25
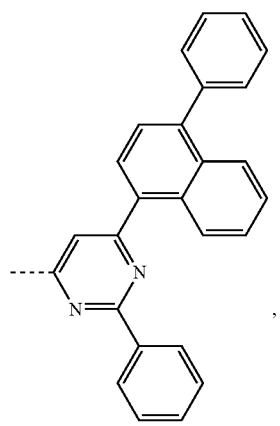
B26
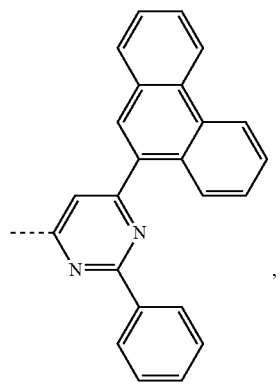
B27
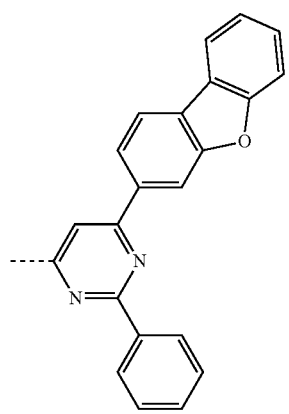
B28
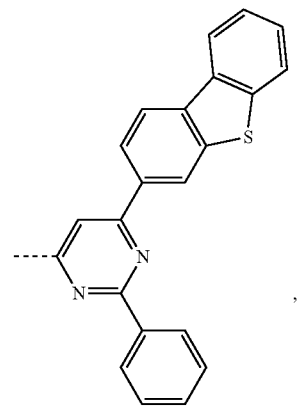
B29
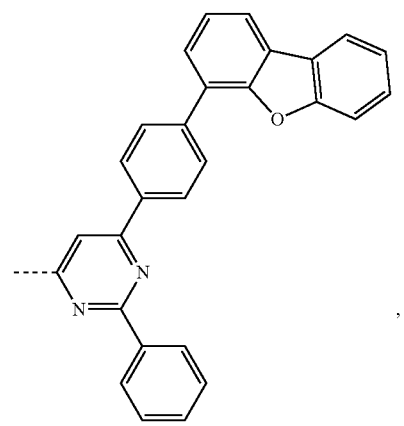
B30
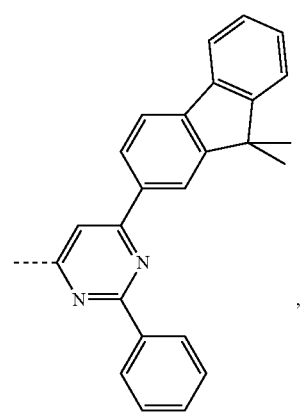
B31
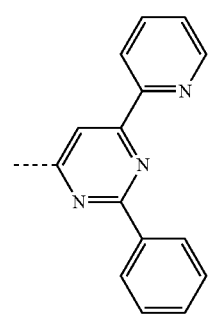

B32 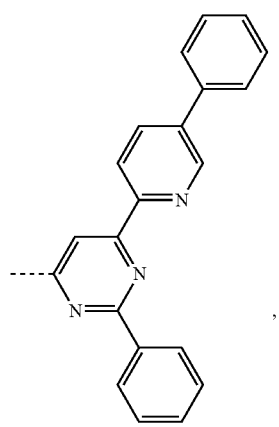
B33 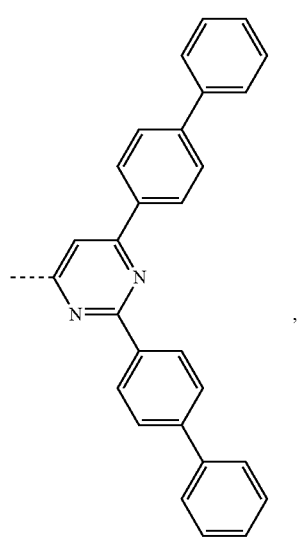
B34 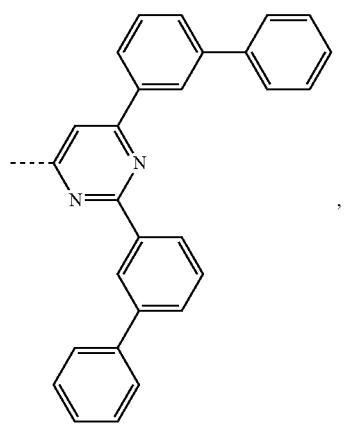
B35 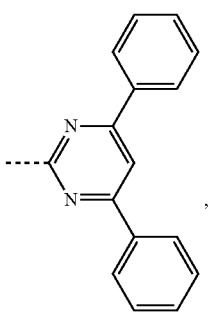
B36 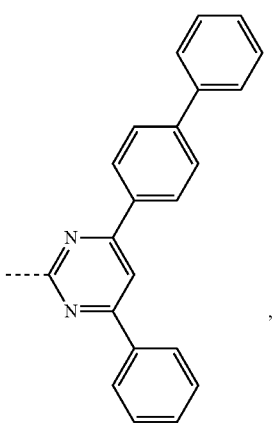
B37 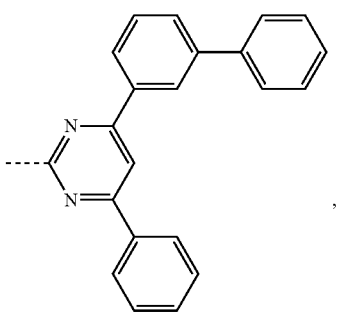
B38 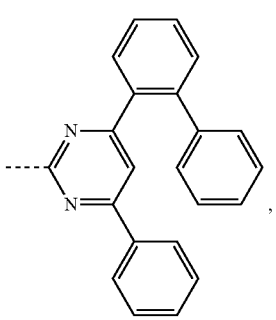

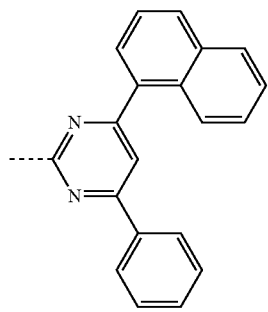
B39
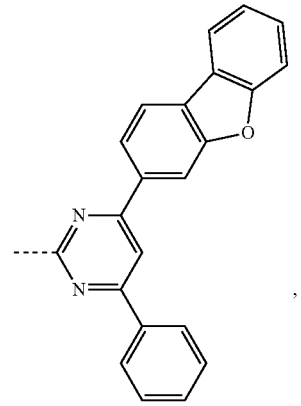
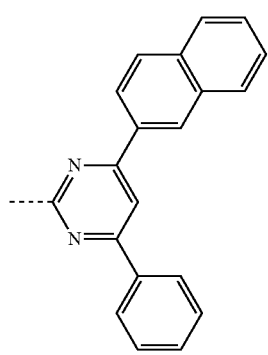
B40
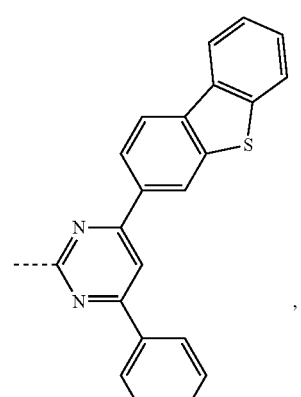
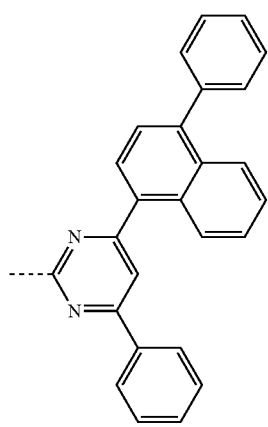
B41
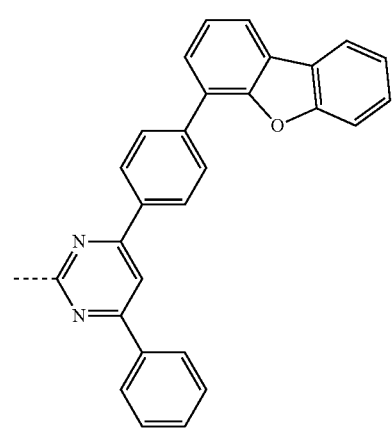
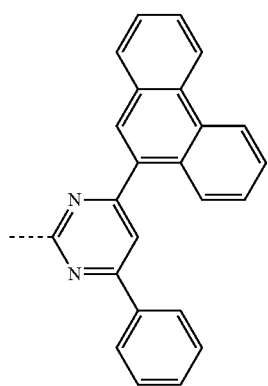
B42
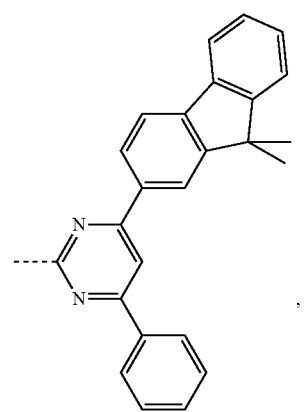
B43
B44
B45
B46

B47
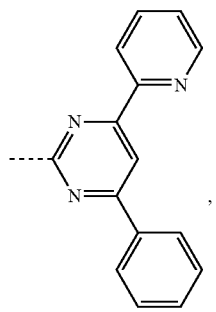
B48
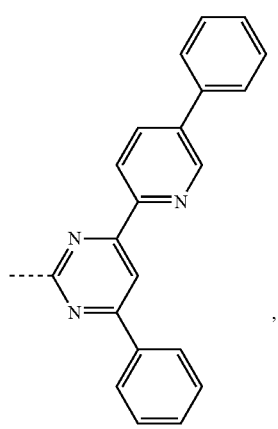
B49
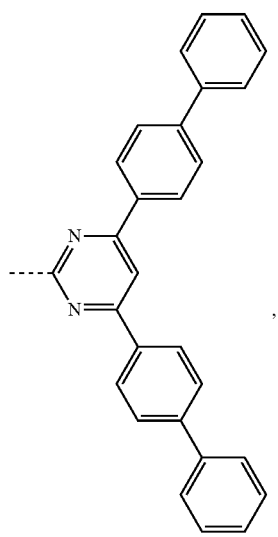
B50
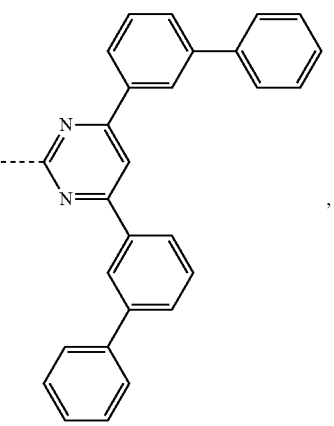
B51
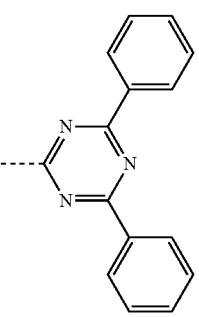
B52
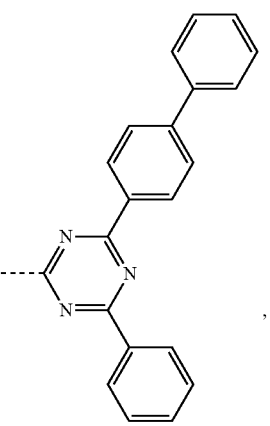
B53
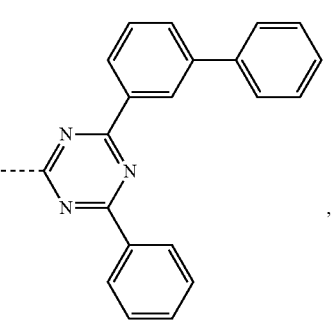

B54 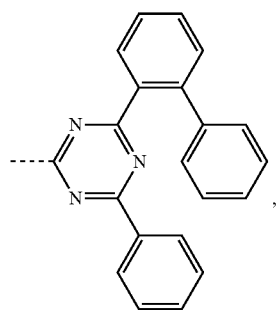
B55 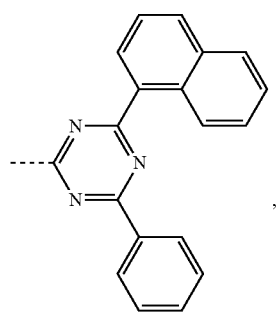
B56 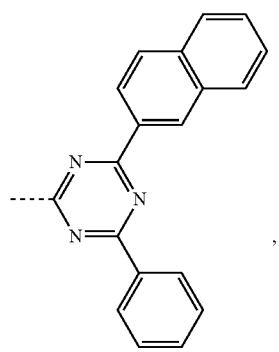
B57 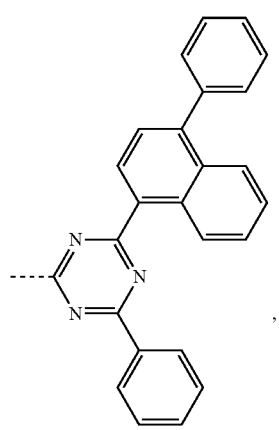
B58 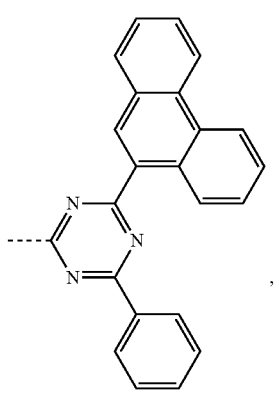
B59 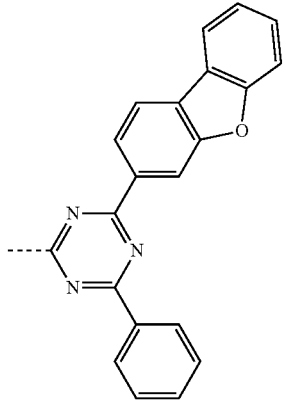
B60 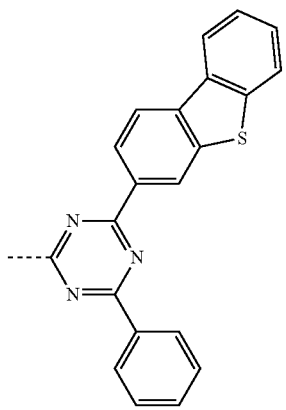
B61 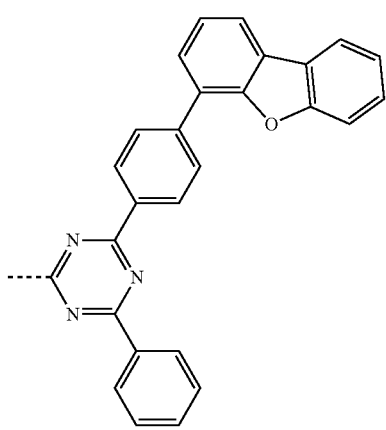

-continued
B62
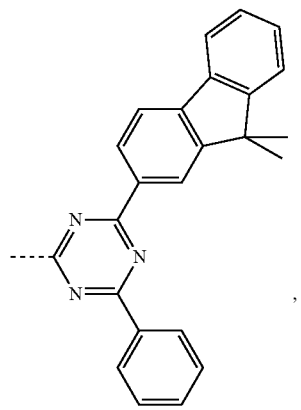
B63
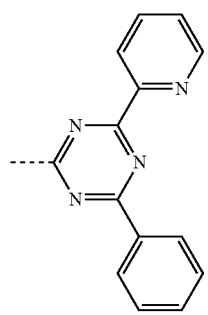
B64
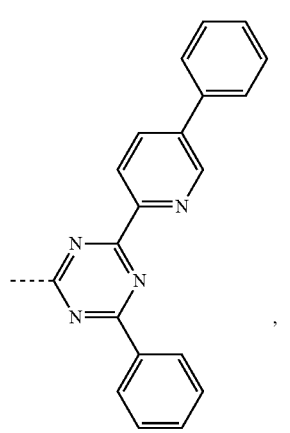
-continued
B65
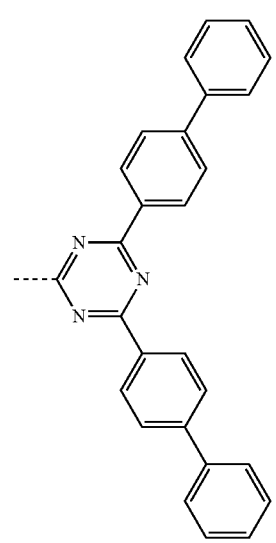
B66
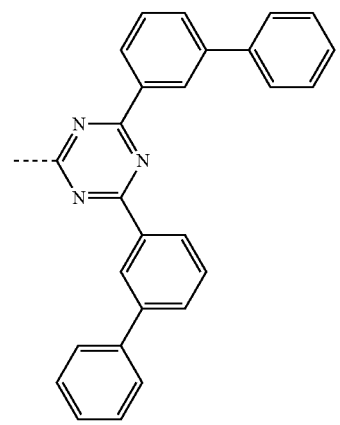
B67
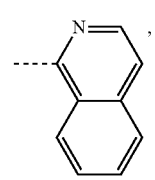
B68
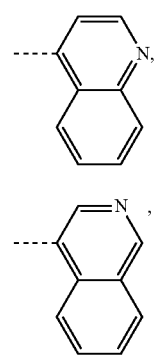
B69
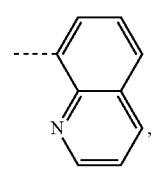
B70

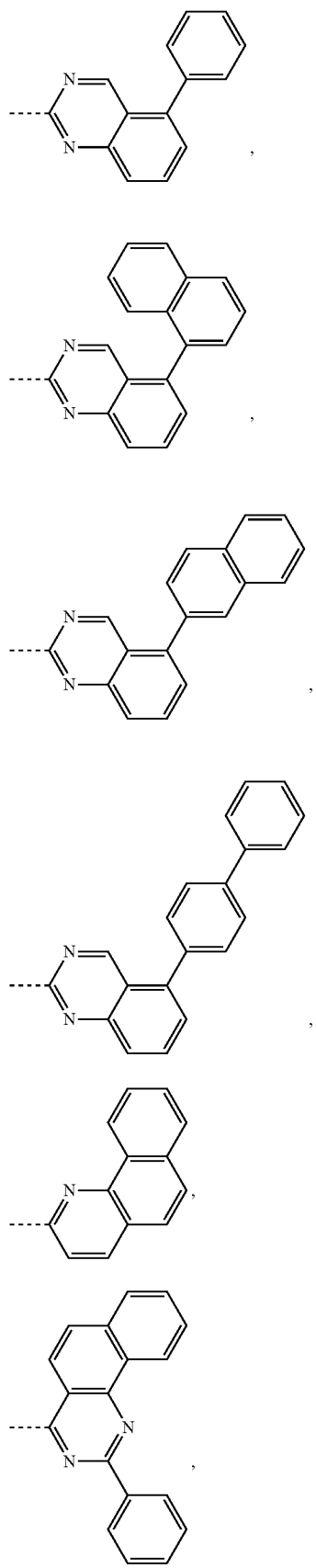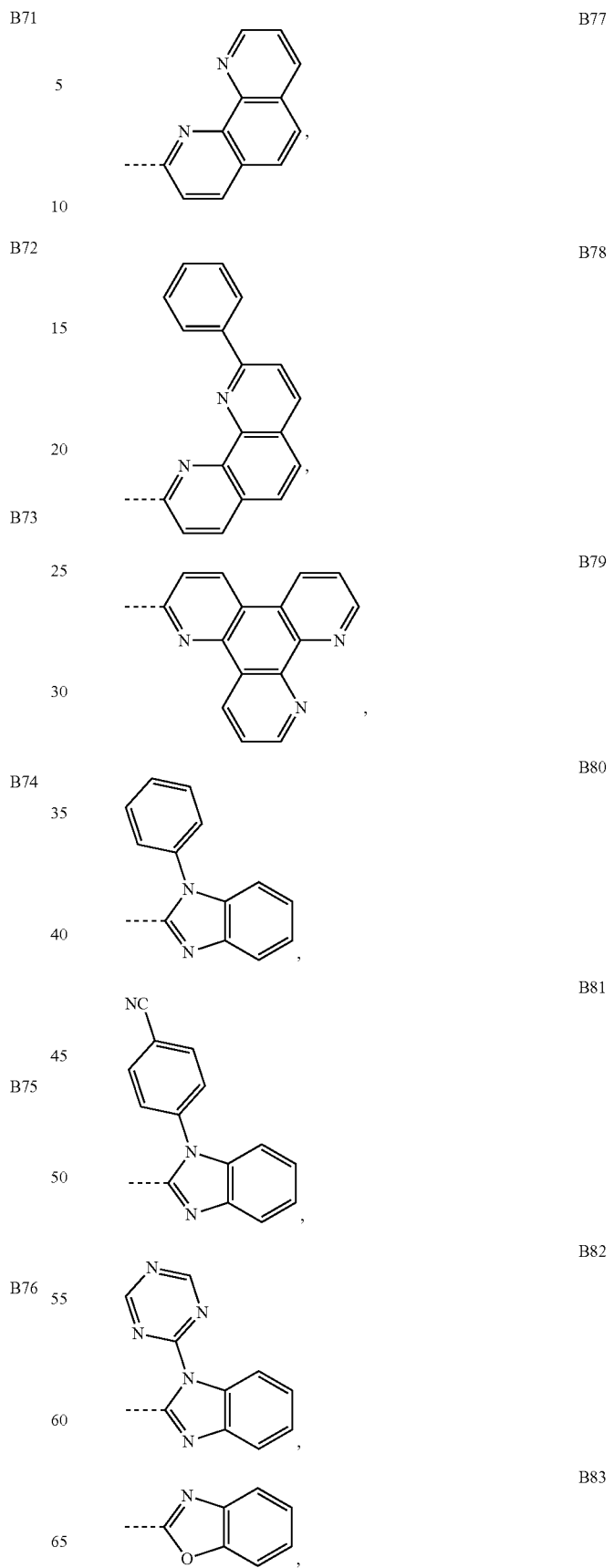

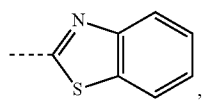
B84
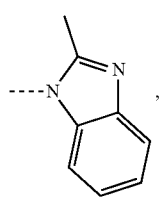
B85
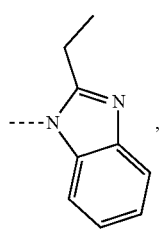
B86
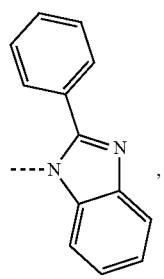
B87
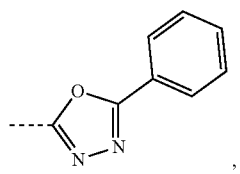
B88
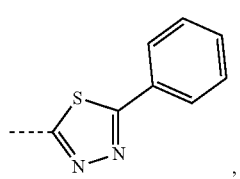
B89
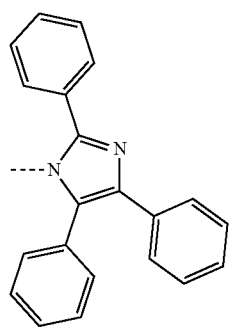
B90
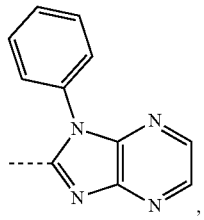
B91
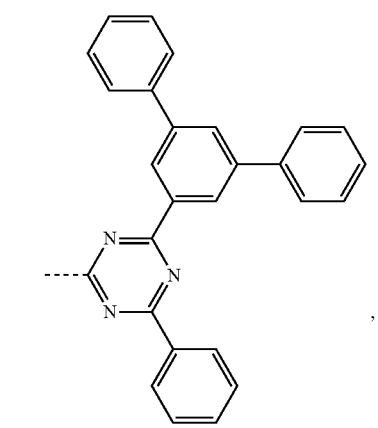
B92
B93
B94

-continued
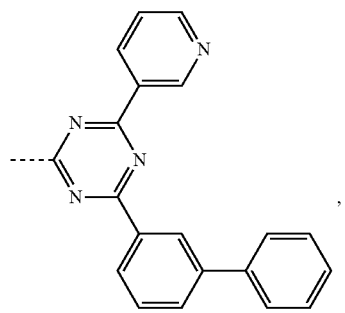
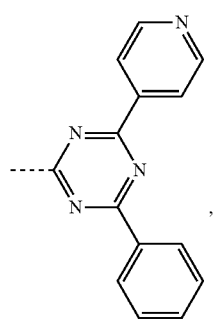
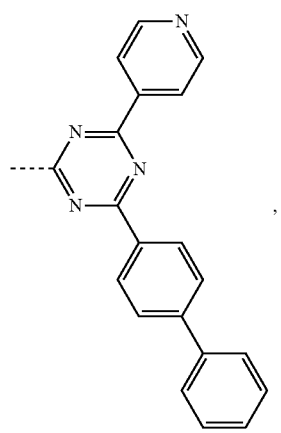
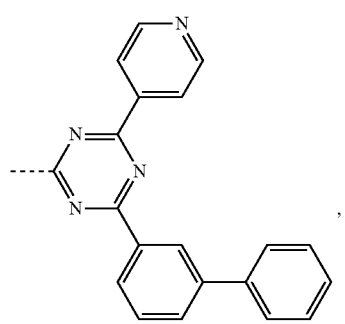
B95
B96
B97
B98
-continued
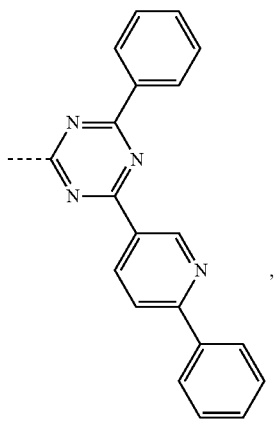
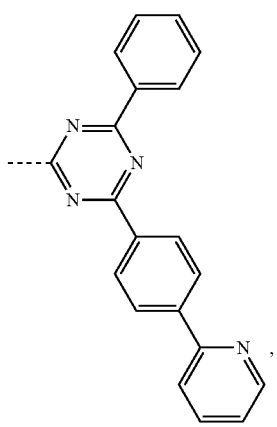
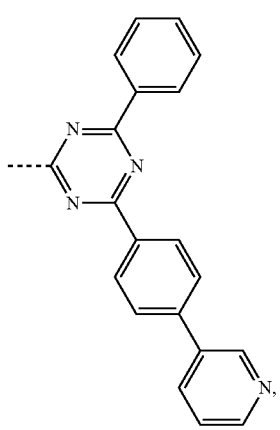
B99
B100
B101

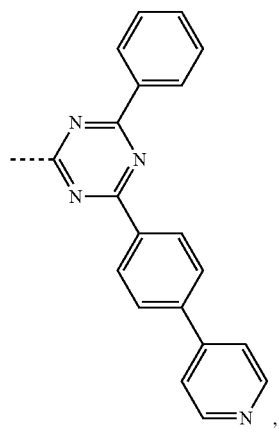
B102
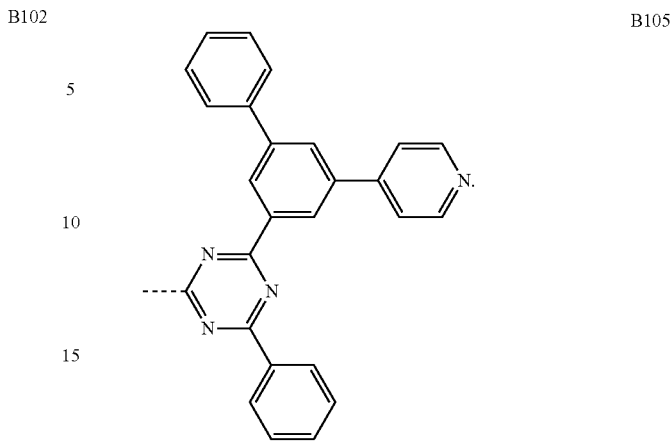
B105
5. The compound of claim 1, wherein A is independently selected from the group consisting of A25 to A28, A257 to A272, and A289 to A292:
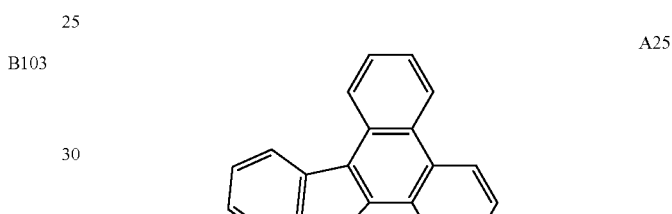
A25
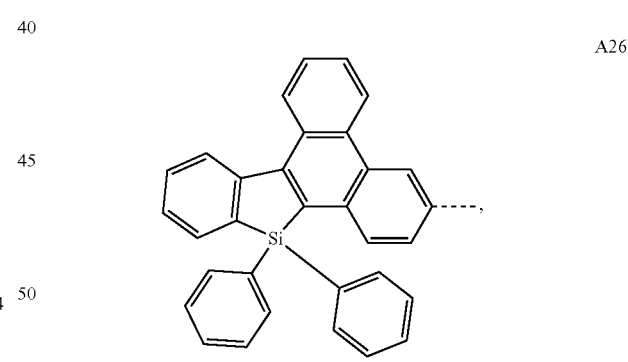
A26
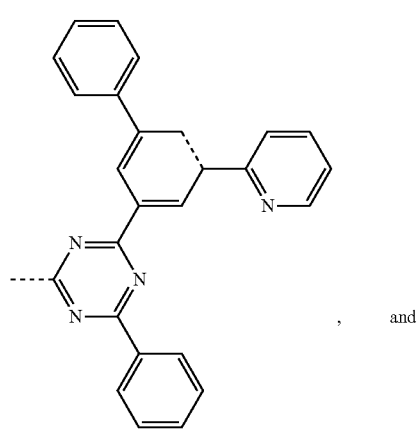
B103
, and
B104
A27

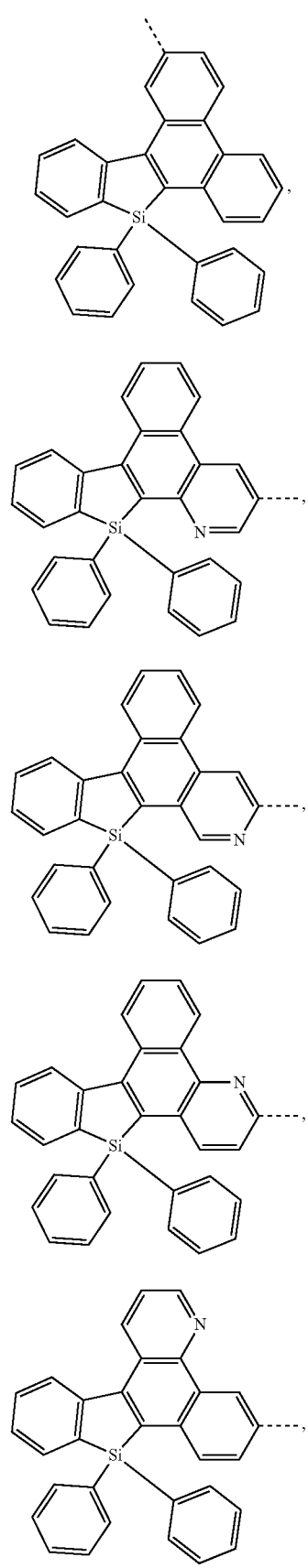
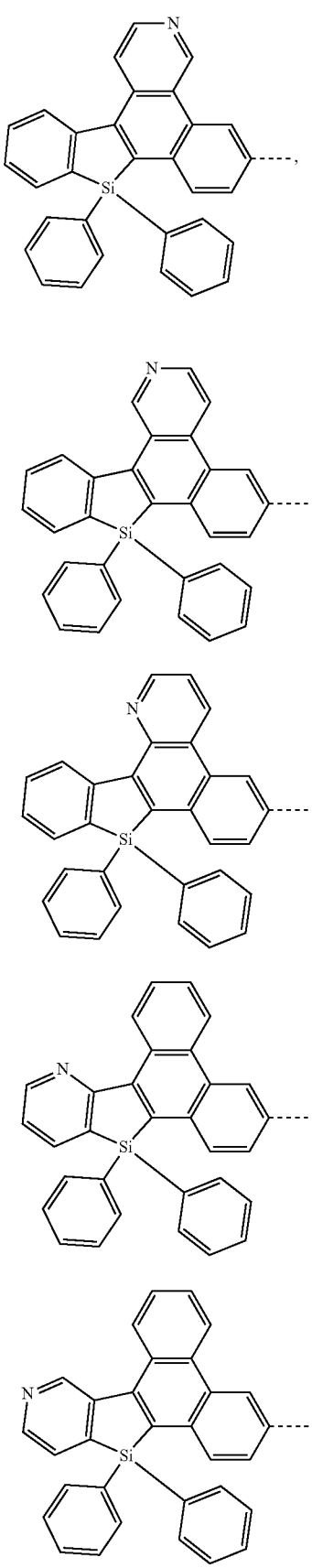

A266 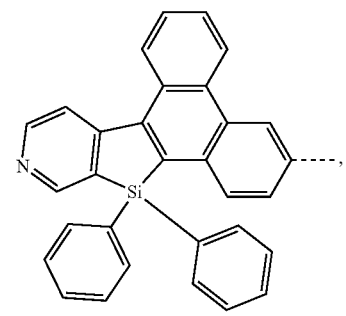
A267 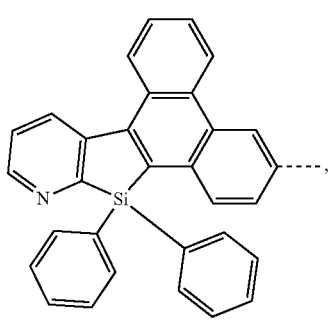
A268 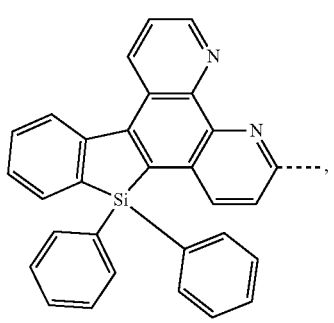
A269 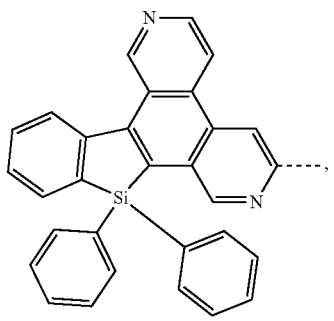
A270 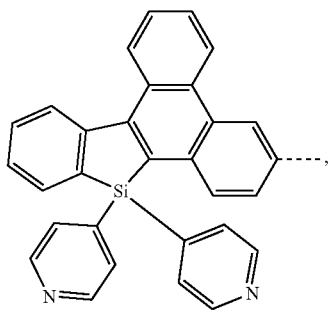
A271 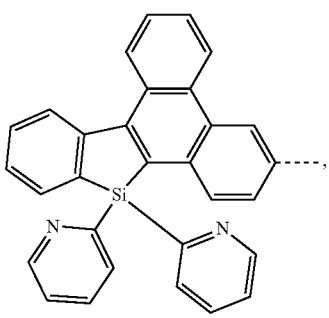
A272 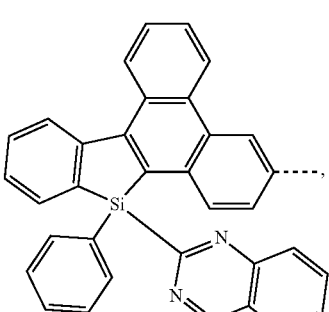
A289 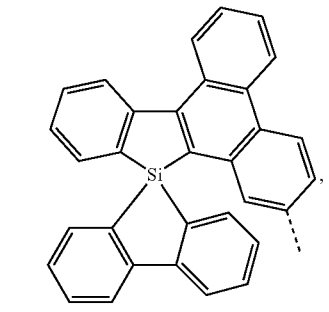
A290 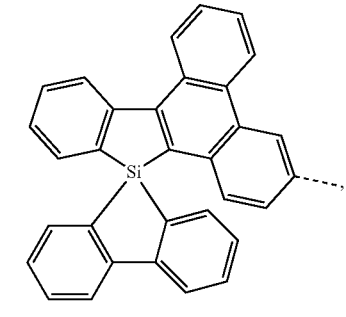
A291 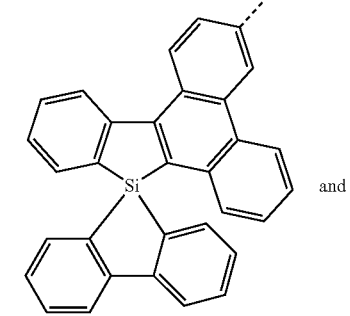 and A292
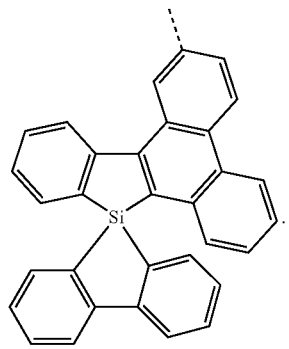
6. The compound of claim 4, wherein A is independently selected from the group consisting of A25 to A28, A257 to A272, and A289 to A292:
A25
A26
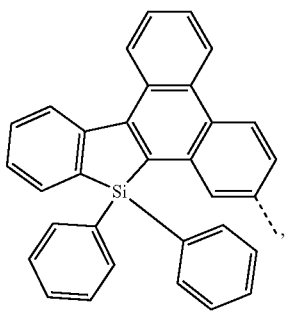
A27
A28
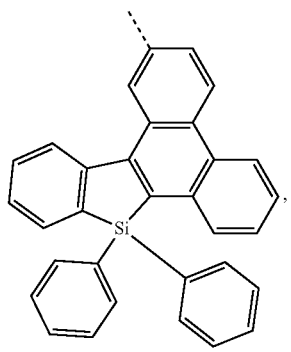
A257
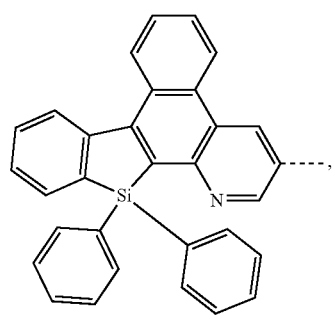
A258
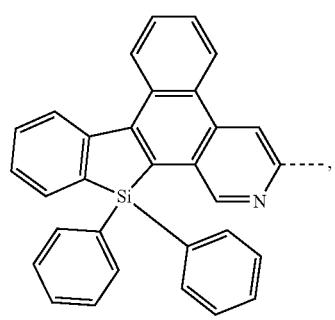
A259
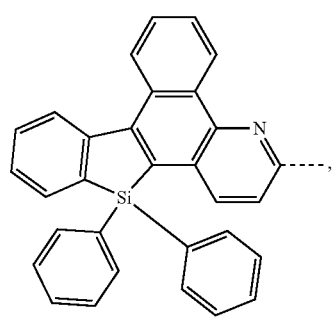
A260
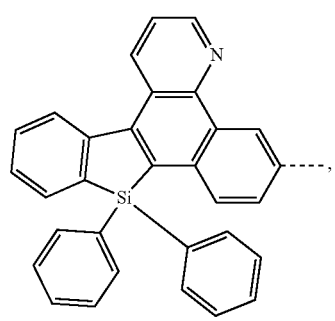

-continued
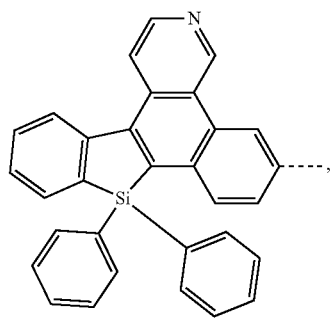 A261
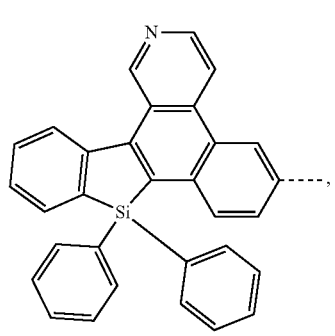 A262
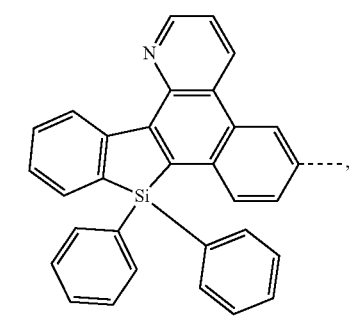 A263
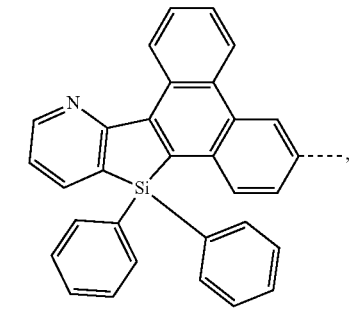 A264
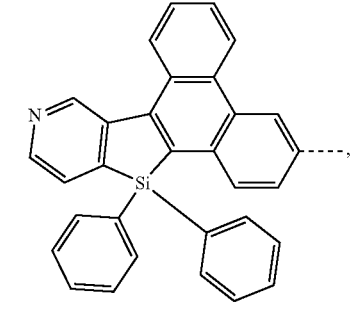 A265
-continued
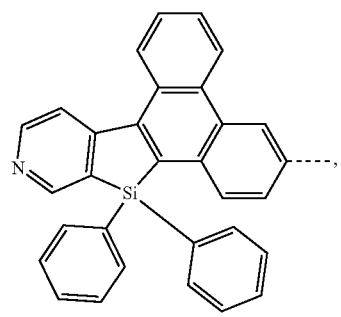 A266
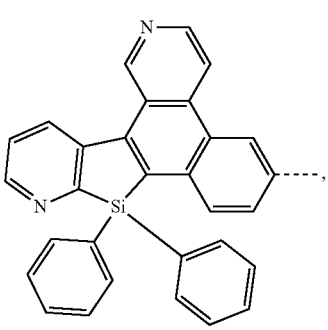 A267
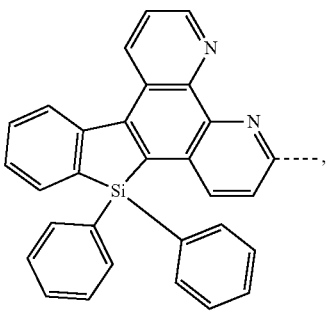 A268
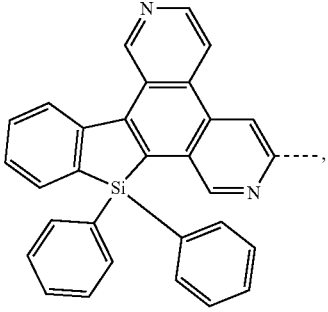 A269
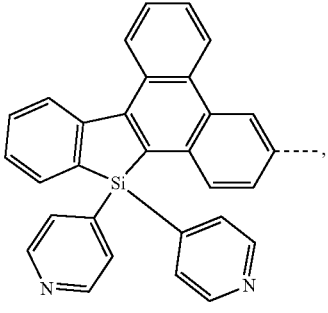 A270

-continued
A271
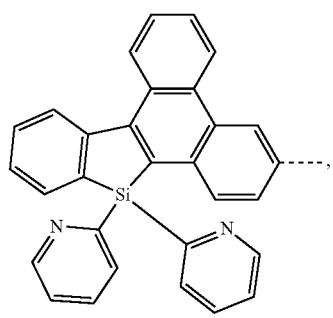
A272
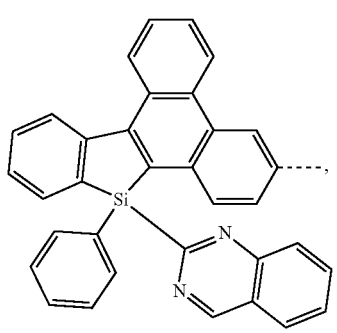
A289
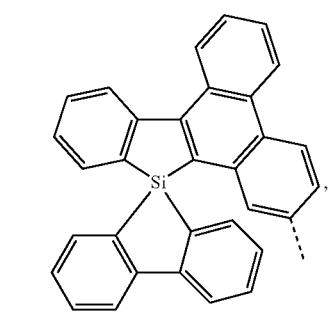
A290
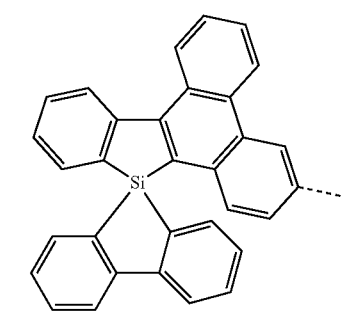
A291
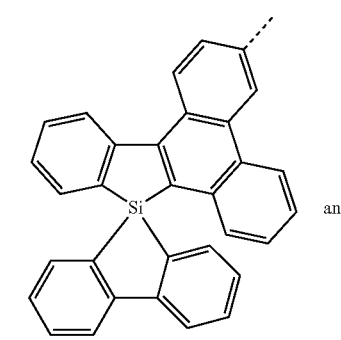 and
-continued
A292
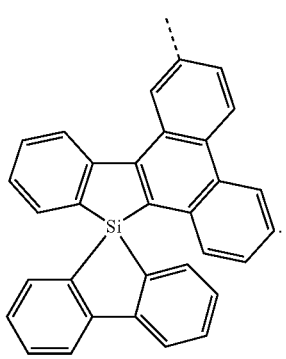
7. The compound of claim 1, wherein L is independently selected from the group consisting of a single bond L0 and L1 to L58:
 L1
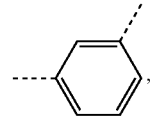 L2
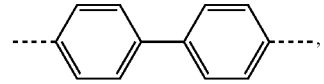 L3
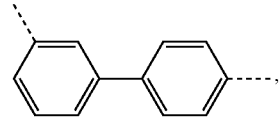 L4
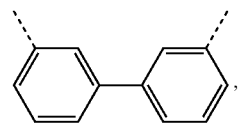 L5
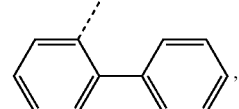 L6
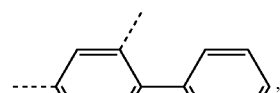 L7
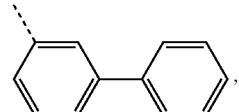 L8

-continued
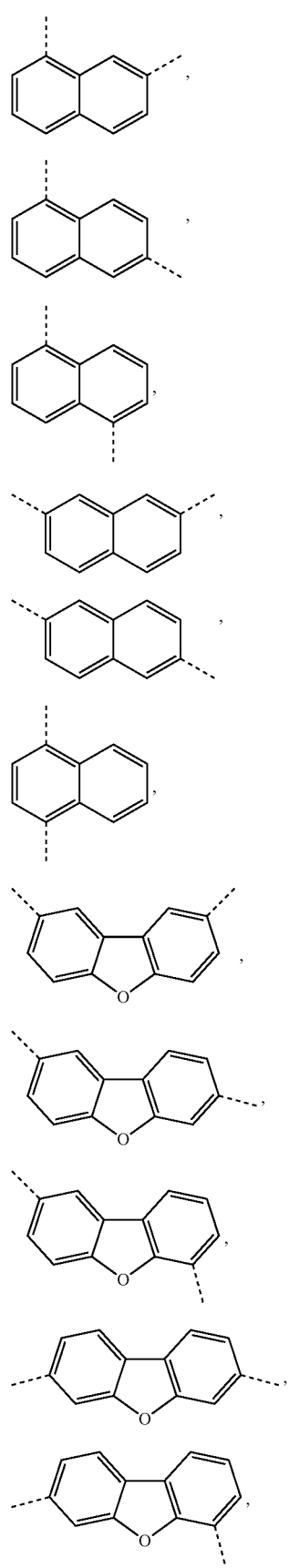
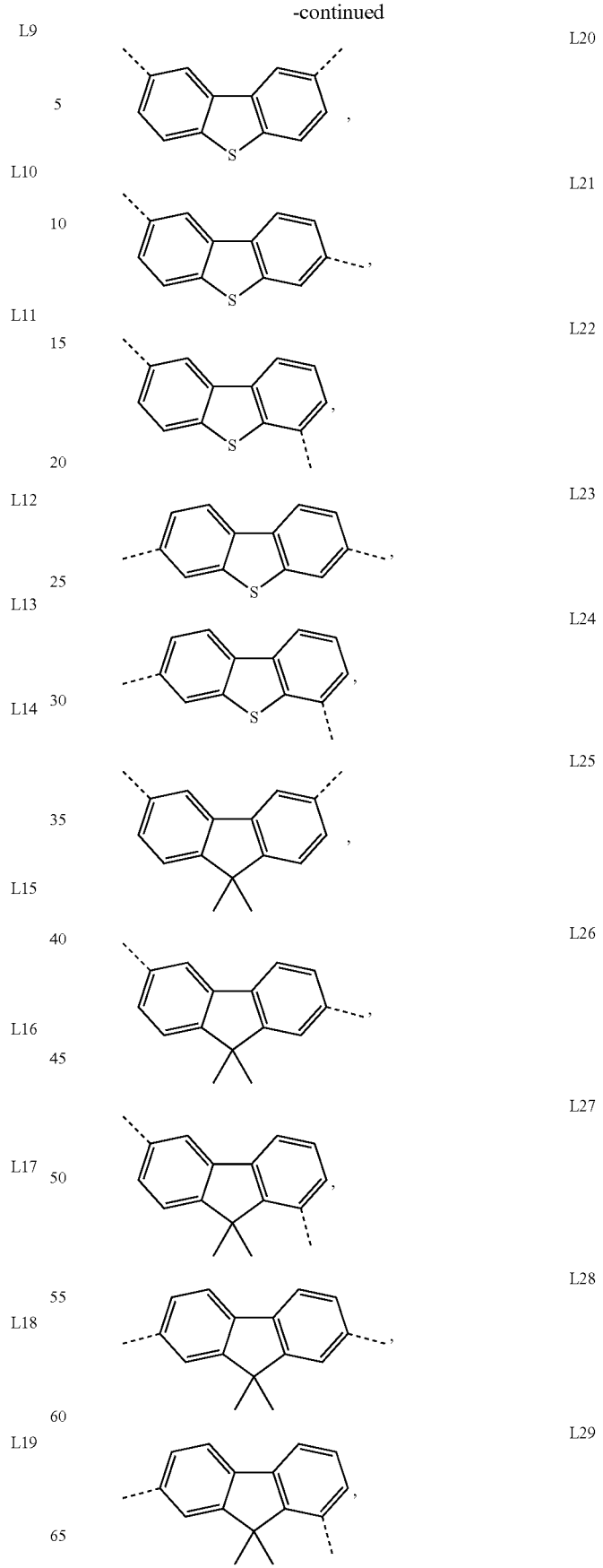

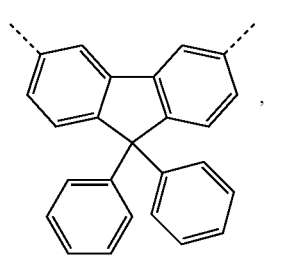
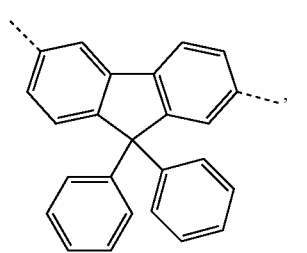
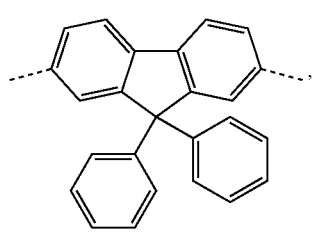
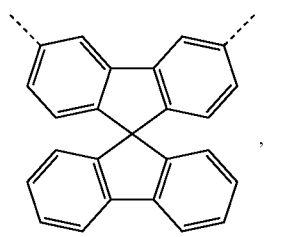
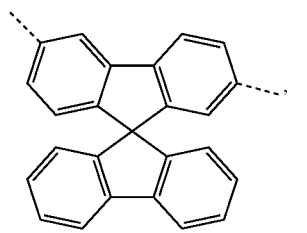
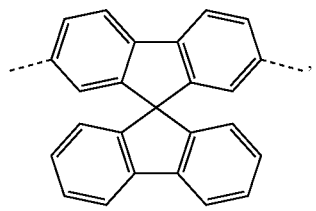
L30 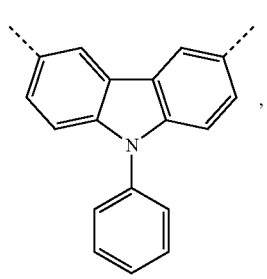
L31 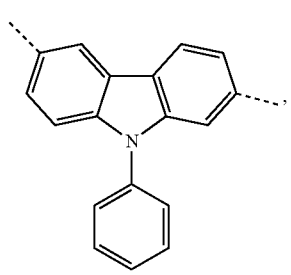
L32 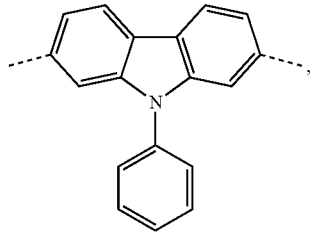
L33 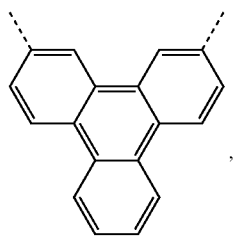
L34 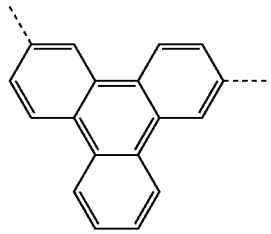
L35 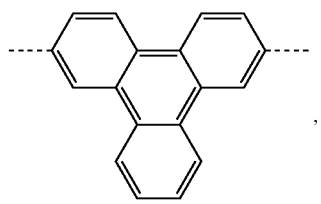
L36
L37
L38
L39
L40
L41
L42 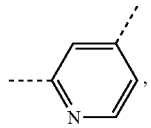

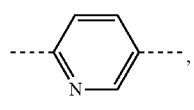
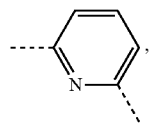
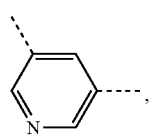
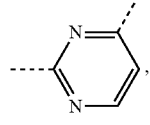
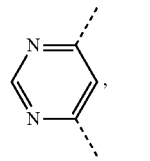
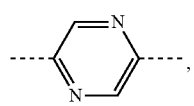
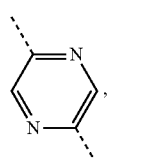
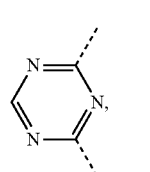
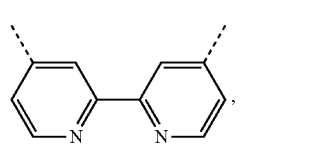
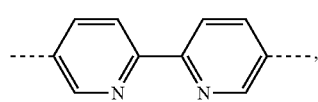
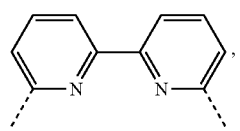
L43
L44
L45
L46
L47
L48
L49
L50
L51
L52
L53
L54
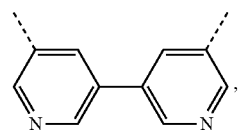 L55
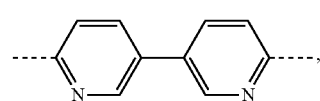 L56
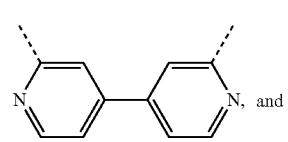 N, and L57
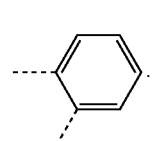 L58
8. The compound of claim 6, wherein L is independently selected from the group consisting of a single bond L0 and L1 to L58:
 L1
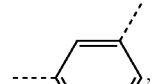 L2
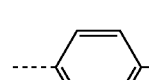 L3
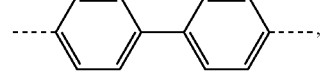 L4
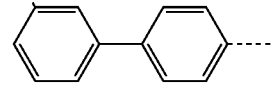 L5
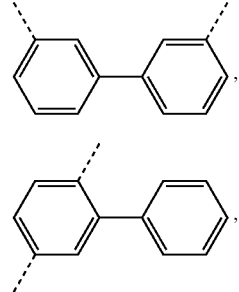 L6
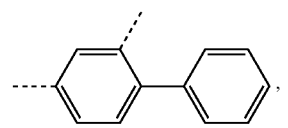 L7

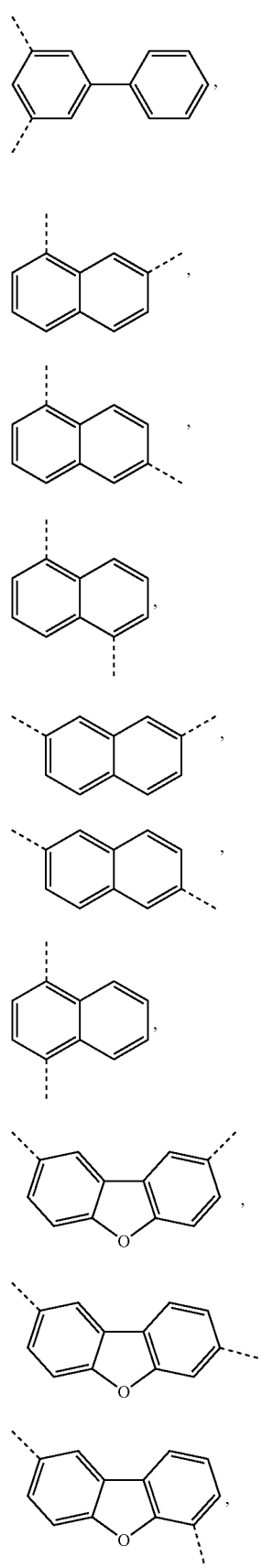
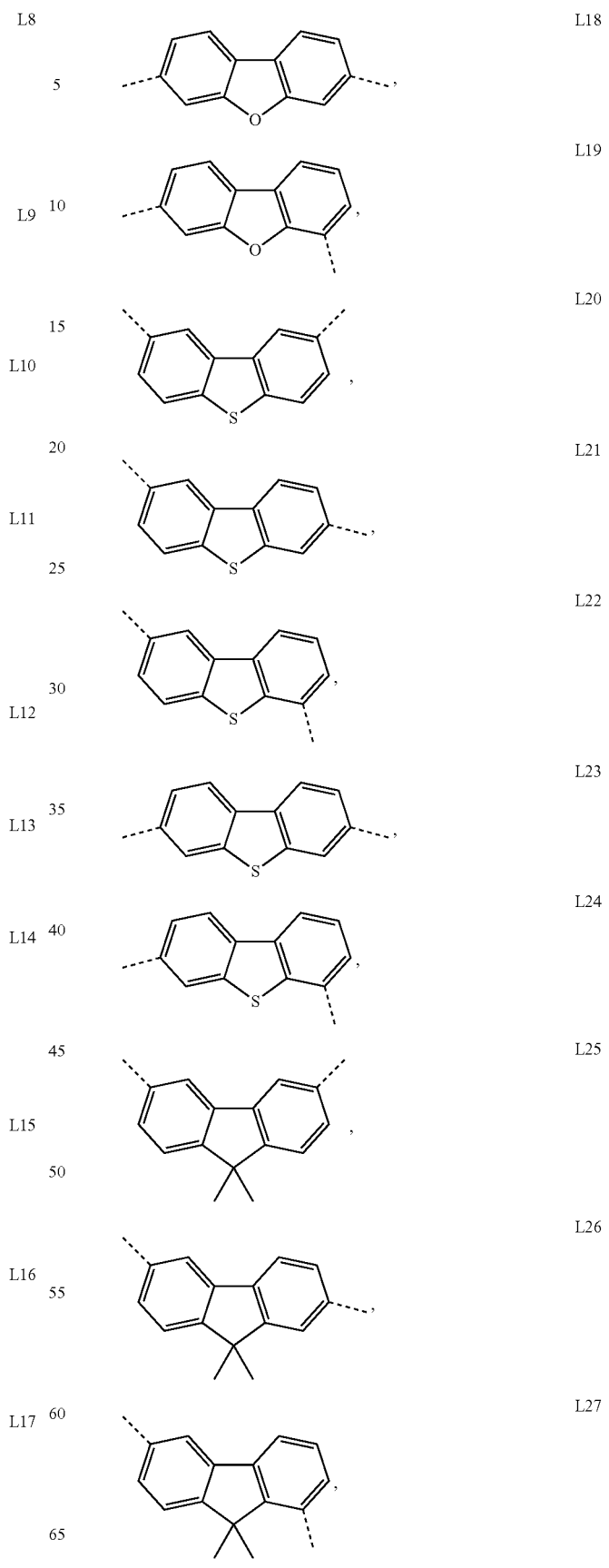

-continued
L28 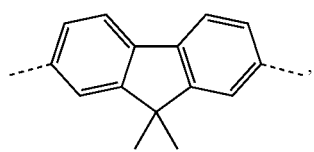
L29 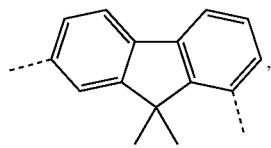
L30 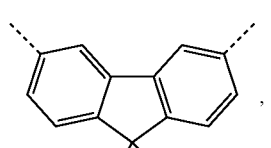
L31 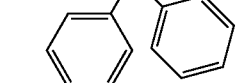
L32 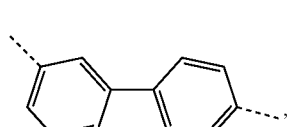
L33 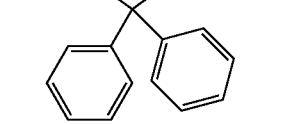
L34 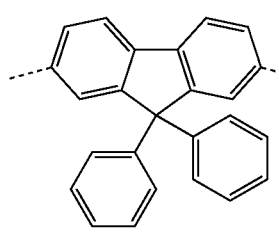
-continued
L35 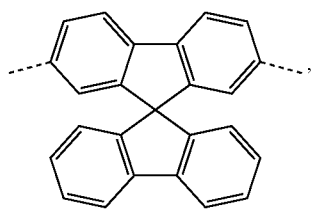
L36 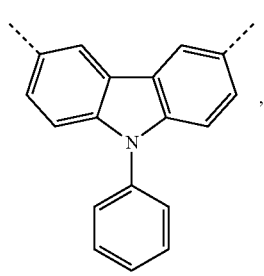
L37 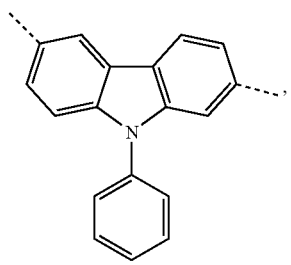
L38 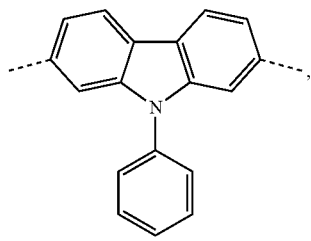
L39 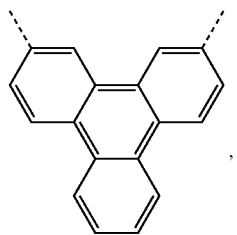
L40 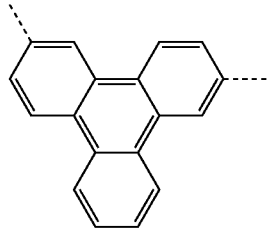

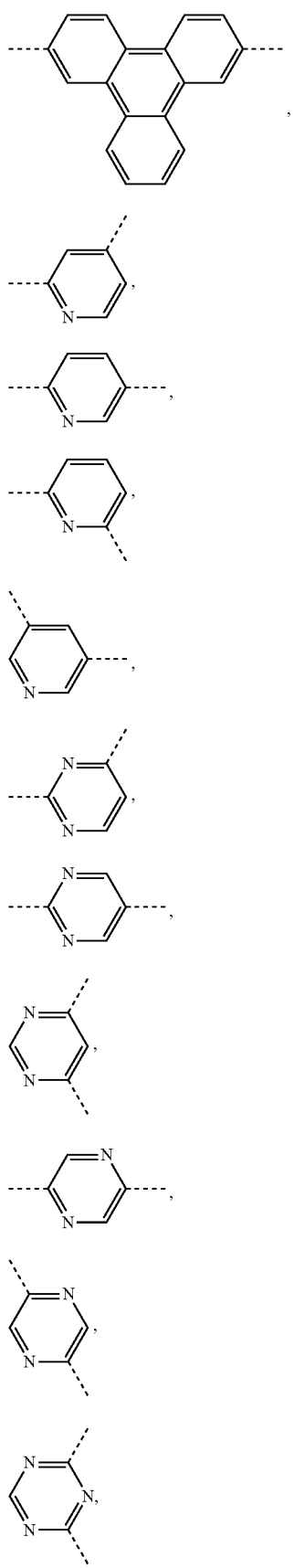
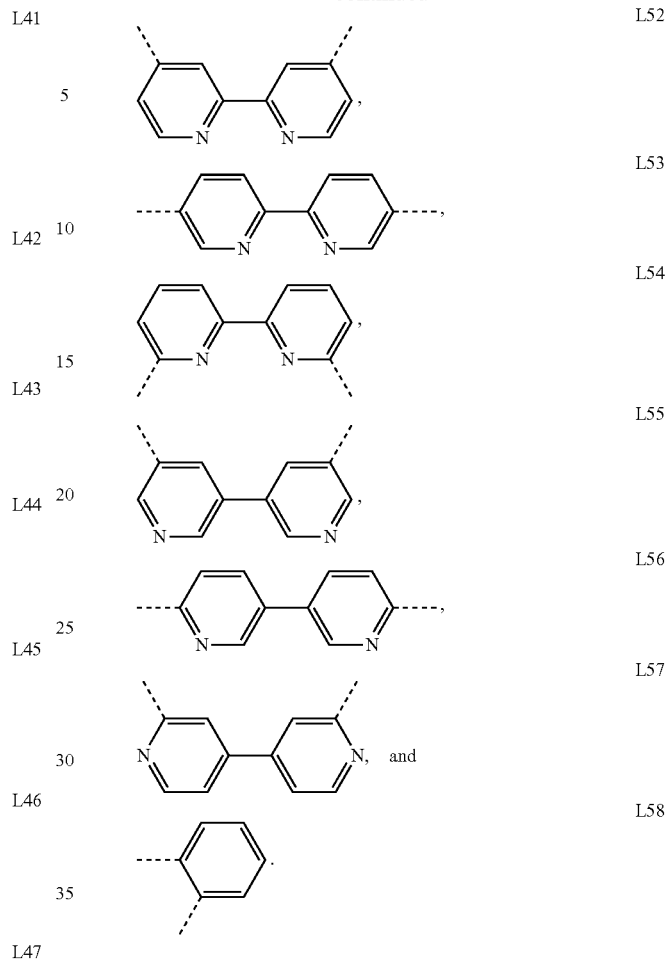
9. The compound of claim 8, wherein the compound has a structure represented by Formula 1, wherein A, L, B, n are independently correspond to the substituents and numbers shown in the table below:
| Compound No. | A | L | B | n |
|---|---|---|---|---|
| 1 | A26 | L0 | B18 | 1 |
| 2 | A26 | L0 | B19 | 1 |
| 3 | A26 | L0 | B20 | 1 |
| 4 | A26 | L0 | B21 | 1 |
| 5 | A26 | L0 | B22 | 1 |
| 6 | A26 | L0 | B23 | 1 |
| 7 | A26 | L0 | B24 | 1 |
| 8 | A26 | L0 | B27 | 1 |
| 9 | A26 | L0 | B28 | 1 |
| 10 | A26 | L0 | B29 | 1 |
| 11 | A26 | L0 | B30 | 1 |
| 12 | A26 | L0 | B31 | 1 |
| 13 | A26 | L0 | B32 | 1 |
| 14 | A26 | L0 | B33 | 1 |
| 15 | A26 | L0 | B34 | 1 |
| 16 | A26 | L0 | B51 | 1 |
| 17 | A26 | L0 | B52 | 1 |
| 18 | A26 | L0 | B53 | 1 |
| 19 | A26 | L0 | B54 | 1 |
| 20 | A26 | L0 | B55 | 1 |
| 21 | A26 | L0 | B56 | 1 |
| 22 | A26 | L0 | B59 | 1 |
| 23 | A26 | L0 | B60 | 1 |
| 24 | A26 | L0 | B61 | 1 |
| 25 | A26 | L0 | B62 | 1 |

| Compound No. | A | L | B | n |
|---|---|---|---|---|
| 26 | A26 | L0 | B63 | 1 |
| 27 | A26 | L0 | B64 | 1 |
| 28 | A26 | L0 | B65 | 1 |
| 29 | A26 | L0 | B66 | 1 |
| 30 | A26 | L0 | B92 | 1 |
| 31 | A26 | L1 | B18 | 1 |
| 32 | A26 | L1 | B19 | 1 |
| 33 | A26 | L1 | B20 | 1 |
| 34 | A26 | L1 | B21 | 1 |
| 35 | A26 | L1 | B22 | 1 |
| 36 | A26 | L1 | B23 | 1 |
| 37 | A26 | L1 | B24 | 1 |
| 38 | A26 | L1 | B27 | 1 |
| 39 | A26 | L1 | B28 | 1 |
| 40 | A26 | L1 | B29 | 1 |
| 41 | A26 | L1 | B30 | 1 |
| 42 | A26 | L1 | B31 | 1 |
| 43 | A26 | L1 | B32 | 1 |
| 44 | A26 | L1 | B33 | 1 |
| 45 | A26 | L1 | B34 | 1 |
| 46 | A26 | L1 | B51 | 1 |
| 47 | A26 | L1 | B52 | 1 |
| 48 | A26 | L1 | B53 | 1 |
| 49 | A26 | L1 | B54 | 1 |
| 50 | A26 | L1 | B55 | 1 |
| 51 | A26 | L1 | B56 | 1 |
| 52 | A26 | L1 | B59 | 1 |
| 53 | A26 | L1 | B60 | 1 |
| 54 | A26 | L1 | B61 | 1 |
| 55 | A26 | L1 | B62 | 1 |
| 56 | A26 | L1 | B63 | 1 |
| 57 | A26 | L1 | B64 | 1 |
| 58 | A26 | L1 | B65 | 1 |
| 59 | A26 | L1 | B66 | 1 |
| 60 | A26 | L1 | B92 | 1 |
| 61 | A26 | L2 | B18 | 1 |
| 62 | A26 | L2 | B19 | 1 |
| 63 | A26 | L2 | B20 | 1 |
| 64 | A26 | L2 | B21 | 1 |
| 65 | A26 | L2 | B22 | 1 |
| 66 | A26 | L2 | B23 | 1 |
| 67 | A26 | L2 | B24 | 1 |
| 68 | A26 | L2 | B27 | 1 |
| 69 | A26 | L2 | B28 | 1 |
| 70 | A26 | L2 | B29 | 1 |
| 71 | A26 | L2 | B30 | 1 |
| 72 | A26 | L2 | B31 | 1 |
| 73 | A26 | L2 | B32 | 1 |
| 74 | A26 | L2 | B33 | 1 |
| 75 | A26 | L2 | B34 | 1 |
| 76 | A26 | L2 | B51 | 1 |
| 77 | A26 | L2 | B52 | 1 |
| 78 | A26 | L2 | B53 | 1 |
| 79 | A26 | L2 | B54 | 1 |
| 80 | A26 | L2 | B55 | 1 |
| 81 | A26 | L2 | B56 | 1 |
| 82 | A26 | L2 | B59 | 1 |
| 83 | A26 | L2 | B60 | 1 |
| 84 | A26 | L2 | B61 | 1 |
| 85 | A26 | L2 | B62 | 1 |
| 86 | A26 | L2 | B63 | 1 |
| 87 | A26 | L2 | B64 | 1 |
| 88 | A26 | L2 | B65 | 1 |
| 89 | A26 | L2 | B66 | 1 |
| 90 | A26 | L2 | B92 | 1. |

10. An electroluminescent device comprising:
an anode,
a cathode,
and an organic layer disposed between the anode and the cathode, wherein the organic layer comprises a compound of claim 1.

11. The electroluminescent device of claim 10, wherein the organic layer is an electron transporting layer.

12. The electroluminescent device of claim 11, wherein the electron transporting layer also comprises at least one material.

13. The electroluminescent device of claim 10, wherein the electroluminescent device is incorporated into a device group consisting of a consumer product, an electronic component module, an organic light emitting device and a lighting panel.

14. A compound formulation comprising the compound of claim 1.

15. The electroluminescent device of claim 12, wherein the electron transporting layer also comprises at least one metal complex; the metal complex comprises a ligand $L_q$ represented by Formula 64:

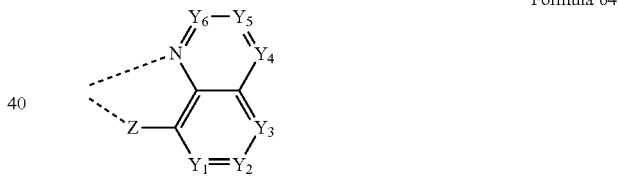

Formula 64 wherein $Y_1, Y_2, Y_3, Y_4, Y_5$ and $Y_6$ are each independently selected from $CR_Y$ or N; wherein each of $R_Y$ is independently selected from hydrogen, deuterium, alkyl, alkoxy, amino, silyl, cyano, halogen, aryl and heteroaryl;
wherein Z is N, O, S or Se.

* * * * *